US011735547B2

(12) United States Patent
Chaji et al.

(10) Patent No.: US 11,735,547 B2
(45) Date of Patent: Aug. 22, 2023

(54) SELECTIVE MICRO DEVICE TRANSFER TO RECEIVER SUBSTRATE

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 17/569,918

(22) Filed: Jan. 6, 2022

(65) Prior Publication Data

US 2022/0130783 A1  Apr. 28, 2022

Related U.S. Application Data

(60) Division of application No. 17/365,634, filed on Jul. 1, 2021, which is a continuation of application No.
(Continued)

(30) Foreign Application Priority Data

Jan. 23, 2015 (CA) .................................. CA 2879465
Jan. 23, 2015 (CA) .................................. CA 2879627
(Continued)

(51) Int. Cl.
*H01L 21/687* (2006.01)
*H01L 23/00* (2006.01)
(Continued)

(52) U.S. Cl.
CPC ........ *H01L 24/08* (2013.01); *H01L 21/68714* (2013.01); *H01L 24/29* (2013.01);
(Continued)

(58) Field of Classification Search
CPC .... H01L 24/95; H01L 21/68714; H01L 25/50
See application file for complete search history.

(56) References Cited

U.S. PATENT DOCUMENTS 5,184,398 A   2/1993  Moslehi
6,159,822 A   12/2000 Yang
(Continued)

FOREIGN PATENT DOCUMENTS

CA   2880718 A1   7/2016
CA   2887186 A1   11/2016
(Continued)

OTHER PUBLICATIONS

International Search Report and Written Opinion in International Application No. PCT/IB2016/050307, dated May 4, 2016 (7 pages).
(Continued)

*Primary Examiner* — Dale E Page
*Assistant Examiner* — Wilner Jean Baptiste
(74) *Attorney, Agent, or Firm* — Nixon Peabody LLP

(57) ABSTRACT

A method of selectively transferring micro devices from a donor substrate to contact pads on a receiver substrate. Micro devices being attached to a donor substrate with a donor force. The donor substrate and receiver substrate are aligned and brought together so that selected micro devices meet corresponding contact pads. A receiver force is generated to hold selected micro devices to the contact pads on the receiver substrate. The donor force is weakened and the substrates are moved apart leaving selected micro devices on the receiver substrate. Several methods of generating the receiver force are disclosed, including adhesive, mechanical and electrostatic techniques.

5 Claims, 52 Drawing Sheets

Related U.S. Application Data

16/931,132, filed on Jul. 16, 2020, which is a division of application No. 15/002,662, filed on Jan. 21, 2016, now abandoned.

(30) Foreign Application Priority Data

| Jan. 28, 2015 | (CA) | CA 2880718 |
|---|---|---|
| Mar. 4, 2015 | (CA) | CA 2883914 |
| May 4, 2015 | (CA) | CA 2890398 |
| May 12, 2015 | (CA) | CA 2887186 |
| May 12, 2015 | (CA) | CA 2891007 |
| May 12, 2015 | (CA) | CA 2891027 |

(51) Int. Cl.

| H01L 25/00 | (2006.01) |
|---|---|
| G01R 31/26 | (2020.01) |
| H01L 21/683 | (2006.01) |
| H01L 21/66 | (2006.01) |
| H05K 13/04 | (2006.01) |

(52) U.S. Cl.

CPC .............. *H01L 24/83* (2013.01); *H01L 24/95* (2013.01); *H01L 24/97* (2013.01); *G01R 31/2635* (2013.01); *H01L 21/6831* (2013.01); *H01L 21/6835* (2013.01); *H01L 22/14* (2013.01); *H01L 22/20* (2013.01); *H01L 24/27* (2013.01); *H01L 24/32* (2013.01); *H01L 24/75* (2013.01); *H01L 25/50* (2013.01); *H01L 2221/68322* (2013.01); *H01L 2221/68368* (2013.01); *H01L 2221/68381* (2013.01); *H01L 2224/08238* (2013.01); *H01L 2224/27002* (2013.01); *H01L 2224/2732* (2013.01); *H01L 2224/27334* (2013.01); *H01L 2224/29006* (2013.01); *H01L 2224/29011* (2013.01); *H01L 2224/29019* (2013.01); *H01L 2224/2919* (2013.01); *H01L 2224/29026* (2013.01); *H01L 2224/29078* (2013.01); *H01L 2224/32237* (2013.01); *H01L 2224/7598* (2013.01); *H01L 2224/75252* (2013.01); *H01L 2224/75253* (2013.01); *H01L 2224/83005* (2013.01); *H01L 2224/8314* (2013.01); *H01L 2224/8316* (2013.01); *H01L 2224/8318* (2013.01); *H01L 2224/83121* (2013.01); *H01L 2224/83141* (2013.01); *H01L 2224/83143* (2013.01); *H01L 2224/83191* (2013.01); *H01L 2224/83192* (2013.01); *H01L 2224/83234* (2013.01); *H01L 2224/83238* (2013.01); *H01L 2224/83862* (2013.01); *H01L 2224/83902* (2013.01); *H01L 2224/95* (2013.01); *H01L 2224/95001* (2013.01); *H01L 2224/97* (2013.01); *H05K 13/0411* (2018.08)

(56) References Cited

U.S. PATENT DOCUMENTS

| 7,088,431 | B2 | 8/2006 | Ottens | |
|---|---|---|---|---|
| 7,629,184 | B2 | 12/2009 | Kulp | |
| 7,972,875 | B2* | 7/2011 | Rogers | H01L 31/1868 |
| | | | | 257/E21.243 |
| 8,139,340 | B2 | 3/2012 | Reynolds | |
| 8,436,255 | B2 | 5/2013 | Goh | |
| 8,518,204 | B2 | 8/2013 | Hu | |
| 8,647,438 | B2 | 2/2014 | Hoffman | |
| 8,765,582 | B2 | 7/2014 | Hsu | |
| 9,134,368 | B2 | 9/2015 | Kuo | |
| 9,196,498 | B1 | 11/2015 | Nangoy | |
| 9,257,414 | B2 | 2/2016 | Chen | |
| 9,308,650 | B2 | 4/2016 | Eisele | |
| 9,349,630 | B2 | 5/2016 | Raj | |
| 9,356,137 | B2 | 5/2016 | Zhang | |
| 9,431,283 | B2 | 8/2016 | Thompson | |
| 9,478,583 | B2 | 10/2016 | Hu | |
| 9,496,155 | B2 | 11/2016 | Menard | |
| 9,589,826 | B2 | 3/2017 | Ono | |
| 9,607,907 | B2 | 3/2017 | Wu | |
| 9,741,591 | B2 | 8/2017 | Schweikert | |
| 9,965,106 | B2 | 5/2018 | Guard | |
| 9,991,147 | B2 | 6/2018 | Wang | |
| 10,153,190 | B2 | 12/2018 | Qin | |
| 2002/0048137 | A1 | 4/2002 | Williams | |
| 2003/0162463 | A1 | 8/2003 | Hayashi | |
| 2004/0026773 | A1* | 2/2004 | Koon | H01L 25/50 |
| | | | | 257/E23.047 |
| 2004/0154733 | A1 | 8/2004 | Morf | |
| 2004/0251821 | A1 | 12/2004 | Cok | |
| 2004/0262614 | A1 | 12/2004 | Hack | |
| 2005/0082523 | A1 | 4/2005 | Blanchet-Fincher | |
| 2005/0104225 | A1 | 5/2005 | Huang | |
| 2005/0169570 | A1 | 8/2005 | Kim | |
| 2005/0215073 | A1 | 9/2005 | Nakamura | |
| 2005/0287687 | A1 | 12/2005 | Liao | |
| 2006/0102913 | A1 | 5/2006 | Park | |
| 2007/0045620 | A1 | 3/2007 | Park | |
| 2008/0315440 | A1 | 12/2008 | Dekker | |
| 2009/0302339 | A1 | 12/2009 | Yamazaki | |
| 2010/0006845 | A1 | 1/2010 | Seo | |
| 2011/0216272 | A1 | 9/2011 | Yoshida | |
| 2013/0126081 | A1 | 5/2013 | Hu | |
| 2013/0130440 | A1 | 5/2013 | Hu | |
| 2013/0153277 | A1 | 6/2013 | Menard | |
| 2013/0157438 | A1 | 6/2013 | Maeda | |
| 2013/0214302 | A1 | 8/2013 | Yeh | |
| 2013/0273695 | A1 | 10/2013 | Menard | |
| 2014/0027709 | A1 | 1/2014 | Higginson | |
| 2014/0048836 | A1 | 2/2014 | Hsu | |
| 2014/0151678 | A1 | 6/2014 | Sakuma | |
| 2014/0333683 | A1 | 11/2014 | Qi | |
| 2014/0361265 | A1 | 12/2014 | Liu | |
| 2014/0367633 | A1 | 12/2014 | Bibi | |
| 2014/0367711 | A1 | 12/2014 | Bibi | |
| 2015/0060820 | A1 | 3/2015 | Takagi | |
| 2015/0144974 | A1 | 5/2015 | Chen | |
| 2015/0228513 | A1 | 8/2015 | Parkhe | |
| 2015/0357315 | A1 | 12/2015 | Oraw | |
| 2016/0013170 | A1 | 1/2016 | Sakariya | |
| 2016/0064363 | A1 | 3/2016 | Bower | |
| 2016/0372893 | A1 | 12/2016 | McLaurin | |
| 2017/0162552 | A1 | 6/2017 | Thompson | |
| 2017/0179092 | A1 | 6/2017 | Sasaki | |
| 2017/0261782 | A1 | 9/2017 | Lee | |

FOREIGN PATENT DOCUMENTS

| CA | 2890398 A1 | 11/2016 |
|---|---|---|
| CN | 1491436 | 4/2004 |
| CN | 1813362 A | 8/2006 |
| CN | 101154618 | 4/2008 |
| CN | 102097357 | 6/2011 |
| CN | 103904073 | 7/2014 |
| CN | 105324858 | 2/2016 |
| EP | 1750308 A2 | 2/2007 |
| KR | 20160107363 A | 9/2016 |
| TW | 201423242 A | 6/2014 |
| WO | WO 1997/023903 A1 | 7/1997 |
| WO | WO 2002/084631 A1 | 10/2002 |
| WO | WO 03/088359 A1 | 10/2003 |
| WO | WO 2014/165151 A1 | 10/2014 |
| WO | WO 2015/081289 A1 | 6/2015 |

OTHER PUBLICATIONS

International Search Report and Written Opinion in International Application No. PCT/IB2017/051297, dated May 17, 2017 (7 pages).

(56) References Cited

OTHER PUBLICATIONS

International Search Report and Written Opinion in International Application No. PCT/IB2018/055347, dated Nov. 9, 2018 (17 pages).

* cited by examiner

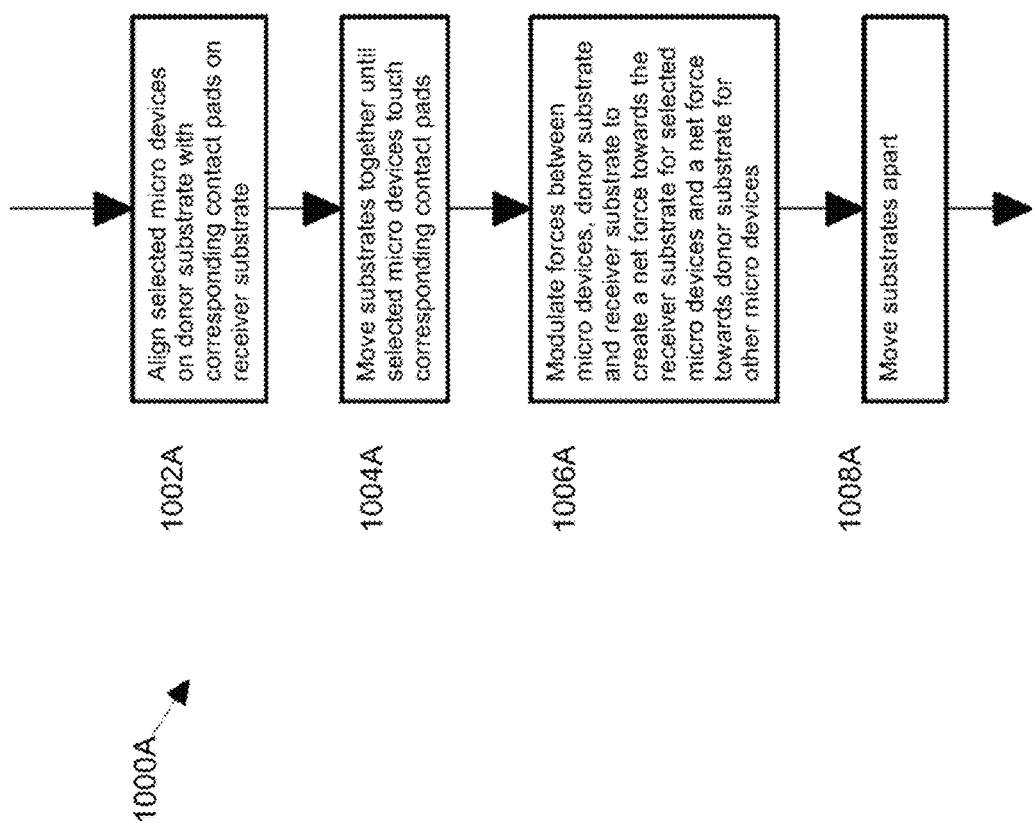

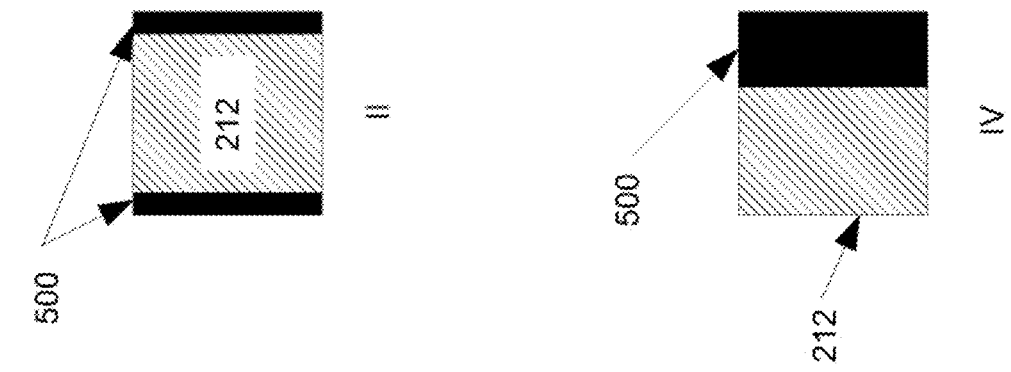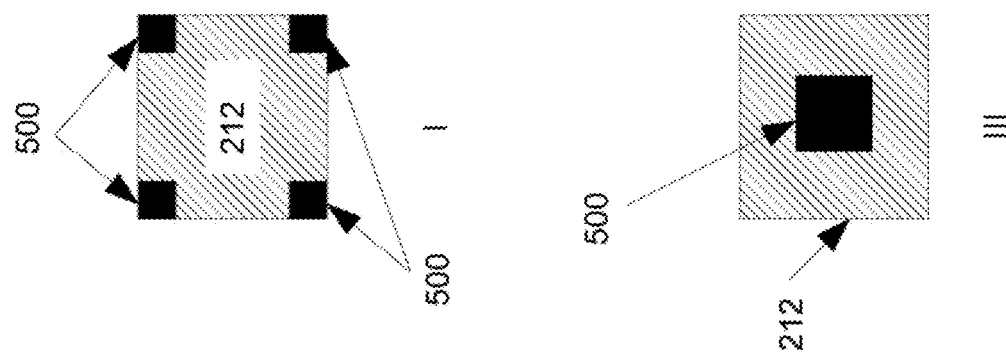
Figure 7A

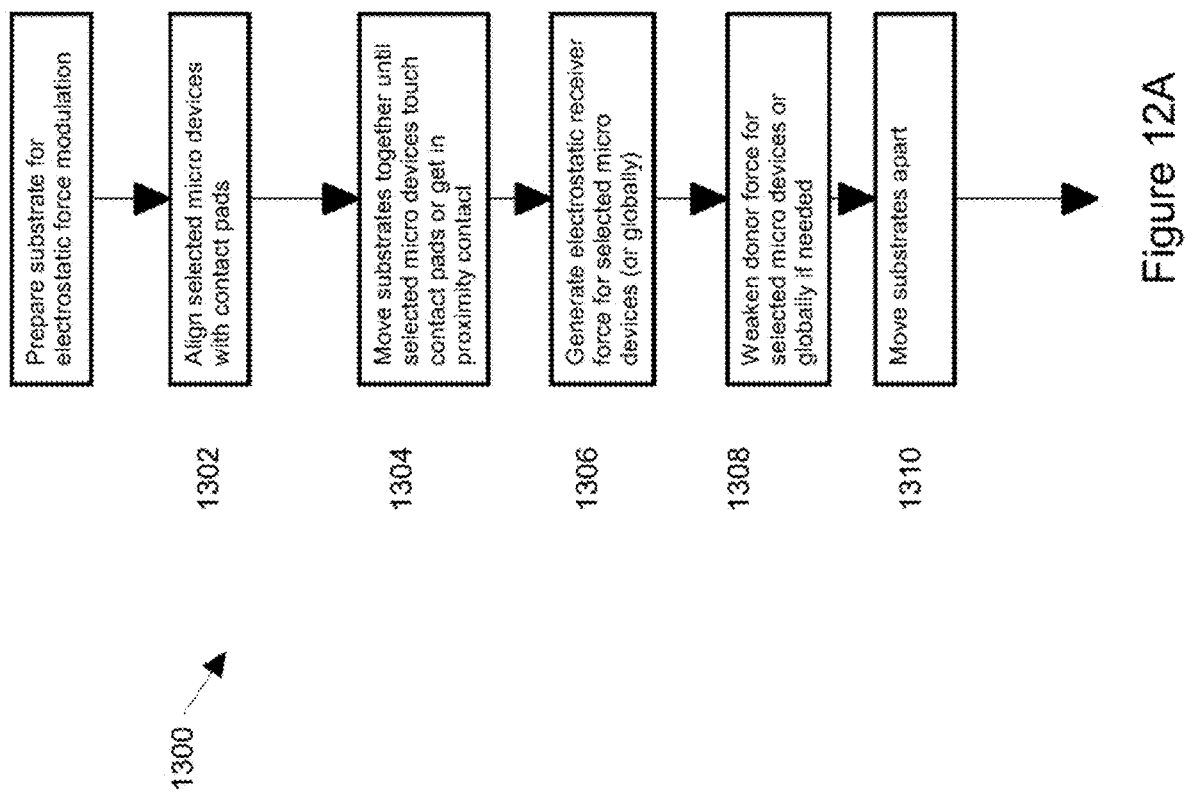

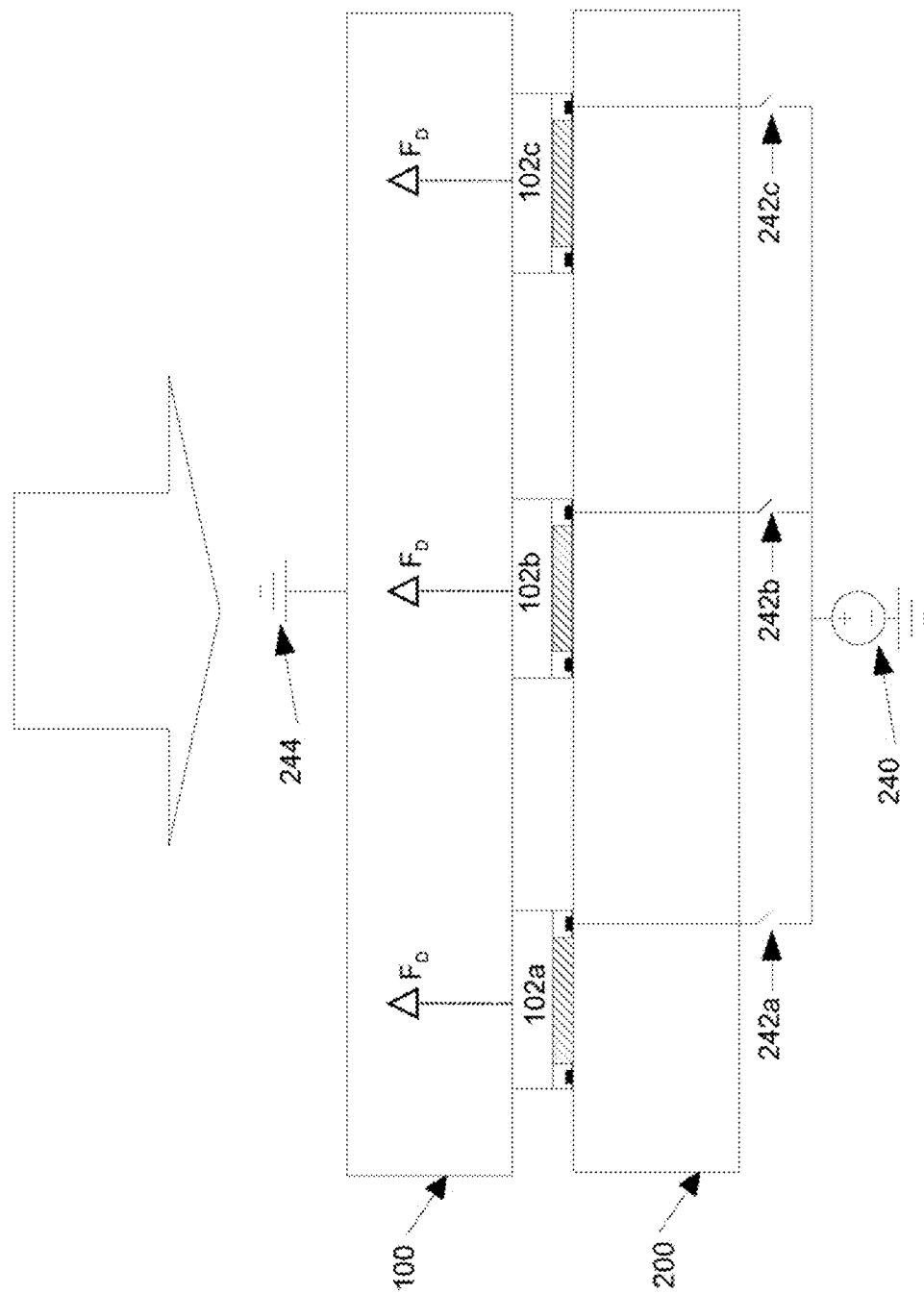

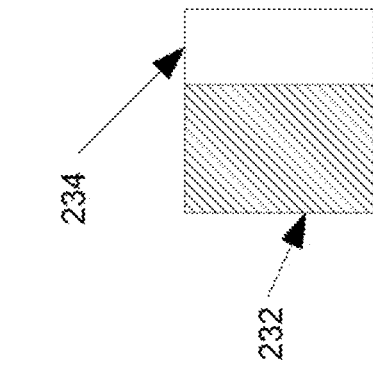
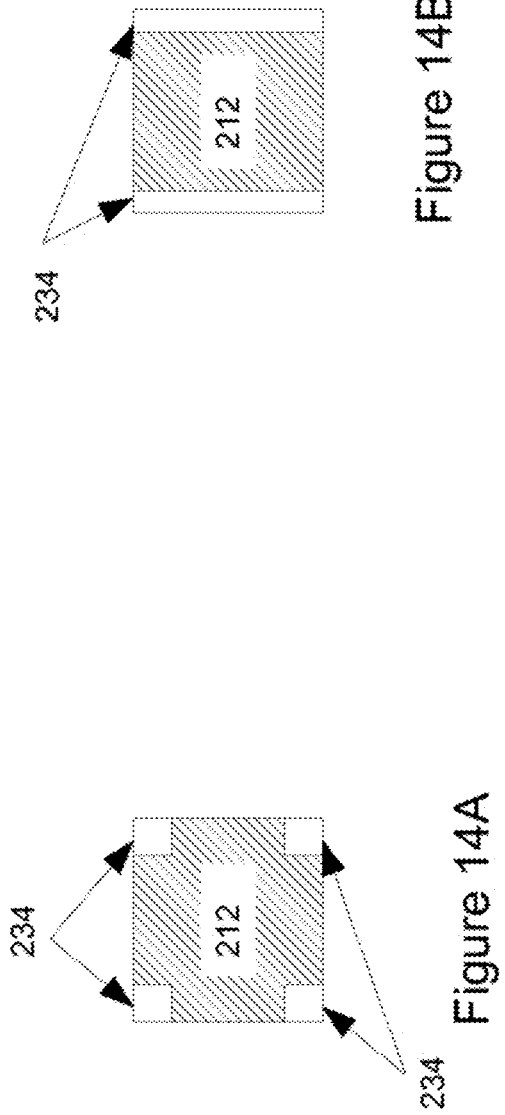

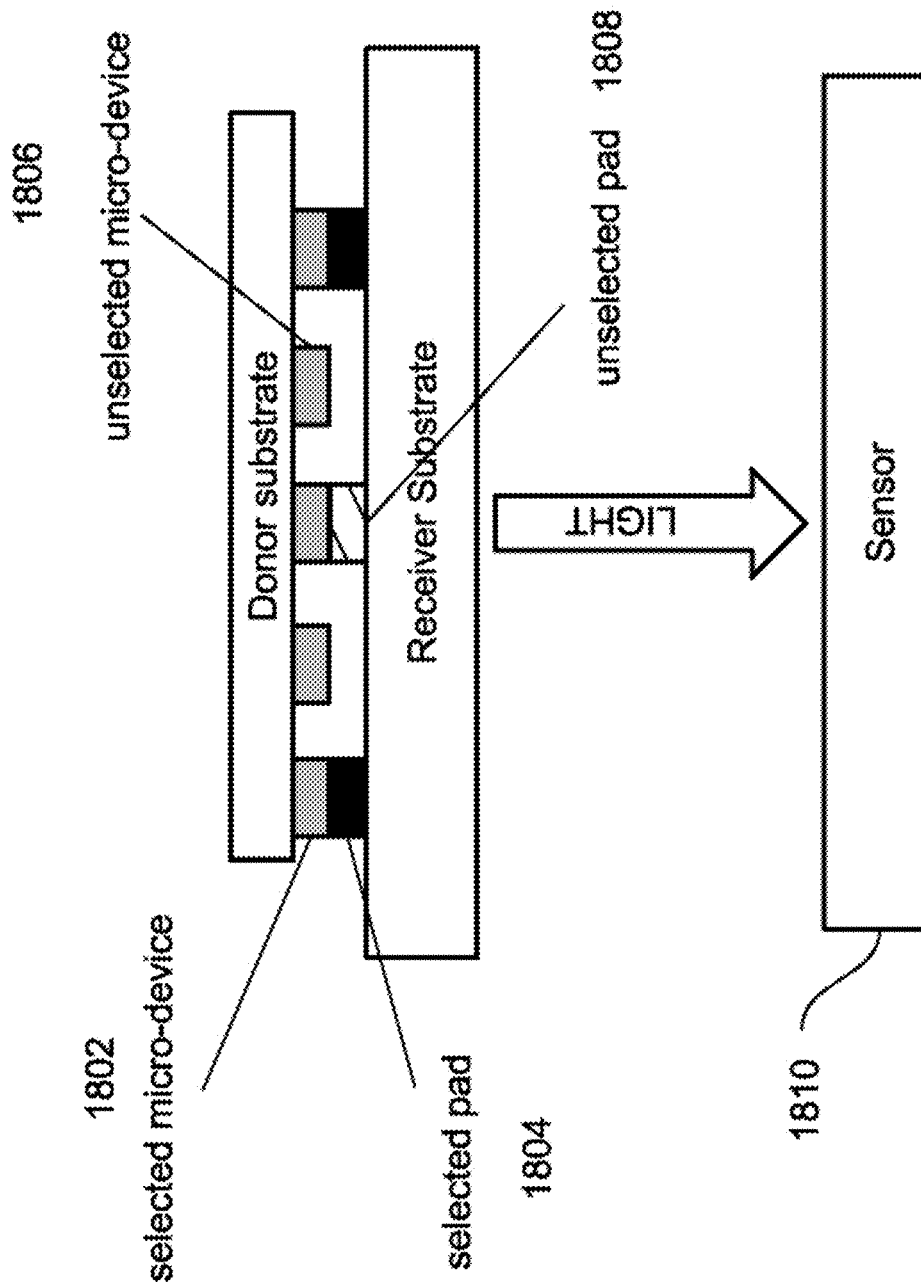

SELECTIVE MICRO DEVICE TRANSFER TO RECEIVER SUBSTRATE

CROSS-REFERENCE TO RELATED APPLICATION(S)

This application is a division of U.S. patent application Ser. No. 17/365,634, filed Jul. 1, 2021, which is a continuation of U.S. patent application Ser. No. 16/931,132, filed Jul. 16, 2020, which is a division of U.S. patent application Ser. No. 15/002,662, filed Jan. 21, 2016, abandoned, and claims foreign priority to Canadian Application No. 2,879,465, filed Jan. 23, 2015, Canadian Application No. 2,879,627, filed Jan. 23, 2015, Canadian Application No. 2,880,718, filed Jan. 28, 2015, Canadian Application No. 2,883,914, filed Mar. 4, 2015, Canadian Application No. 2,887,186, filed May 12, 2015, Canadian Application No. 2,890,398, filed May 4, 2015, Canadian Application No. 2,891,007, filed May 12, 2015, and Canadian Application No. 2,891,027, filed May 12, 2015, each of which is hereby incorporated by reference herein in its entirety.

FIELD OF THE INVENTION

The present disclosure relates to device integration into system substrates. More specifically, the present disclosure relates to selective transfer of micro devices from a donor substrate to a receiver substrate.

BRIEF SUMMARY

According to one aspect there is provided, a method of transferring selected micro devices in an array of micro devices each of which is bonded to a donor substrate with a donor force to contact pads in an array on a receiver substrate, the method comprising: aligning the donor substrate and the receiver substrate so that each of the selected micro devices is in line with a contact pad on the receiver substrate; moving the donor substrate and the receiver substrate together until each of the selected micro devices is in contact or proximity with a respective contact pad on the receiver substrate; generating a receiver force that acts to hold the selected micro devices to their contact pads while not affecting other micro devices in contact with or proximity contact with the receiver substrate; and moving the donor substrate and the receiver substrate apart leaving the selected micro devices on the receiver substrate.

Some embodiments further comprise weakening the donor force bonding the micro devices to the donor substrate to assist micro device transfer.

In some embodiments, the donor force for the selected micro devices is weakened to improve selectivity in micro device transfer. In some embodiments, the receiver force is generated selectively to improve selectivity in micro device transfer.

Some embodiments further comprise weakening the donor force using laser lift off.

Some embodiments further comprise modulating the force by magnetic field.

Some embodiments further comprise weakening the donor force by heating an area of the donor substrate.

Some embodiments further comprise modulating the receiver force by heating the receiver substrate.

In some embodiments the heating is performed by passing a current through the contact pads. In some embodiments the receiver force is generated by mechanical grip.

Some embodiments further comprise performing an operation on the receiver substrate so that the contact pads permanently bond with the selected micro devices.

In some embodiments the receiver force is generated by electrostatic attraction between the selected micro devices and the receiver substrate. In some embodiments the receiver force is generated by an adhesive layer positioned between the selected micro devices and the receiver substrate.

Some embodiments further comprise removing the donor force; and applying a push force to selected micro devices to move the devices toward the receiver substrate.

In some embodiments the push force is created by a sacrificial layer deposited between the selected micro device and the donor substrate.

According to another aspect there is provided a receiver substrate structure comprising: an array of landing areas for holding micro devices from a donor substrate selectively, each landing area comprising: at least one contact pad for coupling or connecting a micro device to at least one circuit or a potential in the receiver substrate; and at least one force modulation element for creating a receiver force for holding micro devices on the receiver substrate. For clarity, the area where the micro device sits on the receiver substrate is called the landing area.

In some embodiments the force modulation element is an electrostatic structure. In some embodiments the force modulation element is a mechanical grip. In some embodiments, for each landing area, a same element acts as the force modulation element and the contact pad.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

FIG. 2A shows a flowchart of modulating at least one of the donor or receiver forces after donor and receiver substrates are in contact or proximity with each other.

FIG. 3C-2 shows one embodiment of modulating the forces by weakening the donor force selectively and applying receiver force globally.

FIG. 7A shows other possible arrangements of adhesive on receiver substrate.

FIG. 12A shows a flowchart of method 1300 for selectively transferring micro devices from a donor substrate to a receiver substrate.

FIG. 13B shows the step of moving the substrates within a predefined distance margin.

FIG. 14A shows another alternative placement for electrostatic layer.

FIG. 14B shows another alternative placement for electrostatic layer.

FIG. 14C shows another alternative placement for electrostatic layer.

FIG. 14D shows another alternative placement for electrostatic layer.

FIG. 18B shows a platform for testing by biasing at least one of the donor substrate or the receiver substrate to enable testing the micro devices for defects and performance. Here, the output of the micro device is through the donor substrate.

Figure 1A:
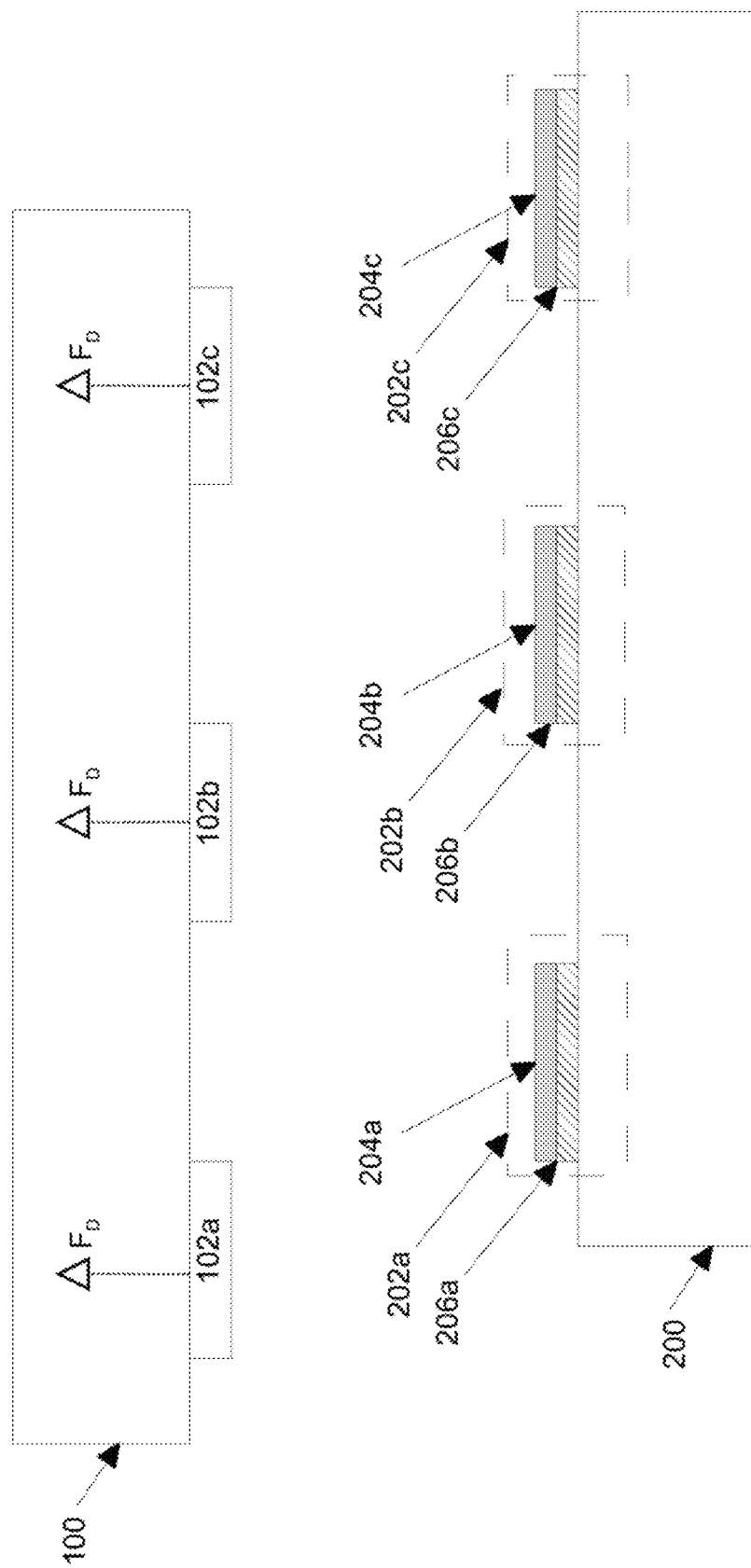
FIG. 1A shows a donor substrate and a receiver substrate before the transfer process begins.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

Many micro devices, including light emitting diodes (LEDs), Organic LEDs, sensors, solid state devices, integrated circuits, MEMS (micro-electro-mechanical systems) and other electronic components, are typically fabricated in batches, often on planar substrates. To form an operational system, micro devices from at least one donor substrate need to be selectively transferred to a receiver substrate.

Figure 1B:
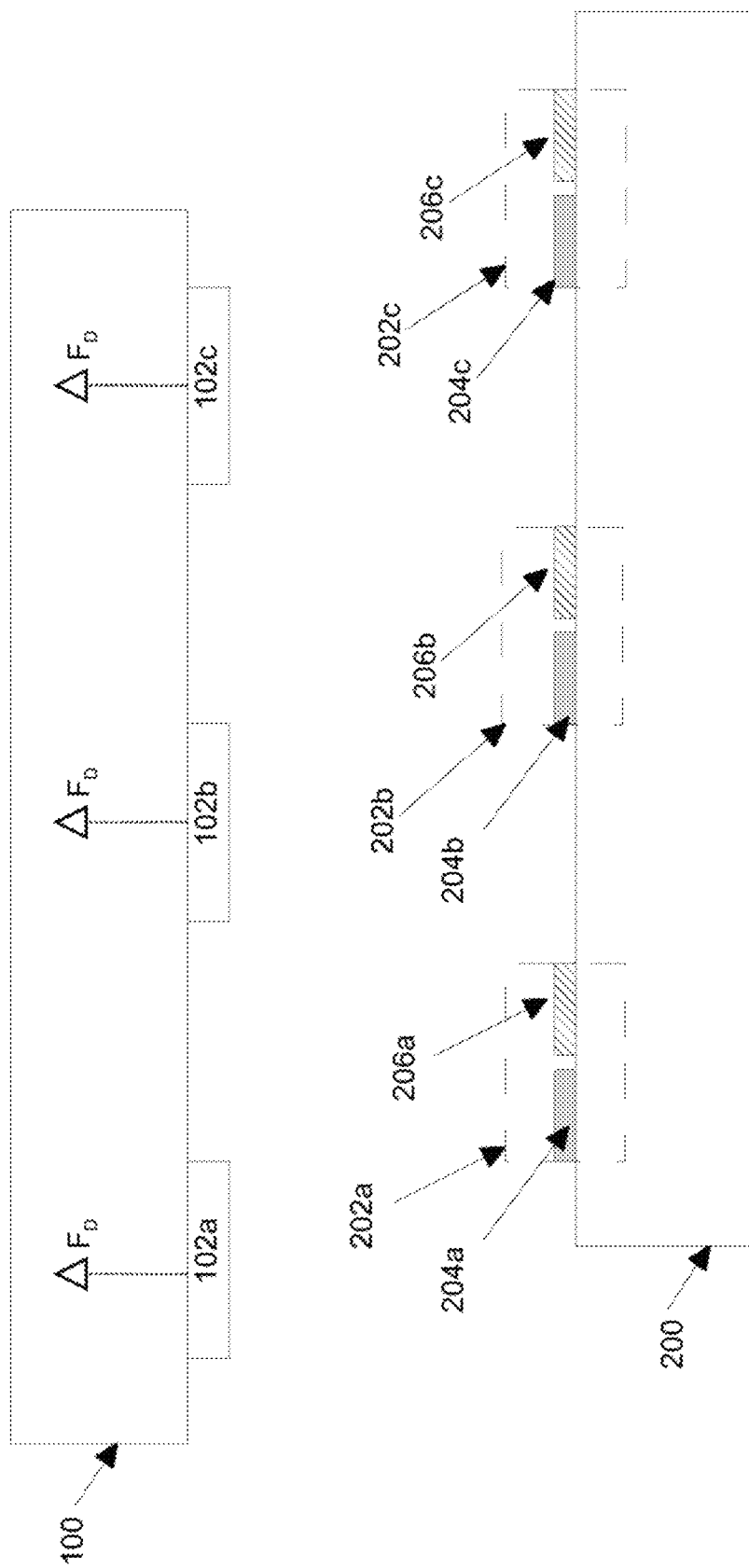
FIG. 1B shows a donor substrate and a receiver substrate before the transfer process begins.
Figure 3A:
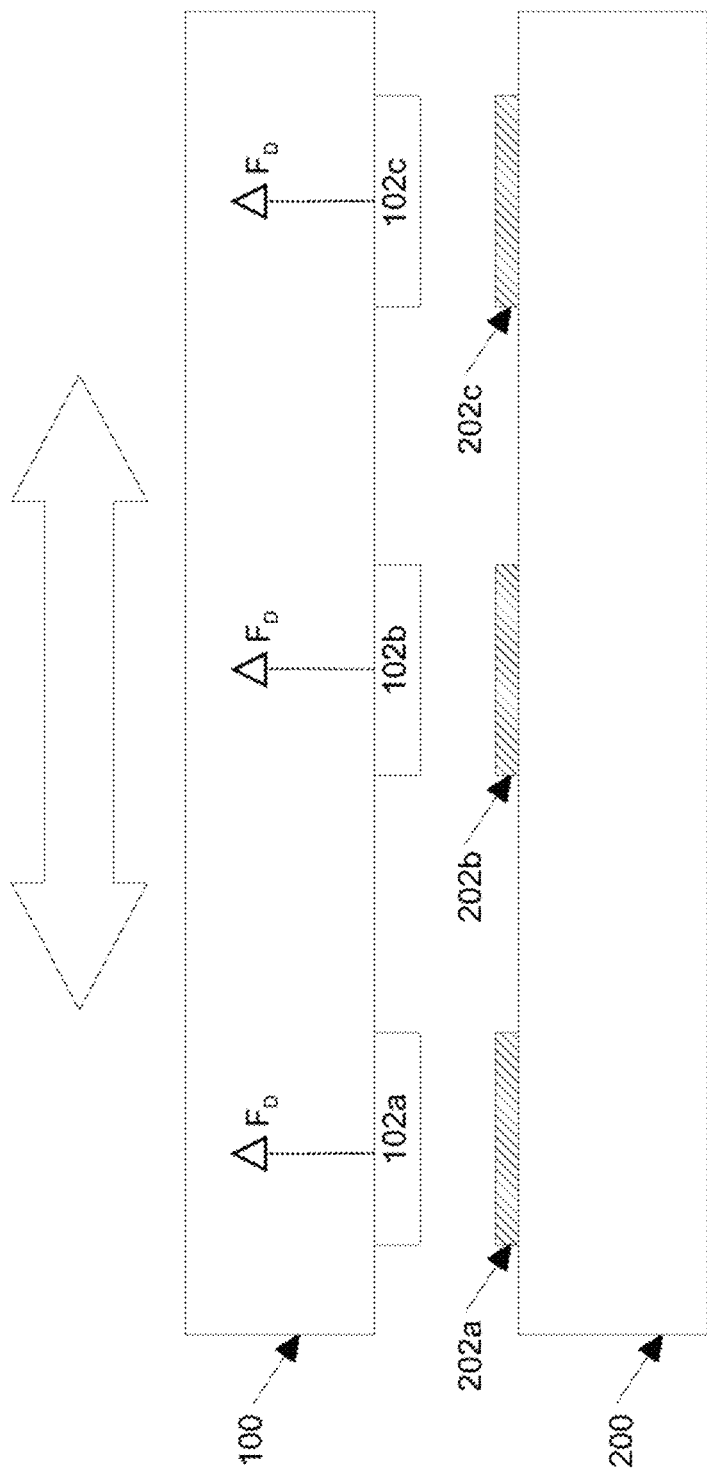
FIG. 3A shows the step of aligning the donor and receiver substrates
Figure 3B:
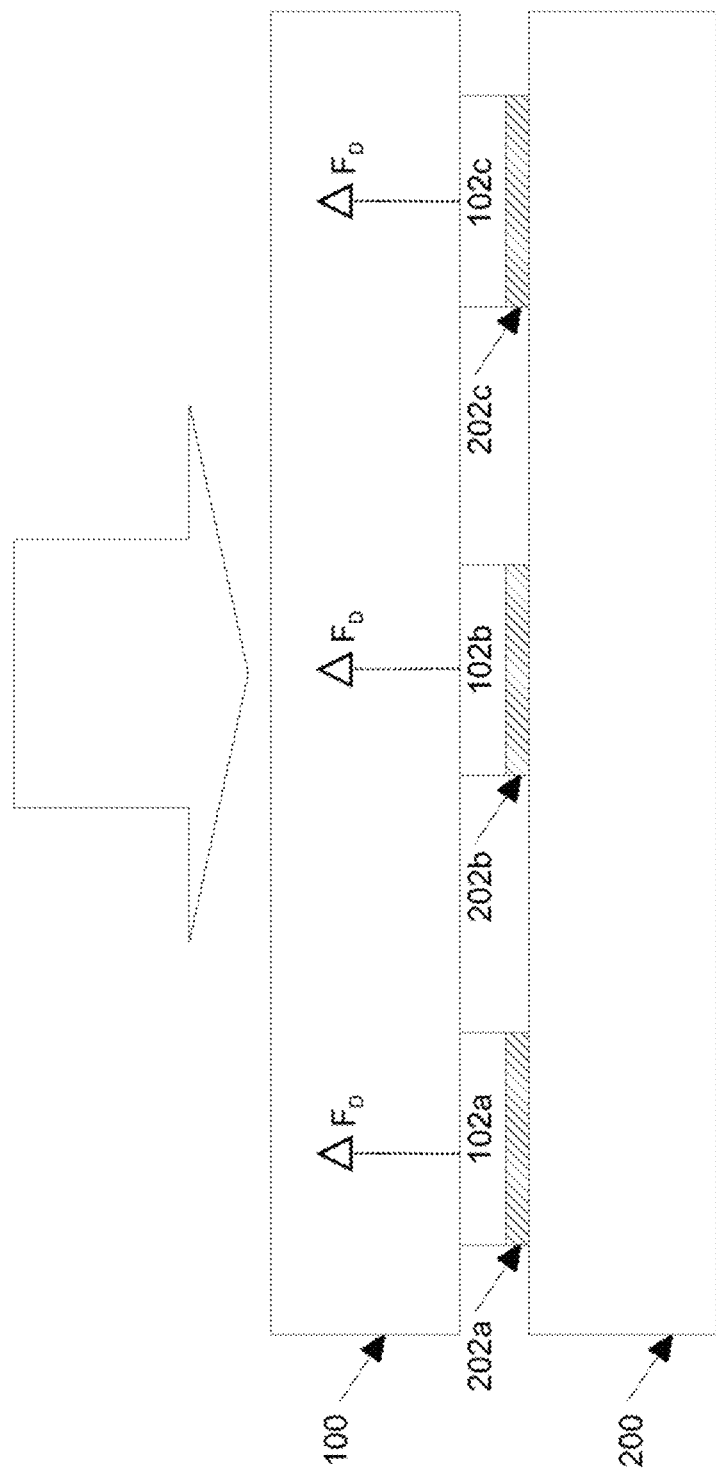
FIG. 3B shows the step of moving the substrates together within a defined distance margin.
Figures 1, 3C:
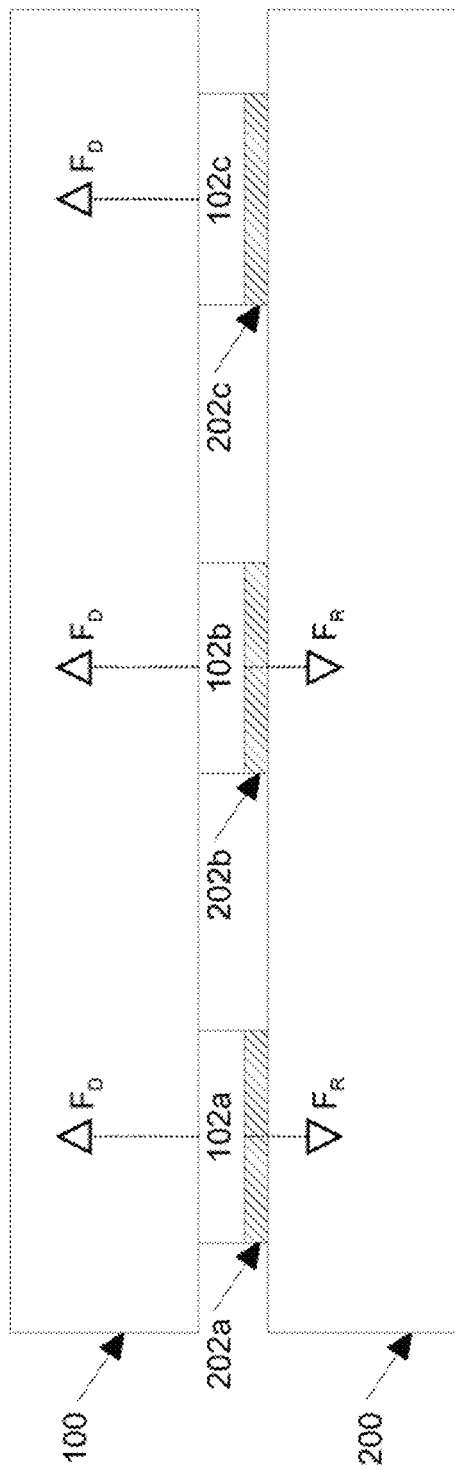
FIG. 3C-1 shows one embodiment of modulating the forces by applying receiver forces selectively.

Substrate and Transfer Structure:

FIG. 1 shows a donor substrate 100 and receiver substrate 200, before the transfer process begins. Micro devices 102a, 102b, 102c begin in an array attached to donor substrate 100. The receiver substrate consists of an array of landing areas 202a, 202b, 202c where the micro devices will sit. The landing areas 202a, 202b, 202c each include at least one force modulation element 204a, 204b, 204c and at least a contact pad 206a, 206b, 206c. The force modulation element and contact pads can be different as shown in FIG. 1A or can be the same structure as shown in FIG. 1B. The micro devices 102 may be coupled or connected to a circuit or a potential on the receiver substrate 200 through contact pads 206a, 206b, 206c. The force modulation elements 204a, 204b, 204c create a transfer force to hold the micro device 102a, 102b, 102c selectively on the receiver substrate 200 and separate them from the donor substrate 100. The donor substrate 100 is the substrate upon which micro devices 102 are manufactured or grown or another temporary substrate onto which they have been transferred. Micro devices 102 can be any micro device that is typically manufactured in planar batches including LEDs, OLEDs, sensors, solid state devices, integrated circuit, MEMS, and other electronic components. Donor substrate 100 is chosen according to the manufacturing process for a particular type of micro device 102. For example, in the case of conventional GaN LEDs, donor substrate 100 is typically sapphire. Generally, when growing GaN LEDs, the atomic distance of donor substrate 100 should match that of the material being grown in order to avoid defects in the film. Each micro device 102 is attached to donor substrate 100 by a force, FD, determined by the manufacturing process and the nature of the micro devices 102. FD will be substantially the same for each micro device 102. Receiver substrate 200 can be any more desirable location for micro devices 102. It can be, for example, a printed circuit board (PCB), a thin film transistor backplane, an integrated circuit substrate, or, in the case of optical micro devices 102 such as LEDs, a component of a display, for example a driving circuitry backplane. The landing area on the receiver substrate as shown in FIG. 1B refers to the location where micro device sits on the receiver substrate and may consist of at least one contact pad 101a and at least one force modulation element 101b. Although in some of the figures the landing area may be the same size as the contact pads 202, the contact pads 202 can be smaller than the landing area. Contact pads 202 are the locations where micro devices may be coupled or directly connected to the receiver substrate 200. In this description, landing area and contact pads are used interchangeably.

The goal in selective transfer is to transfer some, selected micro devices 102, from donor substrate 100 to receiver substrate 200. For example, the transfer of micro devices 102a and 102b onto contact pads 206a and 206b without transferring micro device 102c will be described.

Transfer Process

Following steps describe a method of transferring selected micro devices in an array of micro devices each of which is bonded to a donor substrate with a donor force to contact pads in an array on a receiver substrate:

a. aligning the donor substrate and the receiver substrate so that each of the selected micro devices are in line with a contact pad on the receiver substrate;

b. moving the donor substrate and the receiver substrate together until each of the selected micro devices are in contact with or proximity with at least one contact pad on the receiver substrate;

c. generating a receiver force that acts to hold the selected micro devices to their contact pads;

d. moving the donor substrate and the receiver substrate apart leaving the selected micro devices on the receiver substrate while other non-selected micro devices from donor substrate stays on donor substrate despite possible contact with or proximity contact with the system substrate during steps b and c.

If the donor force is too strong for receiver force to overcome for transferring the micro device to the receiver substrate, the donor force for micro devices is weakened to assist micro device transfer. In addition, if the receiver force is applied globally or selective receiver force is not enough to transfer the micro devices selectively, the donor force for the selected micro devices is weakened selectively to improve selectivity in micro device transfer.

Figure 2B:
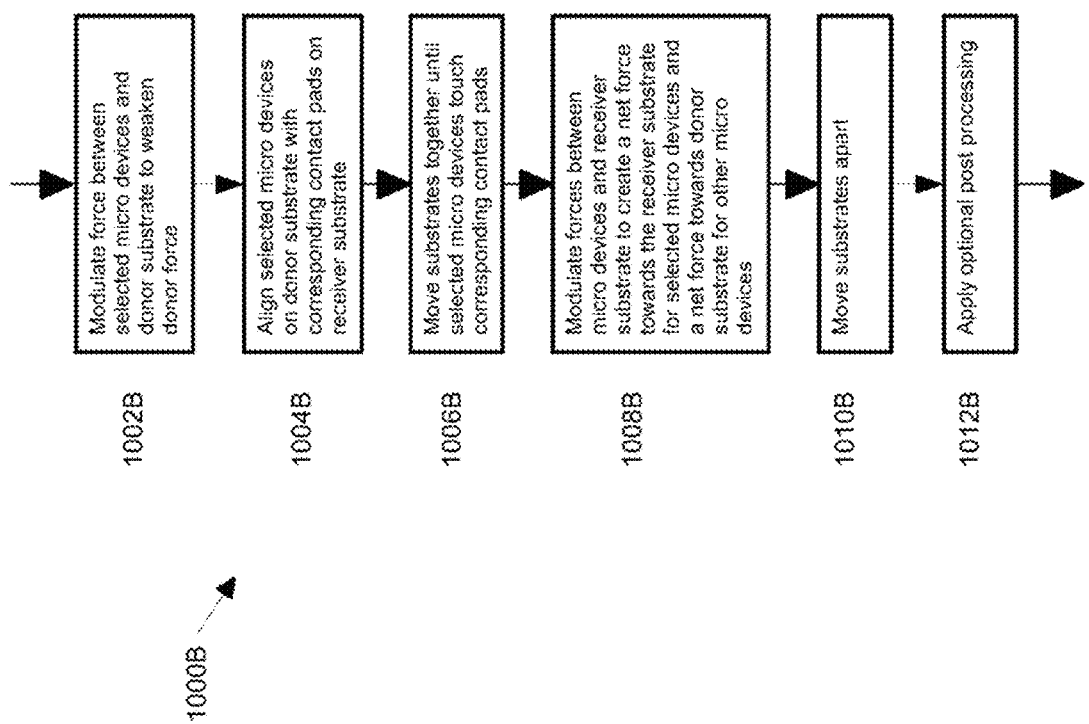
FIG. 2B shows a flowchart of modulating the donor forces in advance and modulating receiver forces if needed after donor and receiver substrates are in contact or proximity with each other.
Figure 2C:
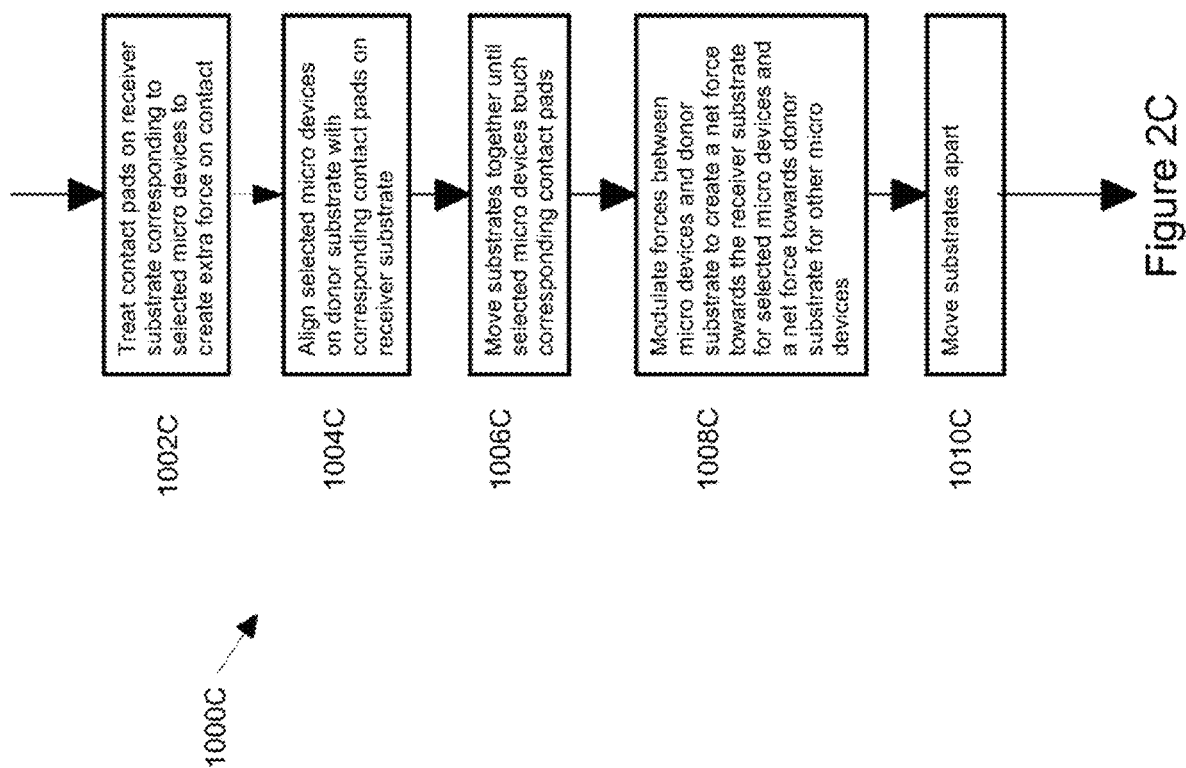
FIG. 2C shows flowchart of modulating the receiver forces in advance and modulating donor forces if needed after donor and receiver substrates are in contact or proximity with each other.

FIGS. 2A-2C show exemplary flowcharts of selective transfer methods 1000A-1000C. FIG. 1 shows a donor substrate 100 and a receiver substrate 200 suitable for performing any of methods 1000. Method 1000A will be described with reference to FIGS. 3A-3E. Methods 1000B and 1000C are analogous variations of method 1000A. One can use the combination of methods 1000A-1000C to further enhance the transfer process.

At 1002A donor substrate 100 and receiver substrate 200 are aligned so that selected micro devices 102a, 102b are in line with corresponding contact pads 202a, 202b, as shown in FIG. 3A. Micro device 102c is not to be transferred so, although shown as aligned, it may or may not align with contact pad 202c.

At 1004A, donor substrate 100 and receiver substrate 200 are moved together until the selected micro devices 102a, 102b are positioned within a defined distance of contact pads 202a, 202b, as shown in FIG. 3B. The defined distance may correspond to full or partial contact but is not limited thereto. In other words, it may not be strictly necessary that selected micro devices 102a, 102b actually touch corresponding contact pads 202a, 202b, but must be near enough so that the forces described below can be manipulated.

At 1006A, forces between selected micro devices 102, donor substrate 100 and receiver substrate 200 (and contact pads 202) are modulated so as to create a net force towards receiver substrate 200 for selected micro devices and a net force towards donor substrate 100 (or zero net force) for other micro devices 102c.

Consider the forces acting one of the selected micro devices 102. There is a pre-existing force holding it to donor substrate 100, FD. There is also a force generated between micro device 102 and receiver substrate 200, FR, acting to pull or hold micro device 102 towards receiver substrate 200 and cause a transfer. For any given micro device 102, when the substrates are moved apart, if FR exceeds FD the micro device 102 will go with receiver substrate 200, while if FD exceeds FR the micro device 102 will stay with donor substrate 100. There are several ways to generate FR that will be described in later sections. However, once FR has been generated, there are at least four (4) possible ways to modulate FR and FD to achieve transfer of selected micro devices.

1. Weaken FD to be less than FR on micro devices selected for transfer.

2. Strengthen FR to be greater than FD on micro devices selected for transfer.

3. Weaken FR to be less than FD on micro devices NOT selected for transfer

Figures 2, 3C:
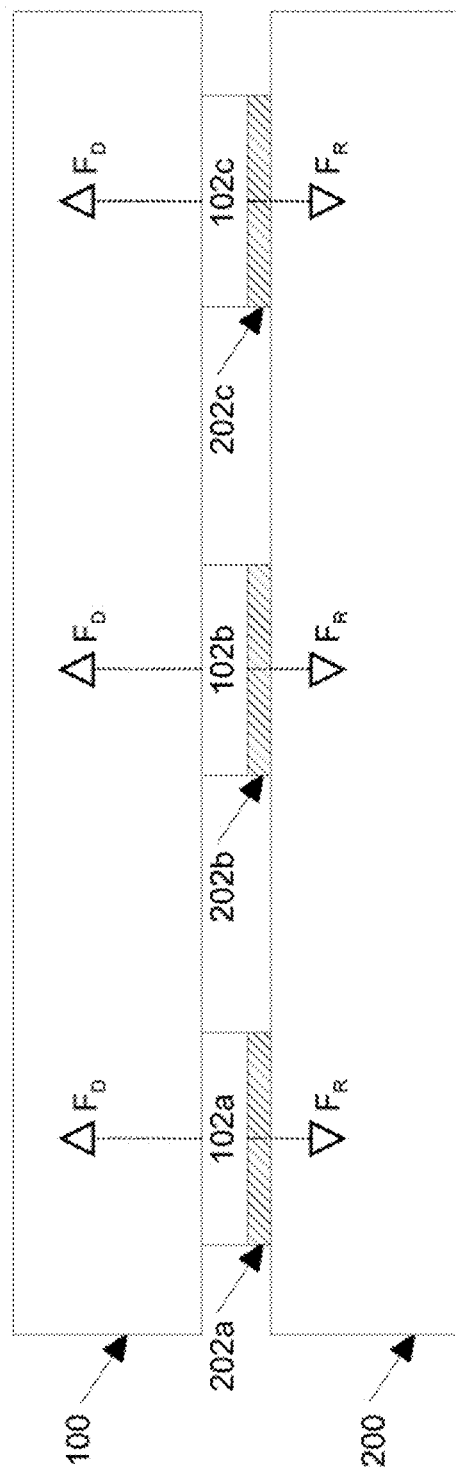

4. Strengthen FD to be greater than FR on micro devices NOT selected for transfer Different combinations and arrangements of the above are also possible. Using combinations may, in some cases, be desirable. For example, if the required change in FD or FR is very high, one can use a combination of modulation of FD and FR to achieve the desired net forces for the selected and the non-selected micro devices. Preferably, FR can be generated selectively and therefore act only on selected micro devices 102a, 102b, as shown in FIG. 3C-1. FR can also be generated globally and apply across all of receiver substrate 200 and therefore act on micro devices 102a, 102b, 102c, as shown in FIG. 3C-2 here donor forces may selectively get weakened. The landing area on the receiver substrate may include a force modulation element to cause FR force modulation, fully or partially. Methods for selective and global generation of FR will be described below, including adhesive, mechanical and electrostatic and magnetic techniques. Additionally, examples of force modulation elements in landing area are described below. However, one of skill in the art knows that different variations of the force modulation elements that are not listed here are possible. Moreover, it should be understood that the shapes and structures of the contact pads and the force modulation elements are used for explanation and are not limited to the ones used in this description.

Figure 3D:
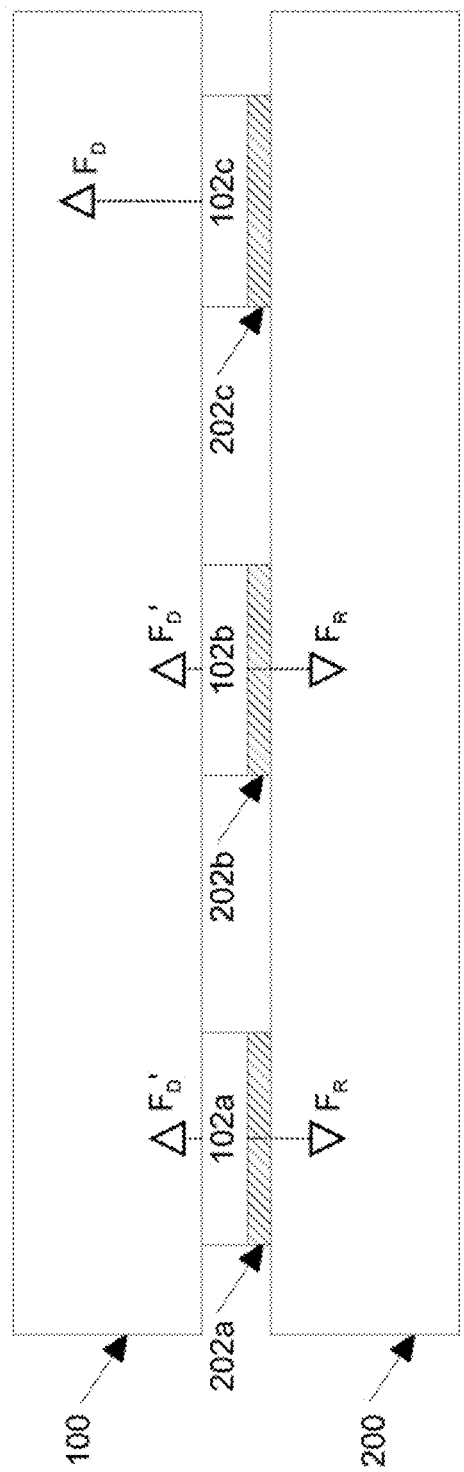
FIG. 3D shows one embodiment of modulating the forces by applying receiver and weakening donor forces selectively.

In one embodiment, donor force FD is selectively weakened for selected micro devices 102a, 102b, so that FD' is less than FR, as shown in FIG. 3D. This may be done, for example, using laser lift off techniques, lapping or wet/dry etching. In some cases, it may be desirable to use selective and global generation of FR simultaneously. For example, it may be infeasible to generate a selective FR of sufficient magnitude to overcome FD' alone. In that case, the global component of FR should preferably remain small, ideally less than FD', while the sum of the global and the selective components of FR is greater than FD', but less than FD.

It should also be noted that activities performed during steps 1002A-1006A can sometimes be interspersed with one another. For example, selective or global weakening of FD could take place before the substrates are brought together.

Figure 3E:
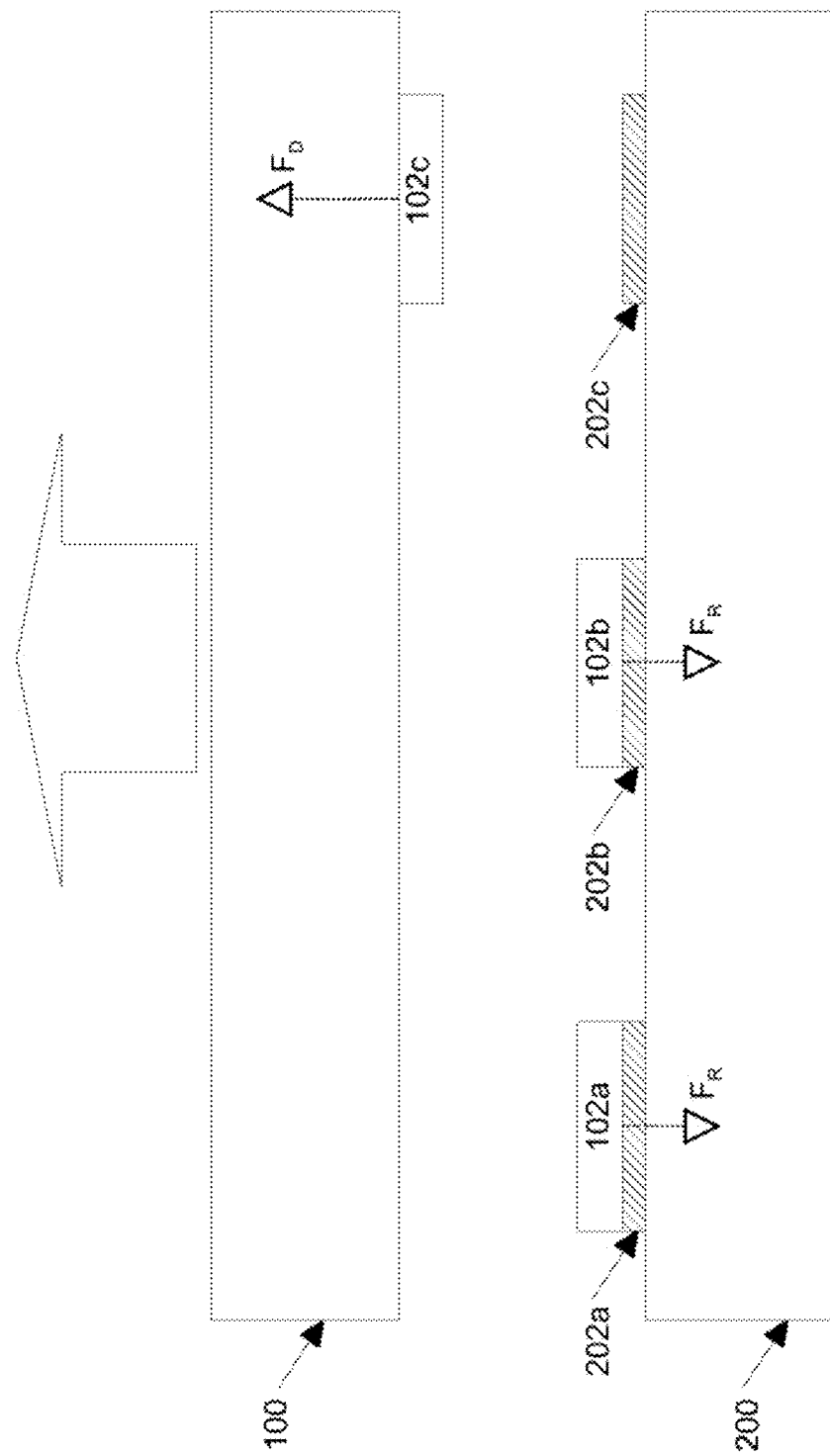
FIG. 3E shows the step of moving the substrate apart.

At 1008A, donor substrate 100 and receiver substrate 200 are moved apart, leaving selected micro devices 102a, 102b attached to corresponding contact pads 202a, 202b, as shown in FIG. 3E. Once donor substrate 100 is separated from receiver substrate 200, further processing steps can be taken. For example, donor substrate 100 and receiver substrate 200 can be re-aligned and steps 1002A to 1008A can be repeated in order to transfer a different set of micro devices 102 to a different set of contact pads 202. Additional layers can also be deposited on top of or in between micro devices 102, for example, during the manufacture of a LED display, transparent electrode layers, fillers, planarization layers and other optical layers can be deposited.

FIG. 2B shows method 1000B; an alternative embodiment of method 1000A.

At 1002B, the force between micro devices 102a, 102b and donor substrate 100 are modulated globally (for all devices in an area of donor substrate) or selectively (for selected micro devices 102a, 102b only) so as to weaken donor force, FD.

At 1004B donor substrate 100 and receiver substrate 200 are aligned so that selected micro devices 102a, 102b are in line with corresponding contact pads 202a, 202b.

At 1006B, donor substrate 100 and receiver substrate 200 are moved together until the selected micro devices 102a, 102b touch contact pads 202a, 202b. It may not be strictly necessary that selected micro devices 102a, 102b actually touch corresponding contact pads 202a, 202b, but must be near enough so that the forces described below can be manipulated.

At 1008B, if needed the forces between selected micro devices 102 and receiver substrate 200 (and contact pads 202) are modulated so as to create a net force towards receiver substrate 200 for selected micro devices and a net force towards donor substrate 100 (or zero net force) for other micro devices 102c.

At 1010B, donor substrate 100 and receiver substrate 200 are moved apart, leaving selected micro devices 102a, 102b attached to corresponding contact pads 202a, 202b.

At 1012B, optional post processing is applied to selected micro devices 102a, 102b. Once donor substrate 100 is separated from receiver substrate 200, further processing steps can be taken. Additional layers can be deposited on top of or in between micro devices 102, for example, during the manufacture of a LED display, transparent electrode layers, fillers, planarization layers and other optical layers can be deposited. Step 1012B is optional and may be applied at the conclusion of method 1000A or 1000C as well.

FIG. 2C shows method 1000C; an alternative embodiment of method 1000A.

At 1002C, contact pads 202a, 202b corresponding to selected micro devices 102a, 102b are treated to create extra force upon contact. For example, an adhesive layer may be applied, as described in greater detail below.

At 1004C donor substrate 100 and receiver substrate 200 are aligned so that selected micro devices 102a, 102b are in line with corresponding contact pads 202a, 202b.

At 1006C, donor substrate 100 and receiver substrate 200 are moved together until the selected micro devices 102a, 102b touch contact pads 202a, 202b.

At 1008C, if needed the forces between selected micro devices 102 and donor substrate 100 are modulated so as to create a net force towards receiver substrate 200 for selected micro devices and a net force towards donor substrate 100 (or zero net force) for other micro devices 102c.

At 1010B, donor substrate 100 and receiver substrate 200 are moved apart, leaving selected micro devices 102a, 102b attached to corresponding contact pads 202a, 202b.

Multiple Applications

Any of the methods 1000A, 1000B, 1000C can be applied multiple times to the same receiver substrate 200, using different or the same donor substrates 100 or the same donor substrate 100 using different receiver substrates 200. For example, consider the case of assembling a display from LEDs. Each pixel may comprise red, green and blue LEDs in a cluster. However, manufacturing LEDs is more easily done in batches of a single colour and on substrates that are not always suitable for incorporation into a display. Accordingly, the LEDs must be removed from the donor 100 substrate, possibly where they are grown, and placed on a receiver substrate, which may be the backplane of a display, in RGB clusters. In case, the color. This is simplest when the pitch of the array of pixels can be set to match the pitch of the array of LEDs on the donor substrate.

Figure 4A:
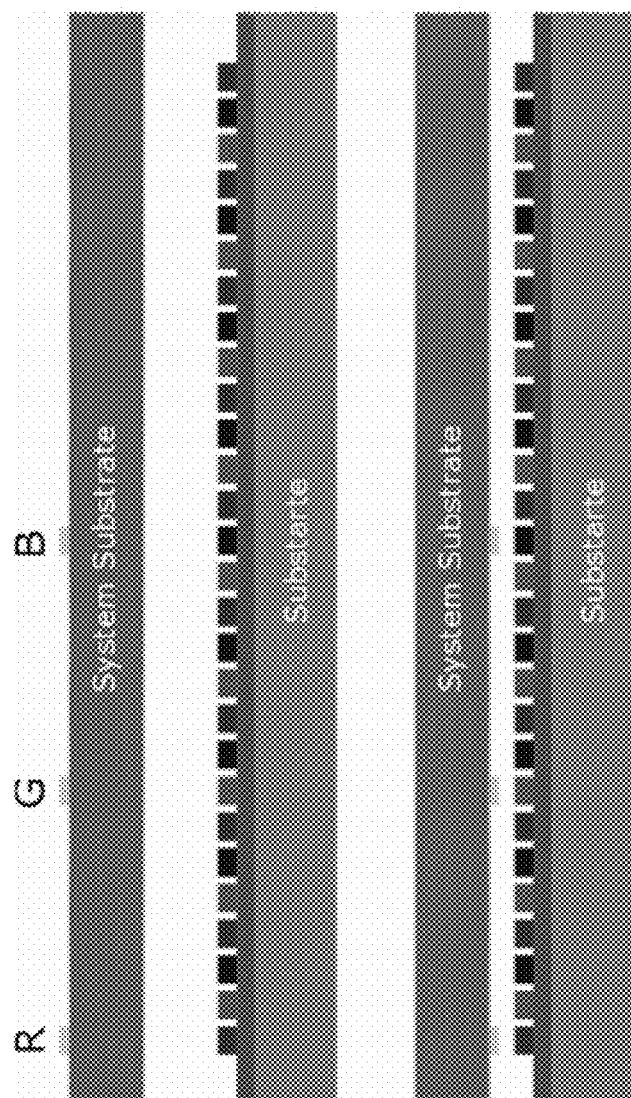
FIG. 4A shows a donor substrate with different micro devices interleaved and the corresponding contact pads in the receiver substrate are aligned with each micro device accordingly enabling transferring different micro devices at once.
Figure 4B:
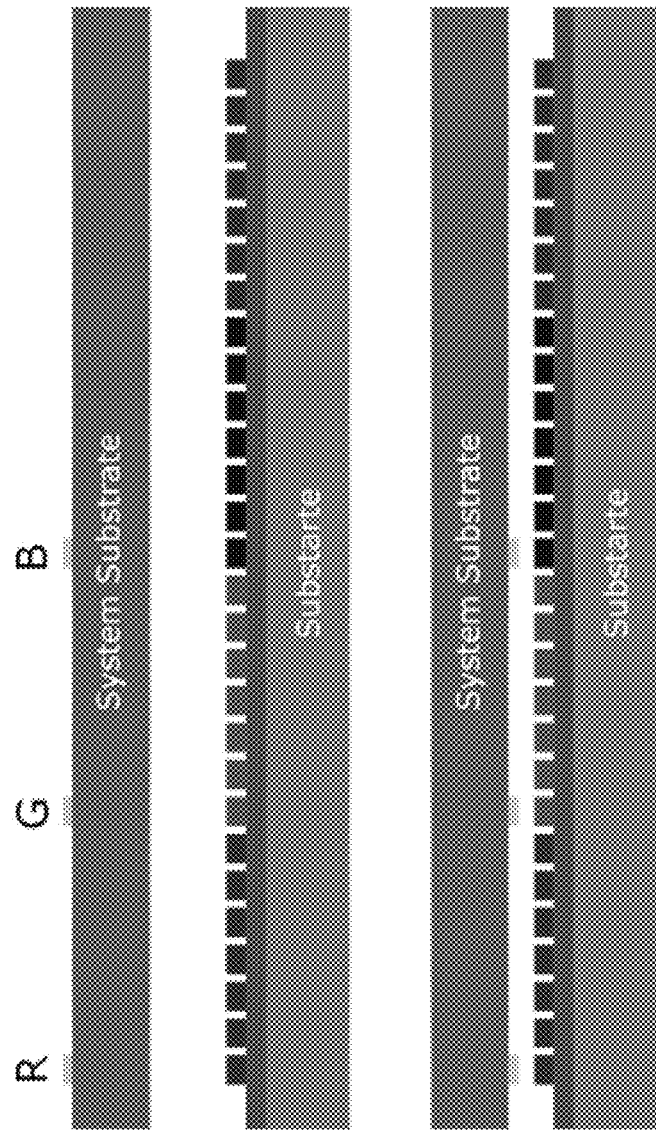
FIG. 4B shows a donor substrate with different micro devices in groups and the corresponding contact pads in the receiver substrate are aligned with each micro device accordingly enabling transferring different micro devices at once.-4C show arrangements with different pitches of micro devices and contact pads.

When this is not possible, the pitches of each array can be set proportionally. FIGS. 4A and 4B show arrangements where the pitch of the LEDs on the donor substrate is one seventh the pitch of the contact pads on the receiver substrate.

Figure 4C:
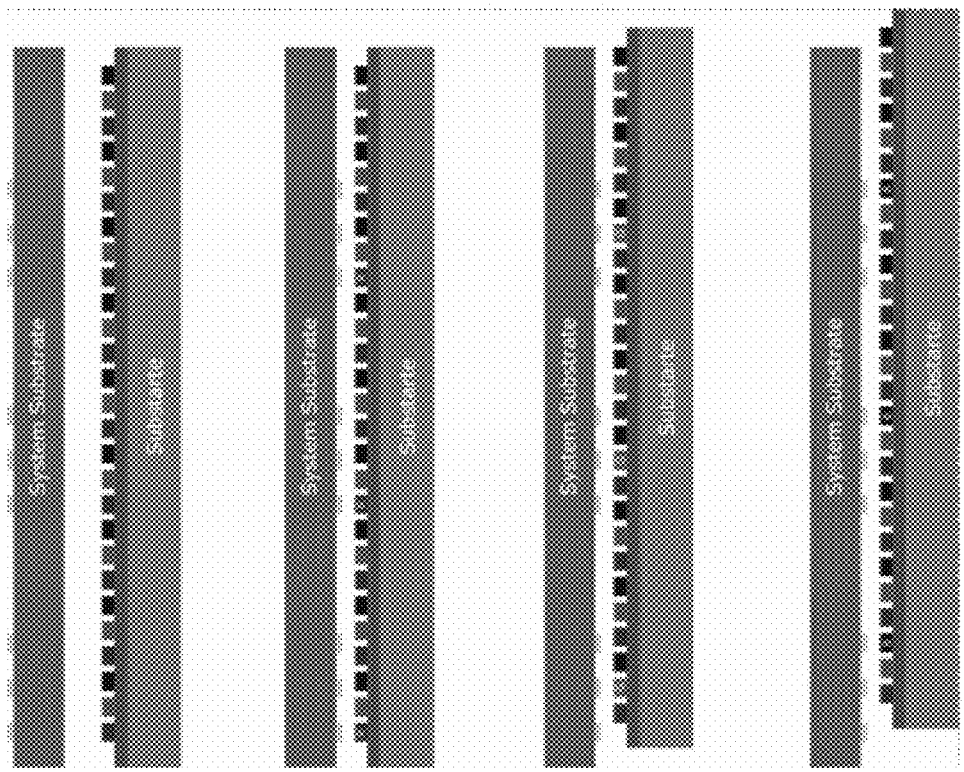
FIG. 4C shows a donor substrate with different micro devices interleaved and only one set of the corresponding contact pads in the receiver substrate with one of the micro device types is aligned with each micro device accordingly so multiple transferring process is needed to transfer all different types of micro devices.

In general, however, matching the pitch of an array of pixels to the donor substrate is likely to be infeasible. For example, one generally tries to manufacture LEDs with the smallest possible pitch on the donor substrate to maximize yield, but the pitch of the pixels and the array of contact pads on the receiver substrate is designed based on desired product specifications such as size and resolution of a display. In this case, one may not be able to transfer all the LEDs in one step and repetition of any of the methods 1000A, 1000B, 1000C will be necessary. Accordingly, it may be possible to design the donor substrate and the receiver substrate contact pad array so that a portion of each pixel can be populated during each repetition of any of methods 1000A, 1000B, 1000C as shown in FIG. 4C At I, receiver substrate and donor substrate are not aligned. At II, all red LEDs are transferred. At III, all green LEDs are transferred. At IV, all blue LEDs are transferred. Repositioning of donor substrate and receivers substrate is required between each transfer step.

Those of skill in the art will now understand that that additional variations and combinations of methods 1000A, 1000B and 1000C are also possible. Specific techniques and considerations are described below that will apply to any of methods 1000, alone or in combination.

Use of Heat for Force Modulation

Selective and global heating can be used in multiple ways to assist in method 1000A. For example, heat can be used in step 1008A to weaken FD or after step 1008A to create a permanent bond between micro devices 102 and contact pads 202. In one embodiment, heat can be generated using resistive elements incorporated into donor substrate 100 and/or receiver substrate 200.

Figure 5A:
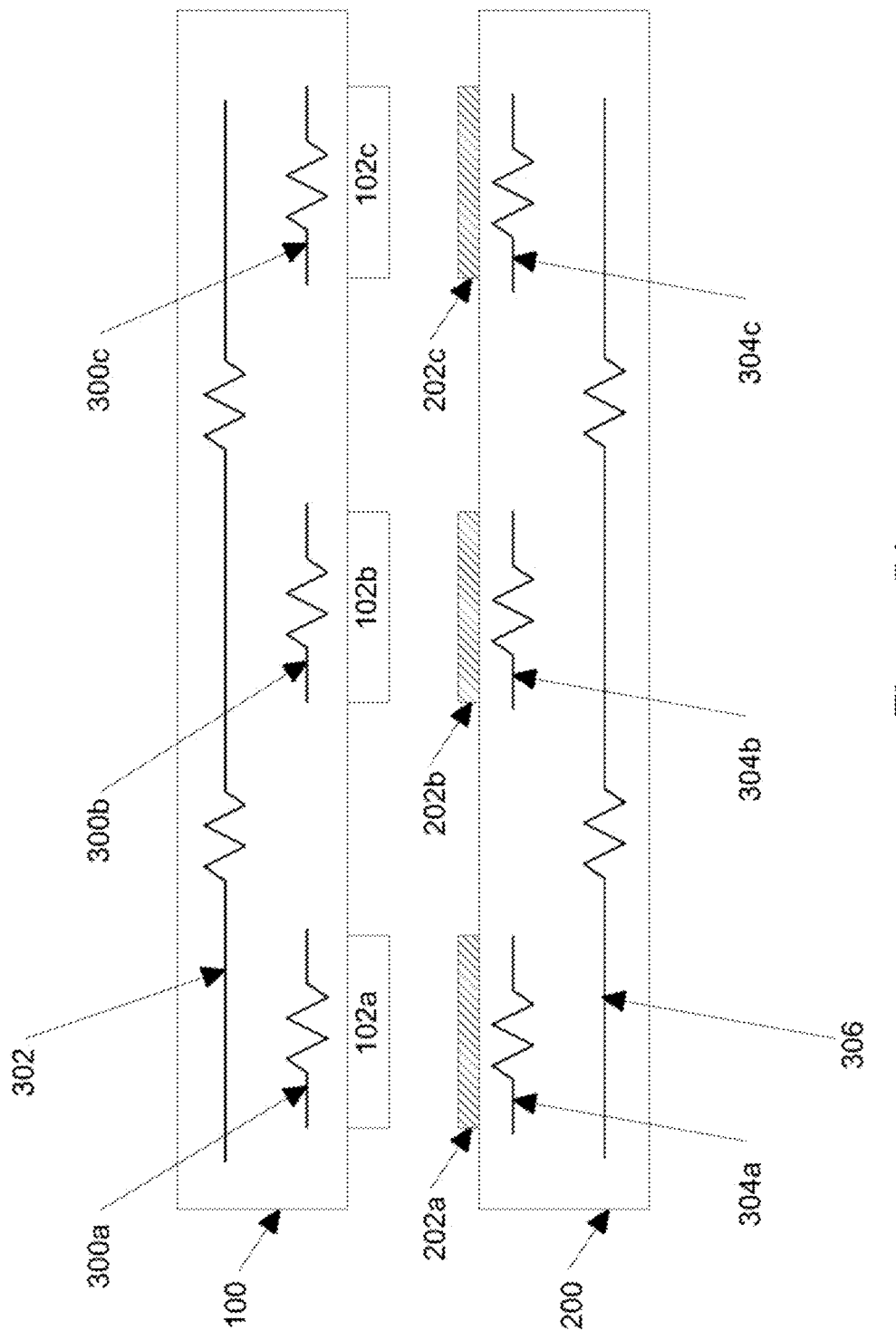
FIG. 5A shows selective and global heating elements incorporated into substrates.
Figure 5B:
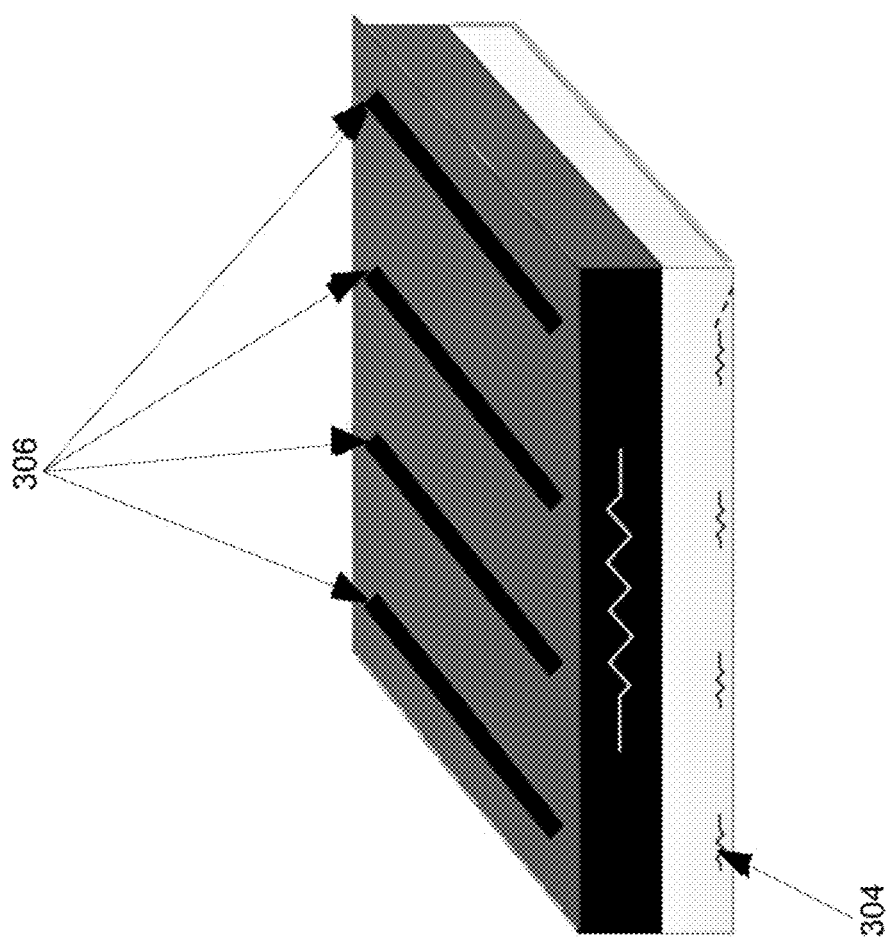
FIG. 5B shows one embodiment for pattering selective and global heating elements incorporated into substrates.

FIG. 5A shows selective and global heating elements incorporated into substrates. Selective heating elements 300 and global heating element 302 may be incorporated into donor substrate 100 while selective heating elements 304 and global heating element 306 may be incorporated into receiver substrate 200. In another embodiment, selective heating can be achieved using a patterned global heater, shown in plan view in FIG. 5B.

FD can be weakened by applying heat to the interface between a micro device 102 and donor substrate 100. Preferably, selective heating elements 300 are sufficient to heat the interface past a threshold temperature where micro devices 102 will detach. However, when this is not feasible, global heater 302 can be used to raise the temperature to a point below the threshold while selective heaters 300 raise the temperature further, only for selected micro devices 102a, 102b above the threshold. An environmental heat source, e.g. a hot room, can substitute for the global heater.

Heat can also be used to create a permanent bond between micro devices 102 and contact pads 202. In this case, contact pads 202 should be constructed of a material that will cure when heated, creating a permanent bond. Preferably, selective heating elements 304 are sufficient to heat contact pads 202 past a threshold temperature to cause curing. However, when this is not feasible, global heater 306 can be used to raise the temperature to a point below the threshold for curing while selective heaters 304 raise the temperature for selected contact pads 202a, 202b above the threshold. An environmental heat source, e.g. a hot room, can substitute for the global heater. Pressure may also be applied to aid in permanent bonding.

Figure 5C:
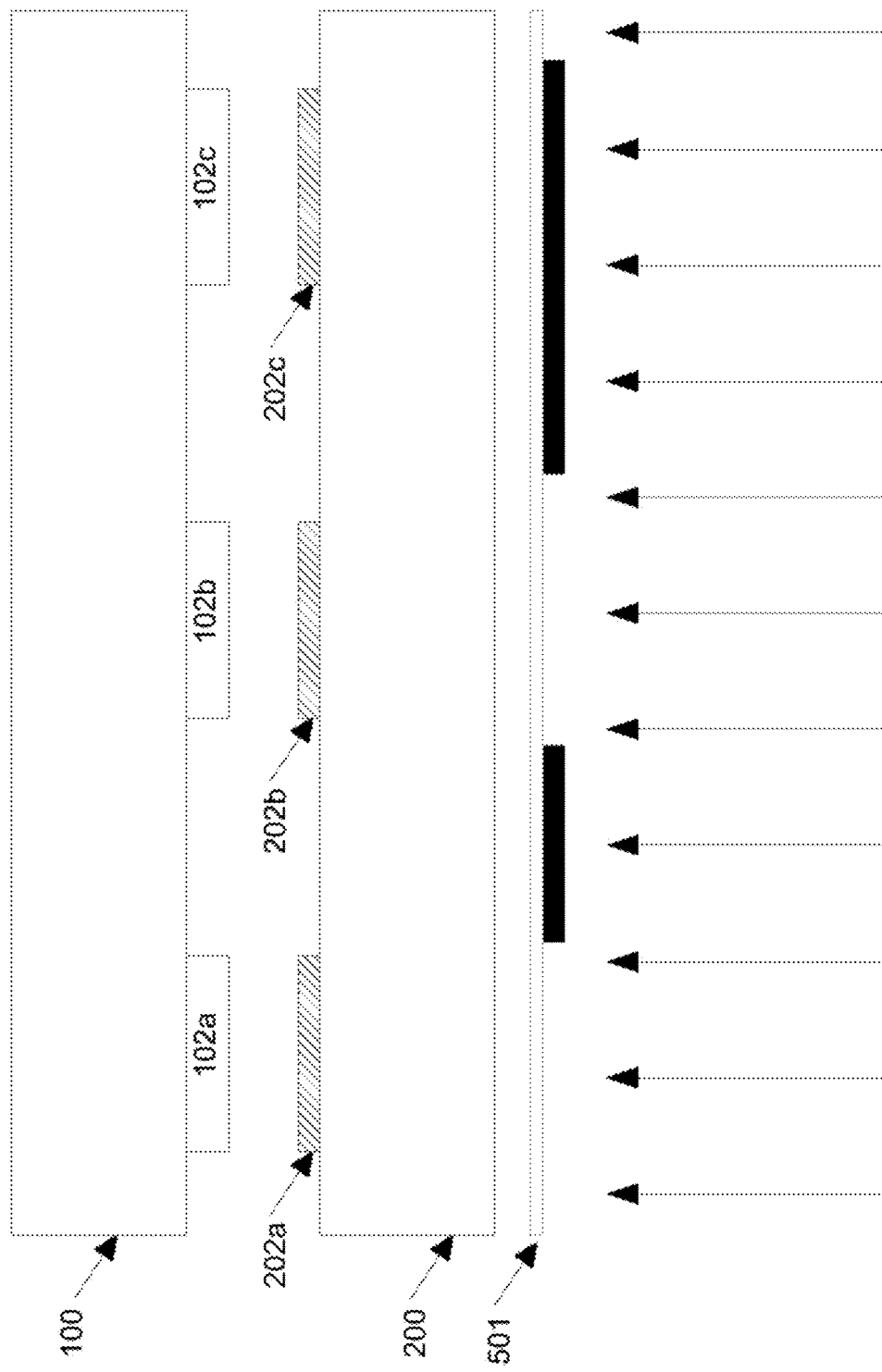
FIG. 5C shows use of external sources to selectively heat up at least one substrate.

Other variations are possible. In some cases, it may be feasible for micro devices 102 or contact pads 202 to themselves act as the resistive elements in selective heaters 300, 304. Heat can also be applied in a selective manner using lasers. In the case of lasers, it is likely that at least one of the donor substrate 100 and the receiver substrate 200 will have to be constructed of material that is at least semi-transparent to the laser being used. As shown in FIG. 5C, in one case, shadow mask can be used to selectively block the laser from the non-selected devices. Here, the shadow mask 501 is aligned with the receiver substrate or donor substrate depending on direction of laser. Then laser can cover the either substrate partially or fully. In case of partial coverage, raster scan or step-and-repeat may be used to cover the entire intended area on the substrate. To further improve the heat transfer from the laser, a layer with higher laser absorption rate can be added to the force modulation element. It is possible to use the contact pad as the force modulation element in the receiver substrate.

Adhesive Force Modulation

In another embodiment of selective transfer, FR is generated by adhesive. Here, the FR is modulated either by selective application of adhesive to the landing area on the receiver substrate (or selected micro devices) or by selective curing of an adhesive layer. This method can be used in combination with weakening the donor force selectively or globally and is compatible with any of the methods 1000A, 1000B, and 1000C or any combination of them. Although, the following description is based on 1000A similar approaches can be used for 1000B, 1000C and the combination of the methods. In addition, the order of donor force weakening step 1110 can be changed in reference to other steps without affecting the results.

Figure 6A:
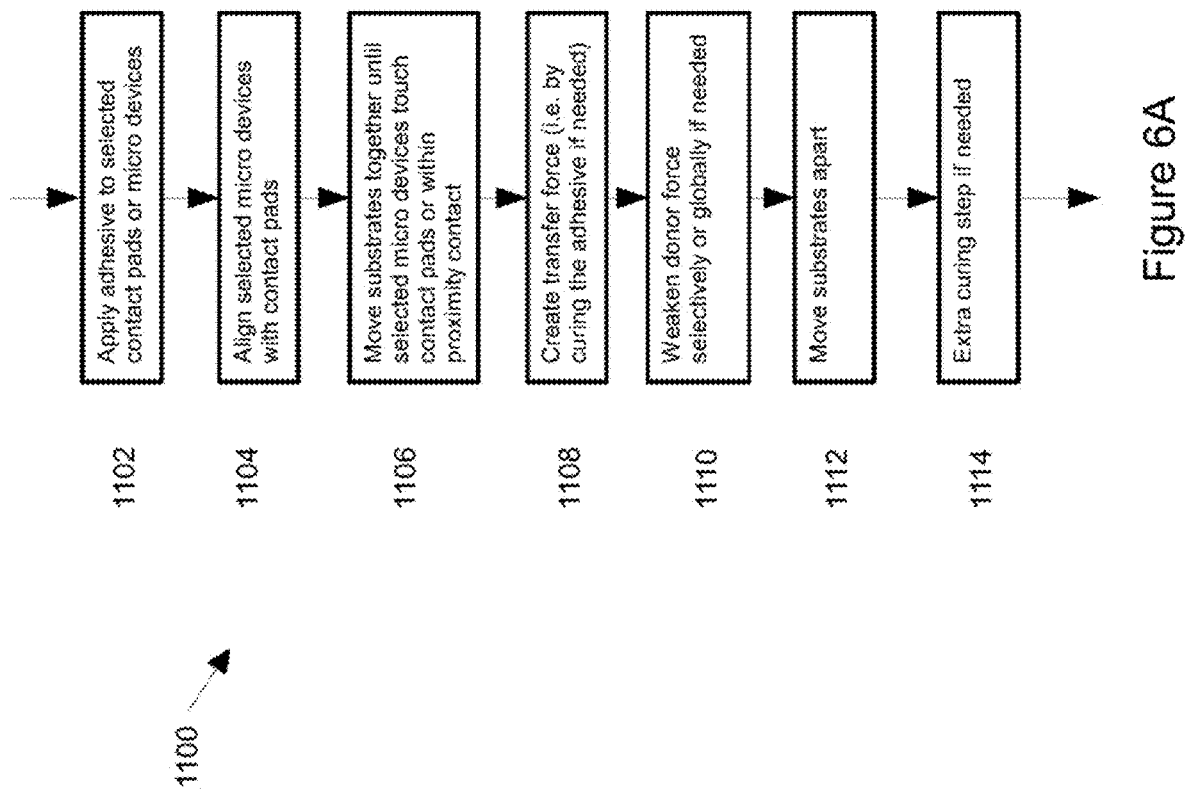
FIG. 6A shows a flowchart of method 1100 for selectively transferring micro devices from a donor substrate to a receiver substrate.
Figure 6B:
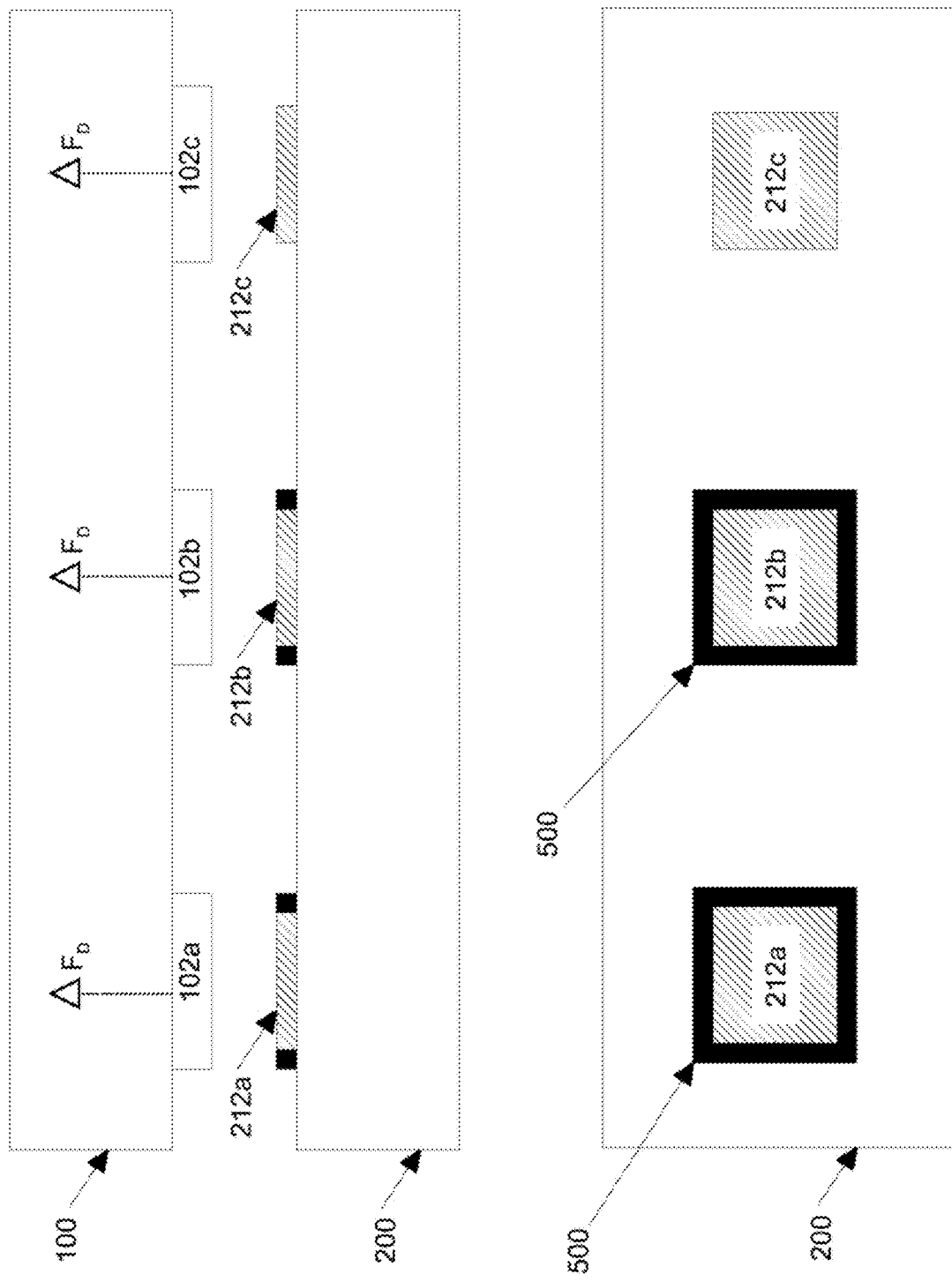
FIG. 6B shows the step of preparing the donor and receiver substrates for selective transfer.

FIG. 6A shows a flowchart of method 1100, a modified version of method 1000 specific to the use of adhesive to generate FR. FIG. 6B shows donor substrate 100 and receiver substrate 200 setup to perform method 1100. Donor substrate 100 is shown in cross section and receiver substrate 200 is shown in cross section and plan view. Donor substrate 100 has an array of micro devices 102 attached. Donor force FD acts to hold micro devices 102 to donor substrate 100.

Receiver substrate 200 has an array of contact pads 212 attached. Although FIG. 6B shows the force modulation element 500 connected to the contact pads 212, they can be physically separated.

As shown in FIG. 6B, contact pads 212a, 212b are surrounded by a ring of adhesive 500. Adhesive 500 has been applied selectively to contact pads 212 where transfer of a micro device is desired so that when donor substrate 100 and receiver substrate 200 are moved together, micro devices 102a, 102b will make contact with adhesive 500 as well as contact pads 212a, 212b.

Method 1100 will be explained with reference to FIGS. 6B-6F. At 1102, adhesive is selectively applied as shown in FIG. 6B.

Figure 6C:
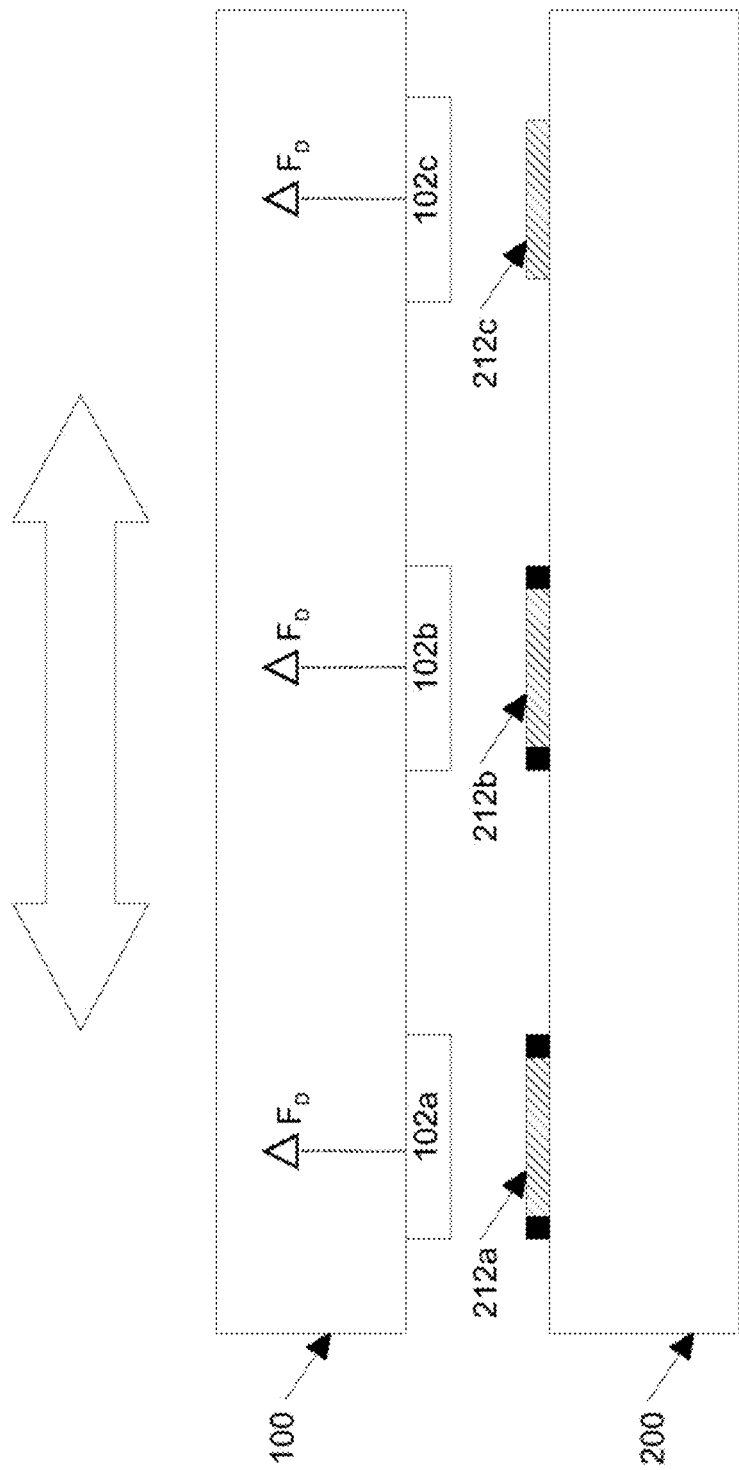
FIG. 6C shows the step of aligning the substrates.

At 1104 donor substrate 100 and receiver substrate 200 are aligned so that selected micro devices 102a, 102b are in line with corresponding selected contact pads 212a, 212b, as shown in FIG. 6C.

Figure 6D:
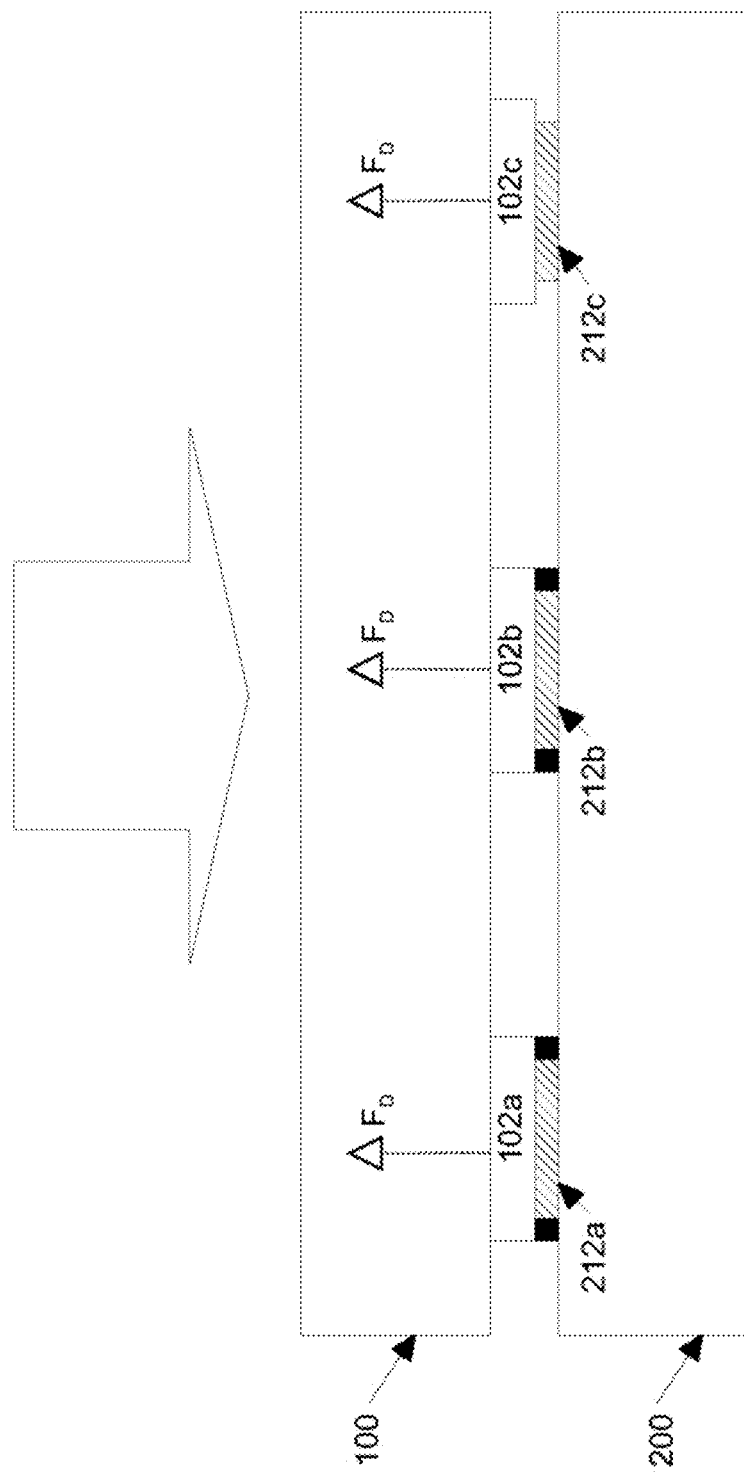
FIG. 6D shows the step of moving the substrates toward each other within a predefined distance margin.

At 1106, donor substrate 100 and receiver substrate 200 are moved together until selected micro devices 102a, 102b are in contact with corresponding selected contact pads 212a, 212b and adhesive 500, as shown in FIG. 6D.

Figure 6E:
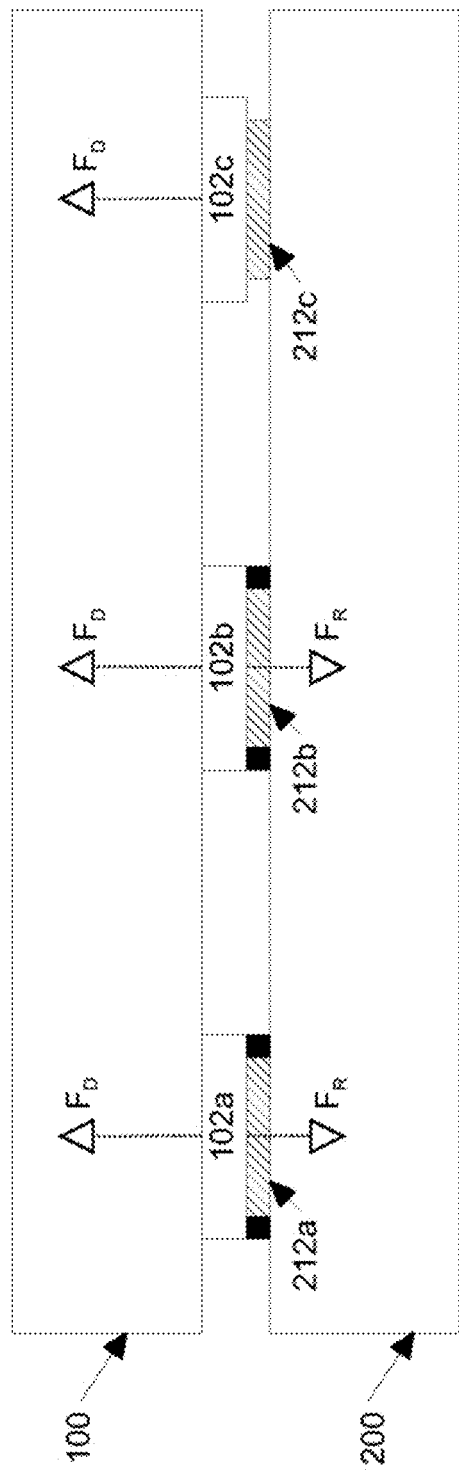
FIG. 6E shows the step of creating receiver forces by curing the adhesive (e.g. applying pressure or heat). This can be globally or selectively.

At 1108, receiver force, FR, is generated, as shown in FIG. 6E. FR is generated by adhesion between micro devices 102a, 102b, adhesive 500 and at least one of contact pads 212a, 212b and receiver substrate 200. FR acts to hold selected micro devices 102 to corresponding selected contact pads 212. Preferably, FR can be generated selectively by applying adhesive 500 selectively, as shown.

Figure 6F:
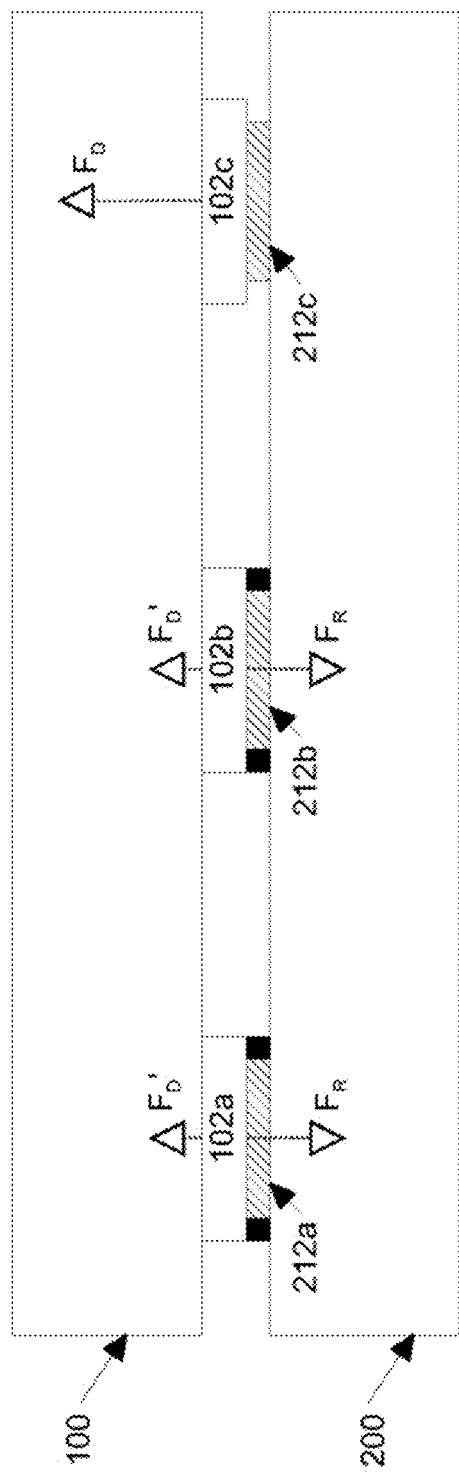
FIG. 6F shows the step of reducing donor forces if needed. This can be globally or selectively.

At 1110, donor force FD is selectively (or globally) weakened for selected micro devices 102a, 102b, so that FD' is less than FR, as shown in FIG. 6F. The may be done, for example, using laser lift off techniques, lapping or wet/dry etching. In another case, donor force FD can be weakened for all the micro devices. In this case, force modulation is done by selective adhesive application to the selected force element on the receiver substrate. The order of FD and FR modulation can be changed. This step may be eliminated if the adhesive force modulation is selective and FR is larger than FD.

Figure 6G:
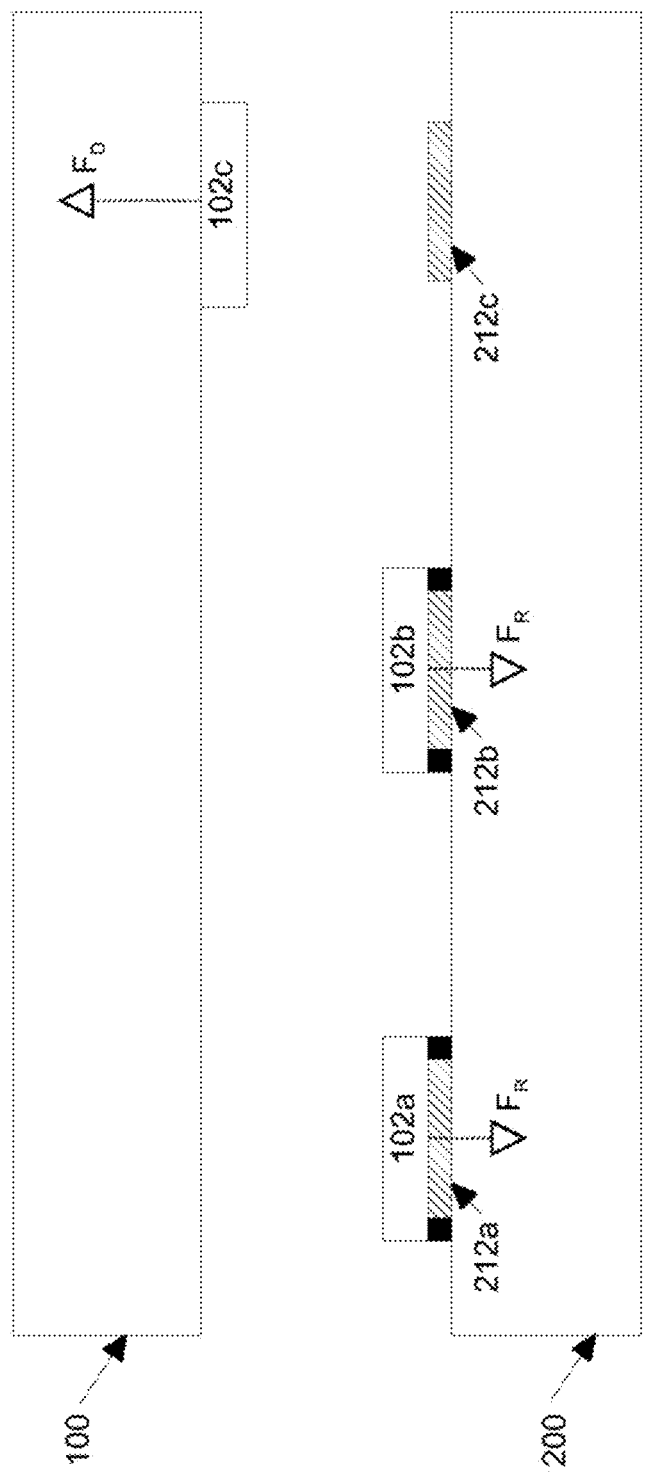
FIG. 6G shows the step of moving the substrates away from each other.

At 1112, donor substrate 100 and receiver substrate 200 are moved apart, leaving selected micro devices 102a, 102b attached to corresponding selected contact pads 212a, 212b, as shown in FIG. 6G. Once donor substrate 100 is separated from receiver substrate 200, further processing steps can be taken. For example, donor substrate 100 and receiver substrate 200 can be re-aligned and steps can be repeated in order to transfer a different set of micro devices 102 to contact pads 212. Additional layers can also be deposited on top of or in between micro devices 102, for example, during the manufacture of a LED display, a transparent electrode layers, fillers, planarization layers and other optical layers can be deposited.

One possible additional step, at 1114, is curing adhesive 500. Curing may create a permanent bond between micro devices 102 and contact pads 212. In another embodiment, curing takes place as part of step 1108 and is part of generating FR. If several sets of selected micro devices 102 are to be transferred to a common receiver substrate 200 curing may be done after all the transfers are complete or after each set is transferred.

Adhesive 500 can be applied in many ways. For example, adhesive 500 can be applied to any or all of micro devices 102, contact pads 212 or receiver substrate 200. It will often be desirable that an electrical coupling exist between a micro device 102 and its corresponding contact pad 202. In this case, the adhesive may be selected for its conductivity. However, suitable conductive adhesives are not always available. In any case, but especially when a conductive adhesive is not available, adhesives can be applied near contact pads or may cover only a portion of the contact pad. FIG. 7A shows some other possible arrangements of adhesive on receiver substrate 200, (I) including four corners, (II) opposite sides, (III) center and (IV) one side geometries.

Figure 7B:
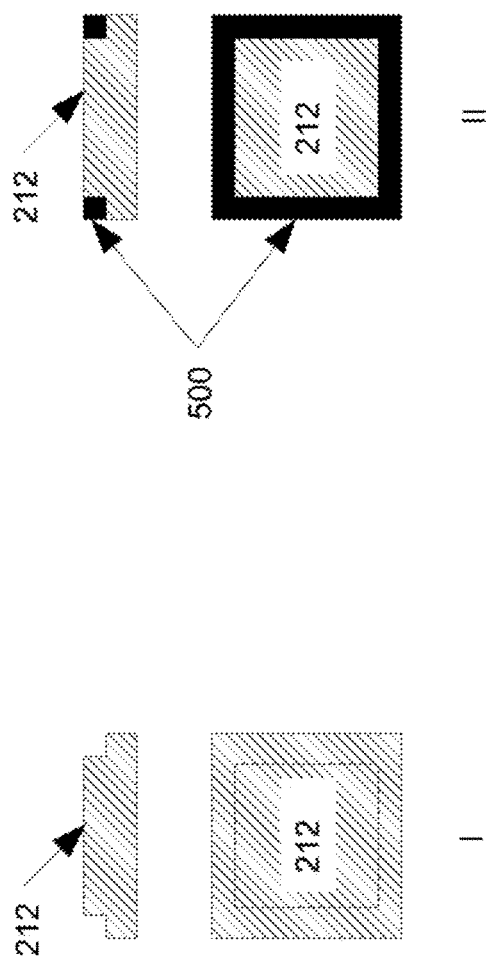
FIG. 7B shows a contact pad with a cut out before and after application of an adhesive.

In another embodiment, one or more cut-outs can be provided for the adhesive 500. FIG. 7B shows a contact pad 212 with a cut out (I) before and (II) after application of an adhesive.

Figure 8:
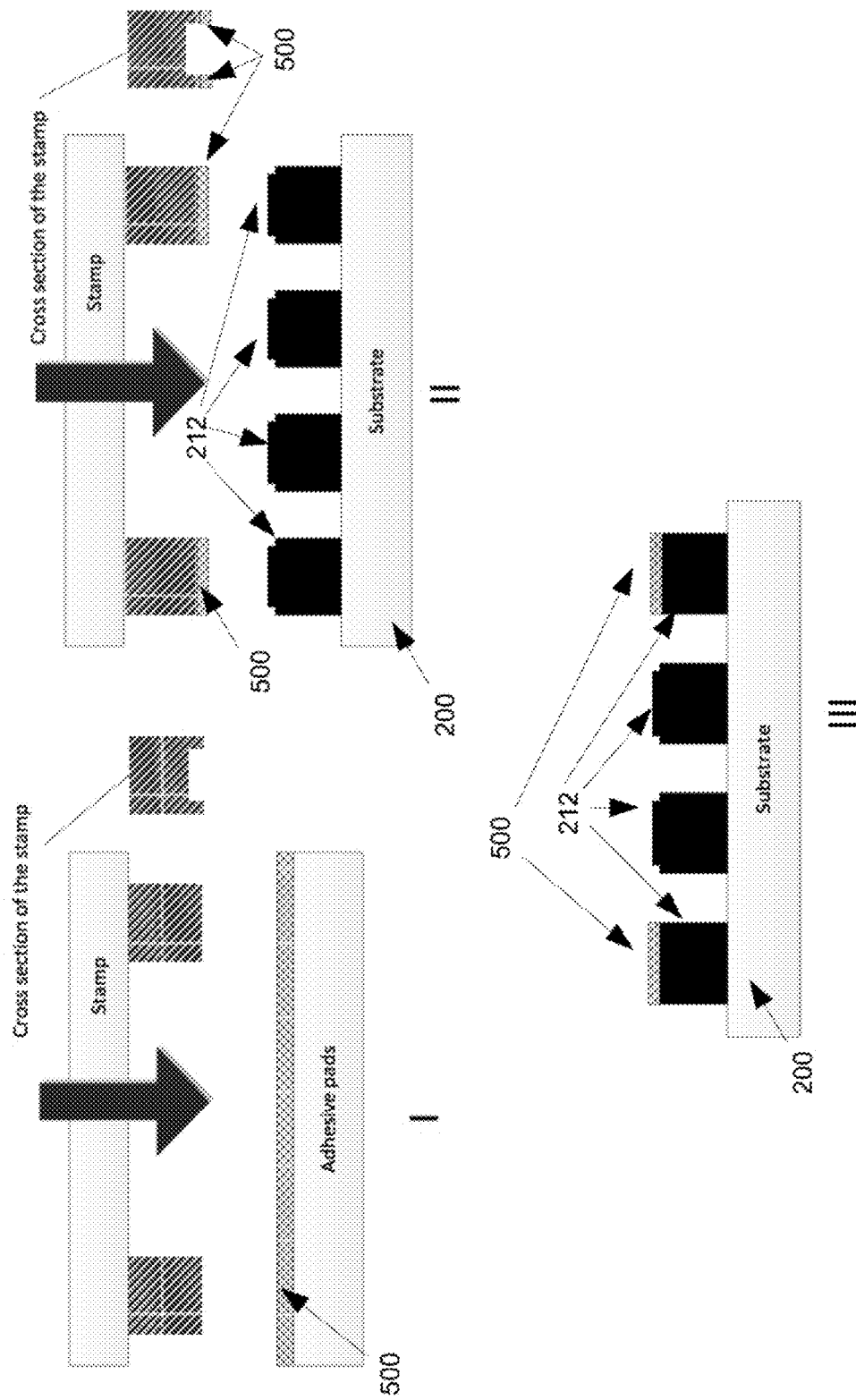
FIG. 8 shows a stamping process that can be used to apply adhesive to contact pads.

The adhesive 500 can be stamped, printed or patterned onto the contact pads 212, micro devices 102 or receiver substrate 200 by any normal lithography techniques. For example, FIG. 8 shows a stamping process that can be used to apply adhesive 500 to, for example, contact pads 212. Selectivity in generating FR can be achieved by selecting which contact pads 212 will receive adhesive 500. An analogous procedure can be used to apply adhesive to micro devices 102 or receiver substrate 200. At (I), a stamp with a profile matching the desired distribution of adhesive 500 is wet. At (II), the stamp is brought into contact with the receiver substrate 200 and selected micro devices 102. At (III), receiver substrate is now wet with adhesive and ready to receive transfer of selected micro devices 102. Depending on the needs of the process, stamps with reverse profiles can also be used. In another embodiment, both the micro devices 102 and contact pads 212 may be wet with adhesive.

Adhesive 500 may be selected so that it will cure when heat is applied. Any of the techniques described with regard to heating can be suitably applied by one of skill in the art, according to the needs of a specific application.

Mechanical Force Modulation

In another embodiment of selective transfer, FR is generated by mechanical force. Here, the FR is modulated by application of mechanical forces between the landing area on the receiver substrate and the micro device. This method can be used in combination with weakening the donor force selectively or globally and is compatible with any of the methods 1000A, 1000B, and 1000C or any combination of them. Although, the following description is based on 1000A similar approaches can be used for 1000B, 1000C and the combination of the methods. In addition, the order of donor force weakening step 1210 can be changed in reference to other steps without affecting the results.

In one example, differential thermal expansion or pressure force can be used to achieve a friction fit that will hold micro devices 102 to contact pads 202.

Figure 9:
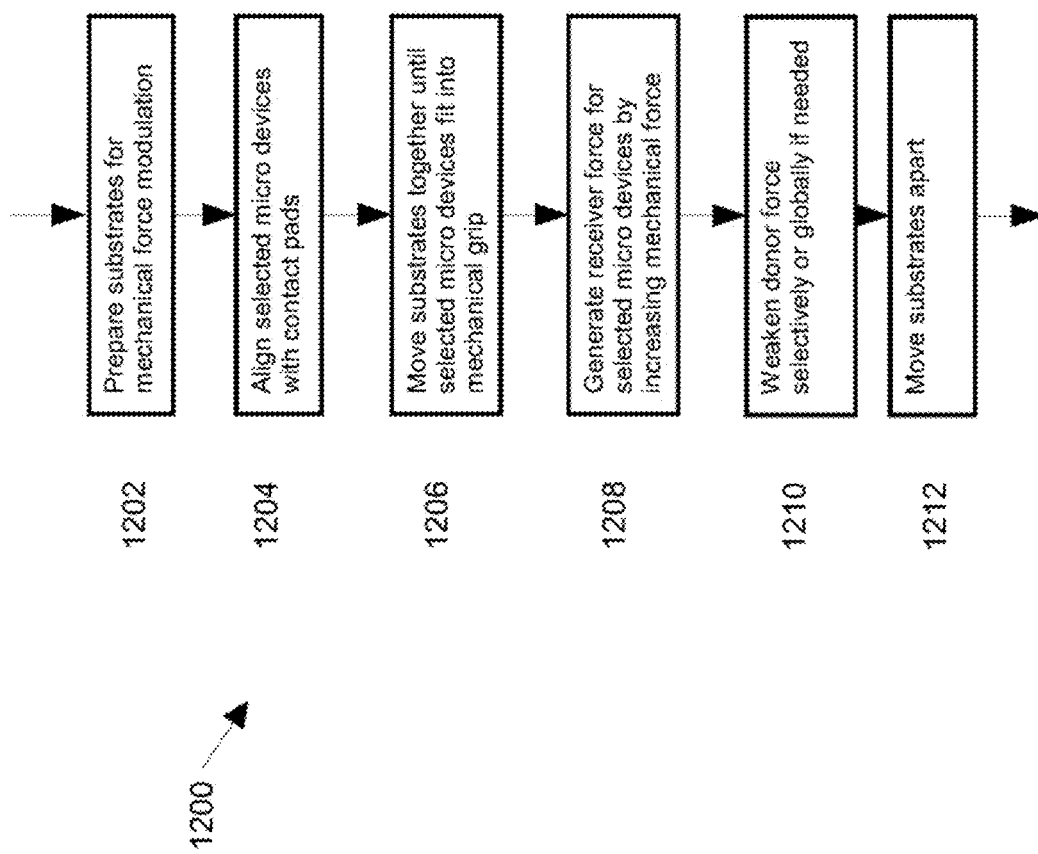
FIG. 9 shows a flowchart of method 1200 for selectively transferring micro devices from a donor substrate to a receiver substrate.
Figure 10:
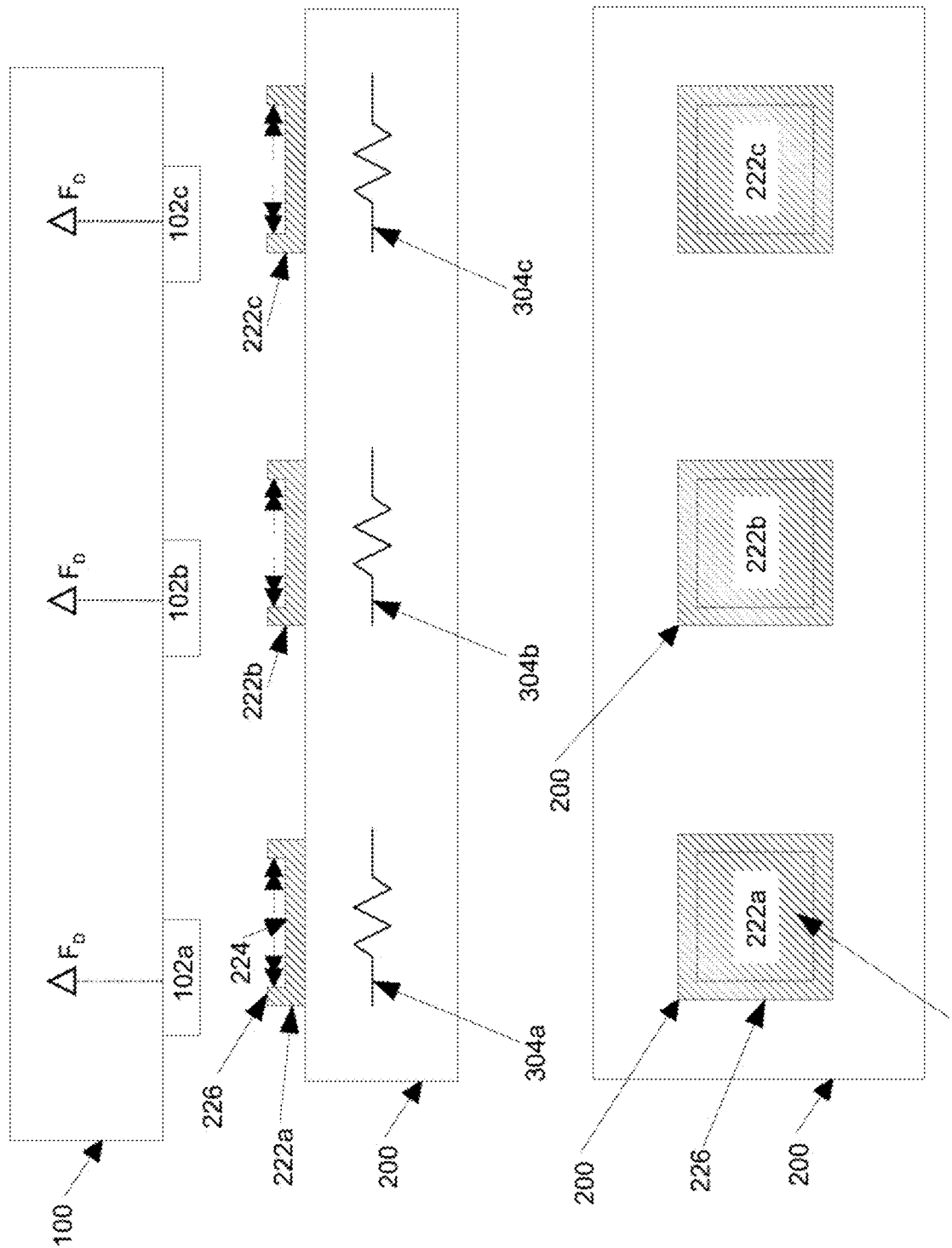
FIG. 10 shows a donor substrate and a receiver substrate setup to perform method 1200.

FIG. 9 shows a flowchart of method 1200, a modified version of method 1000A suitable for mechanical generation of FR. FIG. 10 shows a donor substrate 100 and a receiver substrate 200 setup to perform method 1200. Donor substrate 100 is shown in cross section and receiver substrate 200 is shown in cross section and plan view. Donor substrate 100 has an array of micro devices 102 attached. Donor force FD acts to hold micro devices 102 to donor substrate 100. Micro devices 102 and donor substrate 100 are shown as connected to ground 244.

Receiver substrate 200 has an array of contact pads 232 attached. In the embodiment shown, the array of contact pads 232 is of the same pitch as the array of micro devices 102; i.e., there is one micro device 102 for each contact pad 232. As discussed above, this need not be true, although it is preferable that the pitch of the array of contact pads 232 and the pitch of the array of micro devices 102 be proportional as this facilitates the transfer of multiple devices simultaneously.

Method 1200 will be described with reference to FIGS. 11A-11E. At 1202 the substrates are prepared for mechanical force modulation. In case of a mechanical grip, the grip is opened by different means. In one example heat is applied to force modulation element 222 which can be the same a contact pad on the landing area. Here, mechanical grip and contact pads are used interchangeably. However, it is obvious to one of skill in the art that the mechanical grip and contact pad can be different. It is possible to integrate the mechanical grip in the micro devices as well. The heat can be applied globally or selectively using heaters 304 causing the grip to open, as shown by the double arrows in FIG. 11A. Note that contact pads 222 are constructed with a central depression 224 and peripheral walls 226. It should also be noted that a combination of selective heaters 304 and global heater 306 or a combination of selective heaters 304 and an environmental heat source or external heat source in combination or alone could also be used.

Figure 11A:
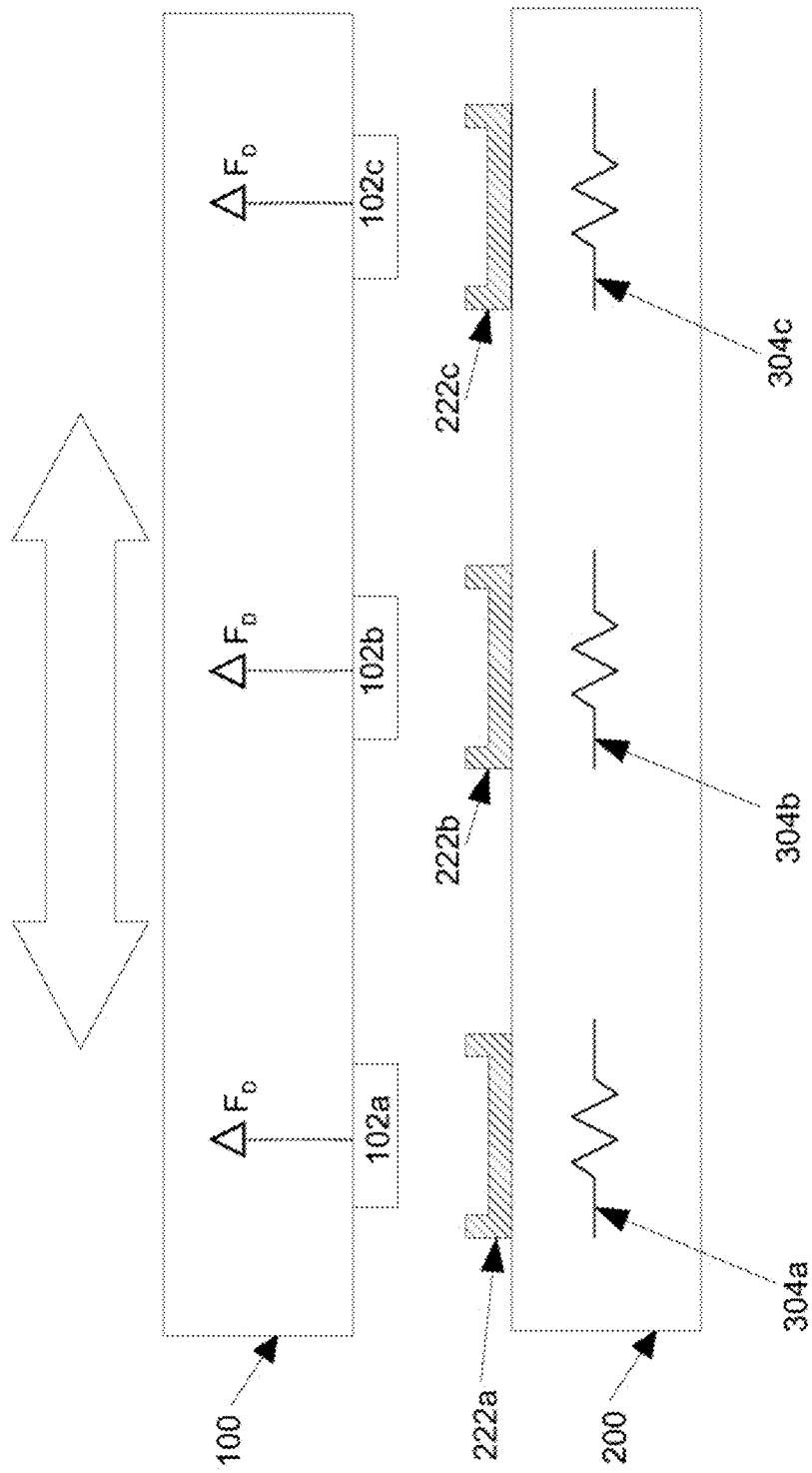
FIG. 11A shows the step of aligning donor and receiver substrates.
Figure 11B:
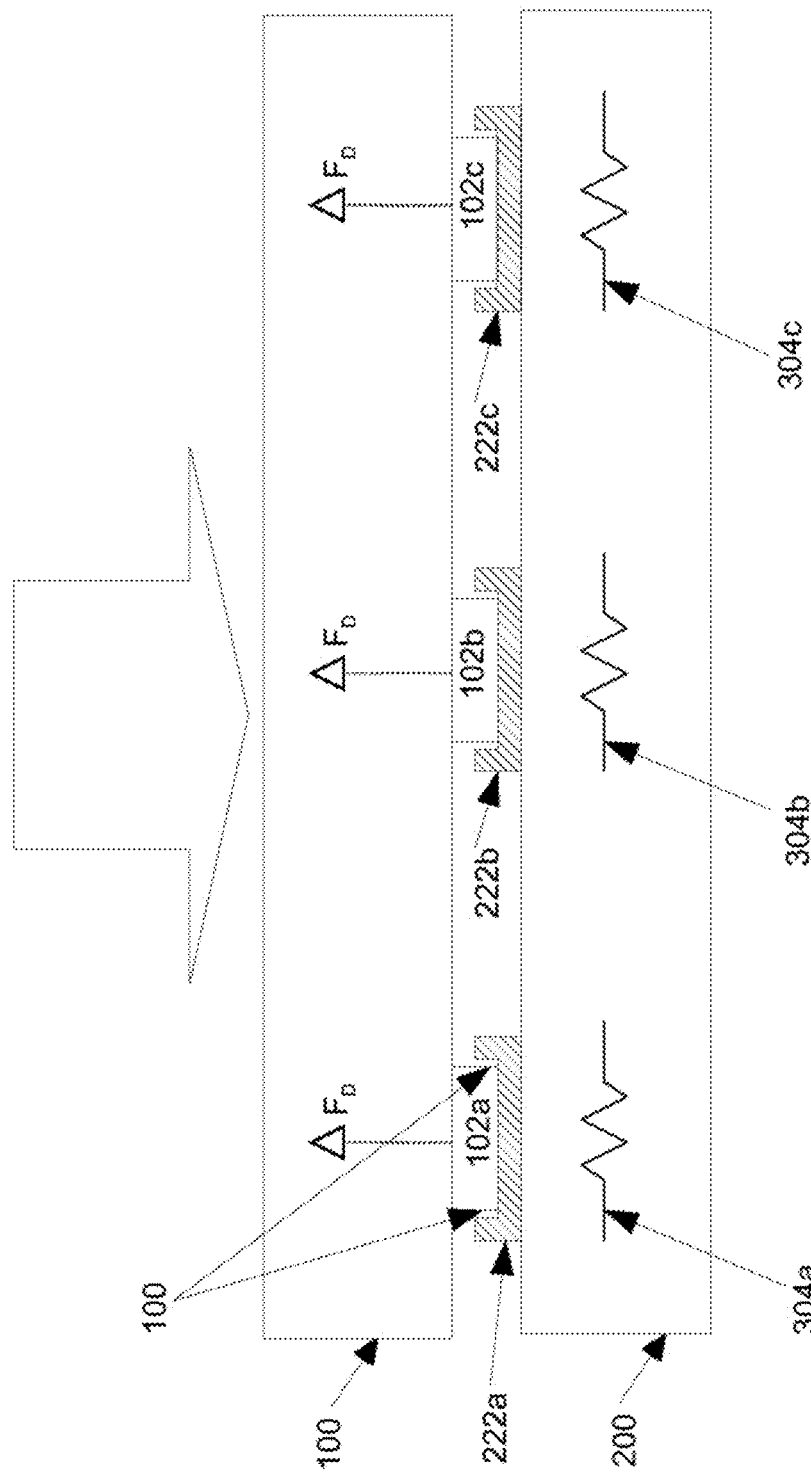
FIG. 11B shows the step of moving donor and receiver substrates to a defined distance margin while mechanical force is loose.

At 1204, donor substrate 100 and receiver substrate are aligned so that selected micro devices 102a, 102b are in line with corresponding contact pads 222a, 222b, as shown in FIG. 11B.

At 1206, donor substrate 100 and receiver substrate 200 are moved together until the selected micro devices 102a, 102b fit into the space defined by the peripheral walls of corresponding mechanical grip as shown in FIG. 11B. As noted above, each contact pad 222 is constructed with a central depression 224 and peripheral walls 226. These features of contact pads 222 are sized so as to fit snugly around a micro device 102. The material of the mechanical grips is chosen, in part, due to thermal properties; specifically so that the mechanical grips have a higher coefficient of thermal expansion than micro devices 102. Accordingly, when heat is applied to the mechanical grips they expand more than a micro device 102 would expand at the same temperature so that the central depression and peripheral walls will be able to accommodate a micro device 102 with a gap 228. The expanded size of mechanical grip allows micro devices 102 to fit easily.

Figure 11C:
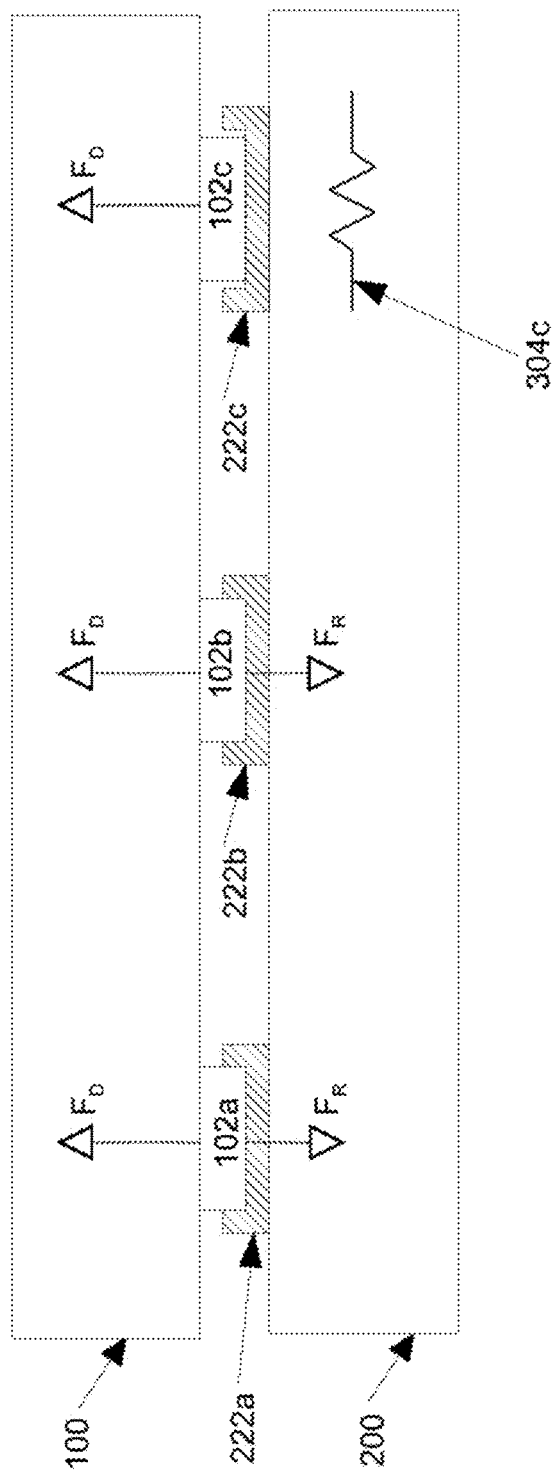
FIG. 11C shows the step of increasing mechanical forces.

At 1208, a receiver force, FR, is generated. FR is generated by selectively cooling contact pads 222 corresponding to selected micro devices 102, causing peripheral walls 226 to contract around selected micro devices 102, closing gap 228 and exerting a compressive force on micro device 102, holding it in place, as shown in FIG. 11C. Selectivity can be achieved by selectively turning off selective heaters 304.

Figure 11D:
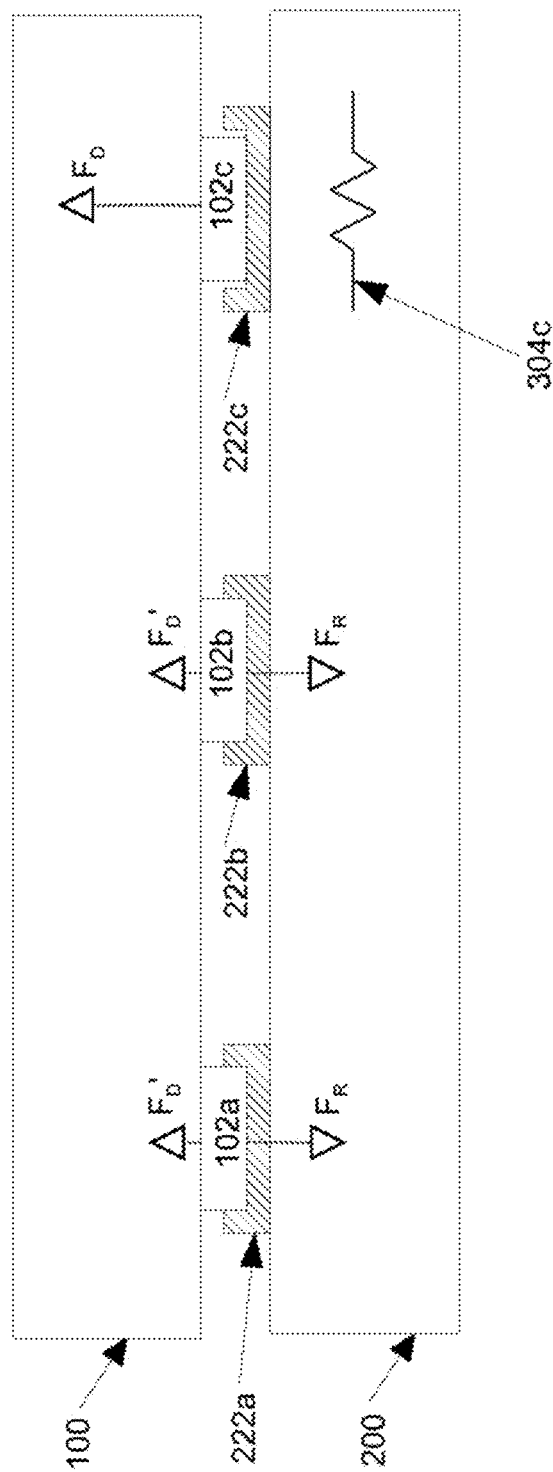
FIG. 11D shows the step of reducing donor forces if needed (this step can be done in advance as well).

At 1210, donor force FD is selectively (or globally) weakened for selected micro devices 102a, 102b, so that FD' is less than FR, as shown in FIG. 11D. This may be done, for example, using laser lift off techniques, lapping or wet/dry etching. In some embodiments FD is weaker than FR, in which case selective weakening of FD is not required. This step may be eliminated if the mechanical force modulation is selective and the FR is larger than FD.

Figure 11E:
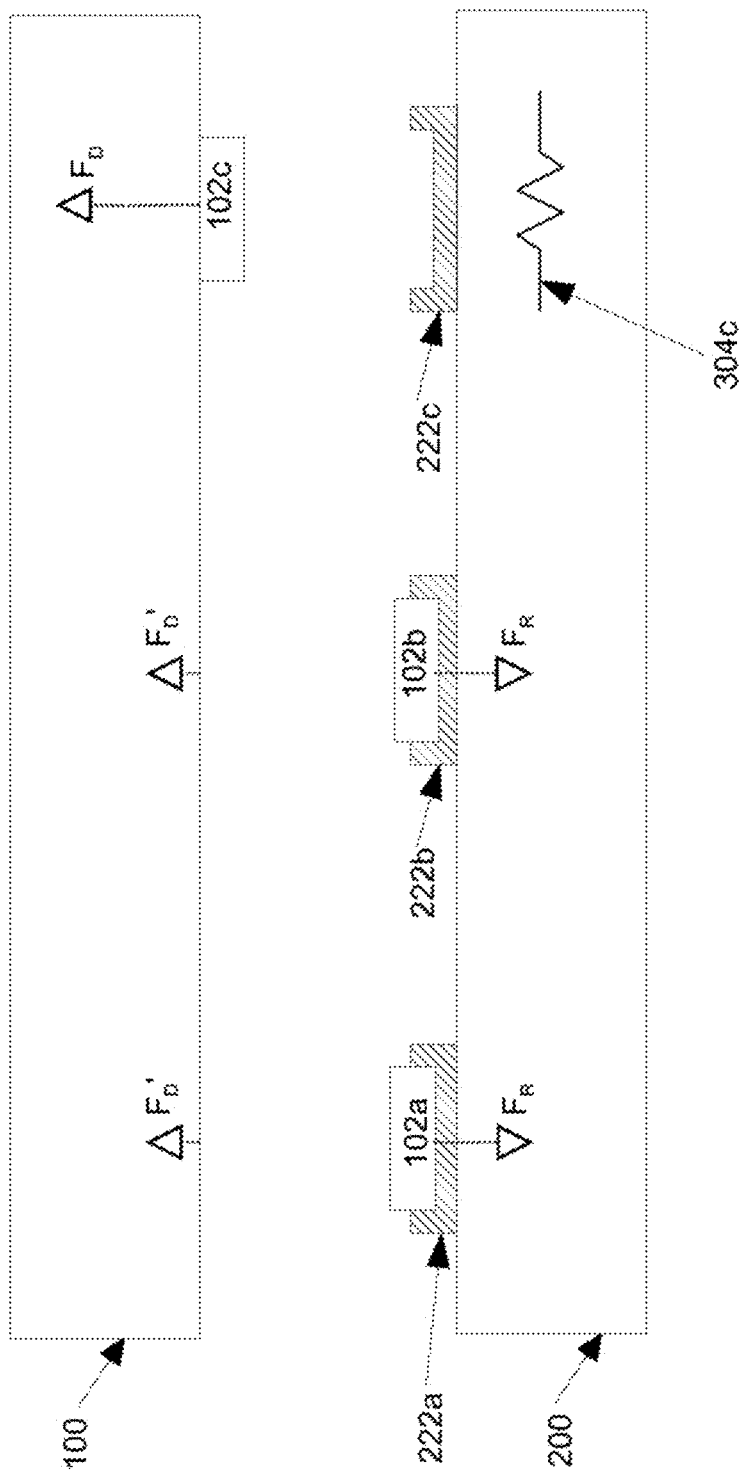
FIG. 11E shows moving the donor and receiver substrates away from each other.

At 1212, donor substrate 100 and receiver substrate 200 are moved apart, leaving selected micro devices 102a, 102b attached to corresponding contact pads 222a, 222b, as shown in FIG. 11E. Once donor substrate 100 is separated from receiver substrate 200, further processing steps can be taken. For example, donor substrate 100 and receiver substrate 200 can be re-aligned and steps can be repeated in order to transfer a different set of micro devices 102 and to contact pads 222. Additional layers can also be deposited on top of or in between micro devices 102, for example, during the manufacture of a LED display, transparent electrode layers, fillers, planarization layers and other optical layers can be deposited.

Electrostatic Force Modulation

In another embodiment of selective transfer, FR is generated by an electrostatic force or magnetic force. In case of magnetic force a current passes through a conductive layer instead of charging a conductive layer for electrostatic force. Although the structures here are used to describe the electrostatic force similar structures can be used for magnetic force. Here, the FR is modulated by application of selective electrostatic forces between the landing area on the receiver substrate and the micro device. This method can be used in combination with weakening the donor force selectively or globally and is compatible with any of the methods 1000A, 1000B, and 1000C or any combination of them. Although, the following description is based on 1000A similar approaches can be used for 1000B, 1000C and the combination of the methods. In addition, the order of donor force weakening step 1410 can be changed in reference to other steps without affecting the results.

In another embodiment of selective transfer, FR is generated by an electrostatic force. Here, the FR is modulated by application of selective electrostatic forces between the landing area on the receiver substrate and the micro device. This method can be used in combination with weakening the donor force selectively or globally and is compatible with any of the methods 1000A, 1000B, and 1000C or any combination of them. Although, the following description is based on 1000A similar approaches can be used for 1000B, 1000C and the combination of the methods. In addition, the order of donor force weakening step 1410 can be changed in reference to other steps without affecting the results.

Figure 12B:
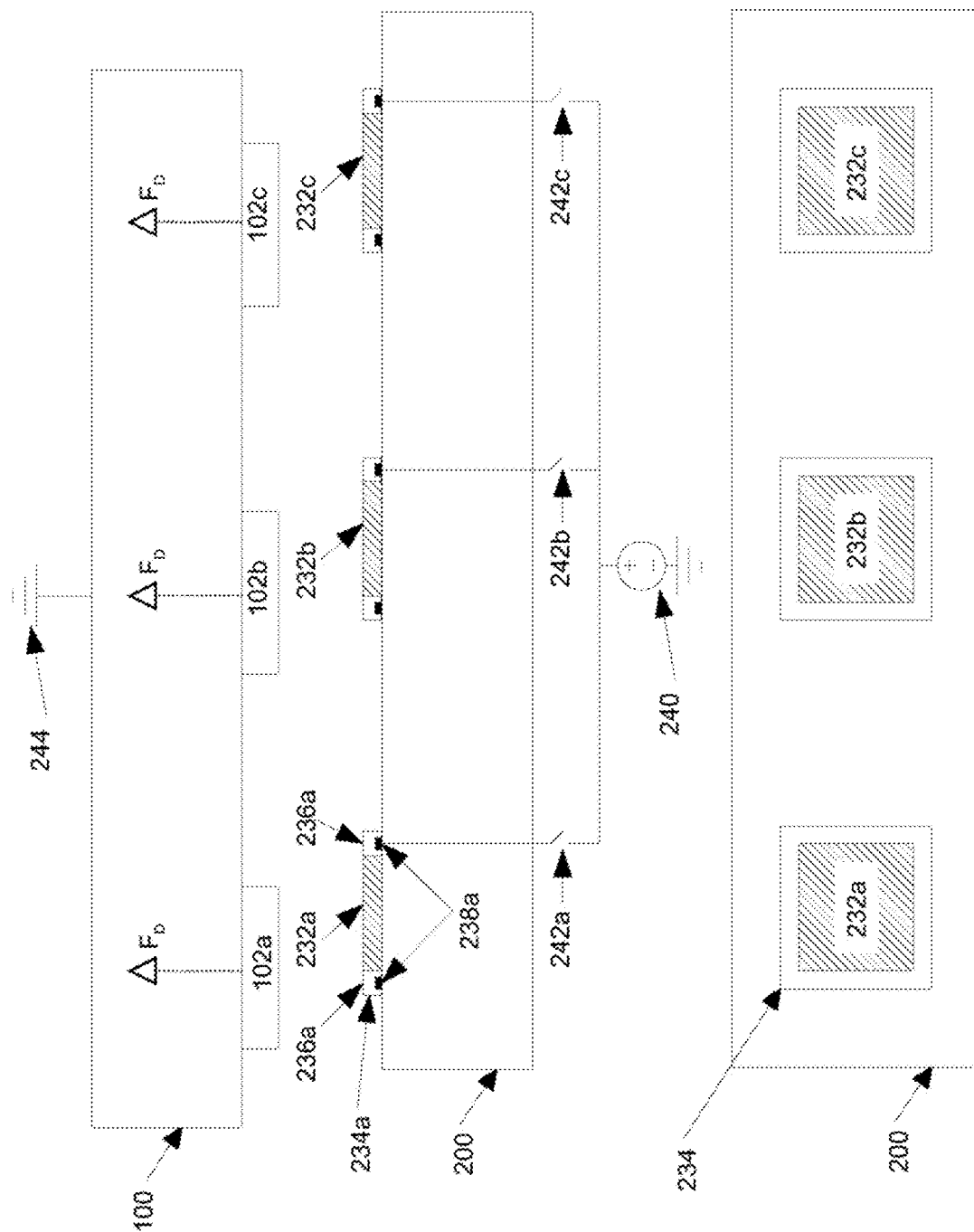
FIG. 12B shows a donor substrate and a receiver substrate setup to perform method 1300.

FIG. 12A shows a flowchart of method 1300, a modified version of method 1000 suitable for electrostatic generation of FR. FIG. 12B shows a donor substrate 100 and a receiver substrate 200 setup to perform method 1300. Donor substrate 100 is shown in cross section and receiver substrate 200 is shown in cross section and in plan view. Donor substrate 100 has an array of micro devices 102 attached. Donor force FD acts to hold micro devices 102 to donor substrate 100. Micro devices 102 and donor substrate 100 are shown as connected to ground 244.

The landing area on the receiver substrate 200 has at least a contact pad 232 attached and a force modulation element 234.

Contact pads 232 are surrounded by a ring of conductor/dielectric bi-layer composite, hereinafter called an electrostatic layer 234. The shape and location of force modulation element 234 can be changed in the landing area and in relation to the contact pad. Electrostatic layer 234 has a dielectric portion 236 and a conductive portion 238. Dielectric portion 236 comprises a material selected, in part, for its dielectric properties, including dielectric constant, dielectric leakage and breakdown voltage. The dielectric portion can also be part of the micro device or a combination of the receiver substrate and the micro device. Suitable materials may include SiN, SiON, SiO, HfO and various polymers. Conductive portion 238 is selected, in part, for its conductive properties. There are many suitable single metals, bi-layers and tri-layers that can be suitable including Ag, Au and Ti/Au. Each conductive portion 238 is coupled to a voltage source 240, via a switch 242. Note that although conductive portions 238 are shown as connected in parallel to a single voltage source 240 via simple switches 242, this is to be understood as an illustrative example. Conductive portions 238 might be connected to one voltage source 240 in parallel. Different subsets of conductive portions 238 may be connected to different voltage sources. Simple switches 242 can be replaced with more complex arrangements. The desired functionality is the ability to selectively connect a voltage source 240, having a potential different than that of the micro devices 102, to selected conductive portions 238 when needed to cause an electrostatic attraction between the selected conductive portions 238 and corresponding selected micro devices 102.

Figure 13A:
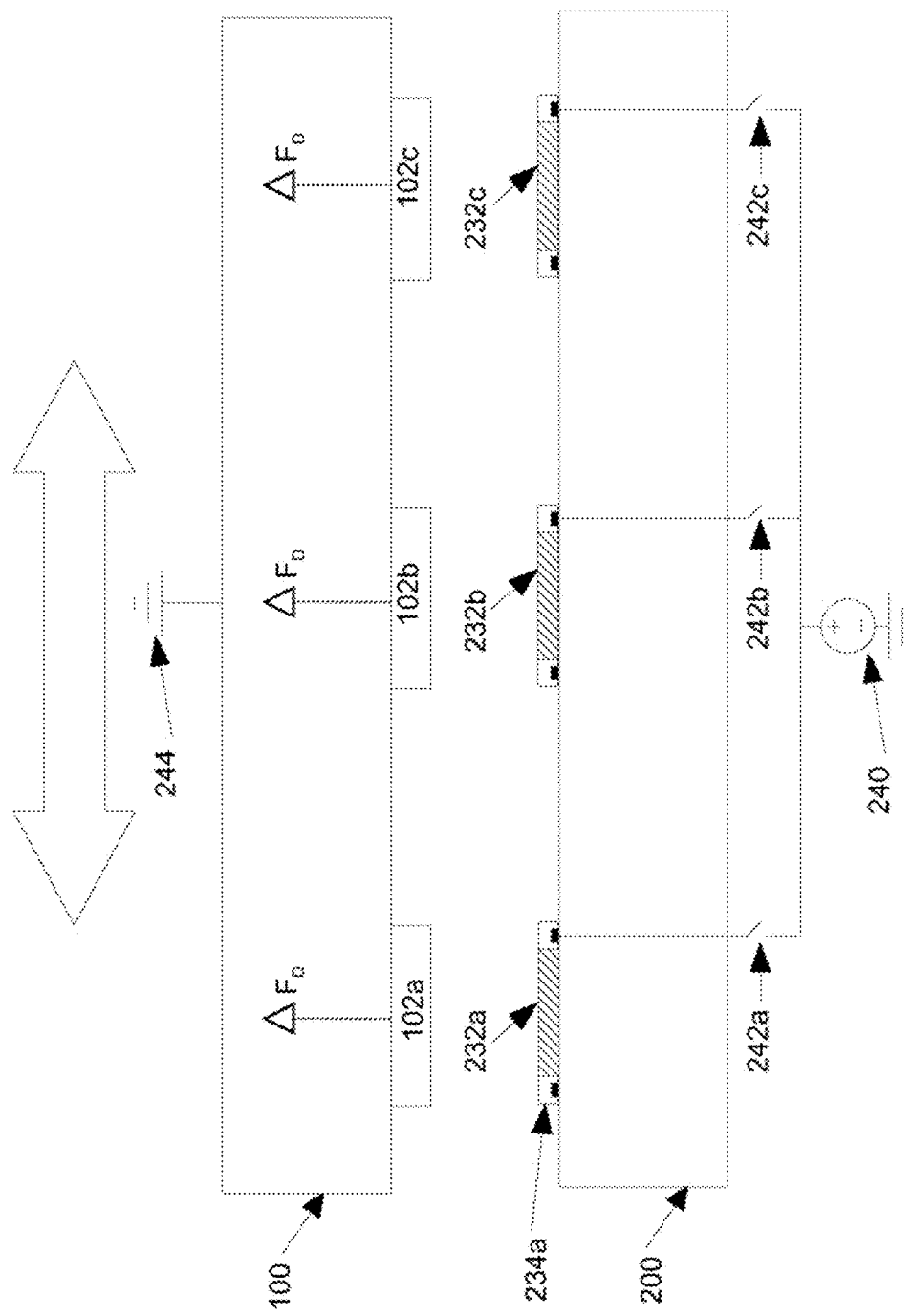
FIG. 13A shows the step of aligning the donor and receiver substrates.

Method 1300 will be explained in conjunction with FIGS. 13A-13E. At 1302, donor substrate 100 and receiver substrate are aligned so that selected micro devices 102a, 102b are in line with corresponding contact pads 232a, 232b, as shown in FIG. 13A.

At 1304, donor substrate 100 and receiver substrate 200 are moved together until the micro devices 102 come into contact with contact pads 232, as shown is FIG. 13B.

Figure 13C:
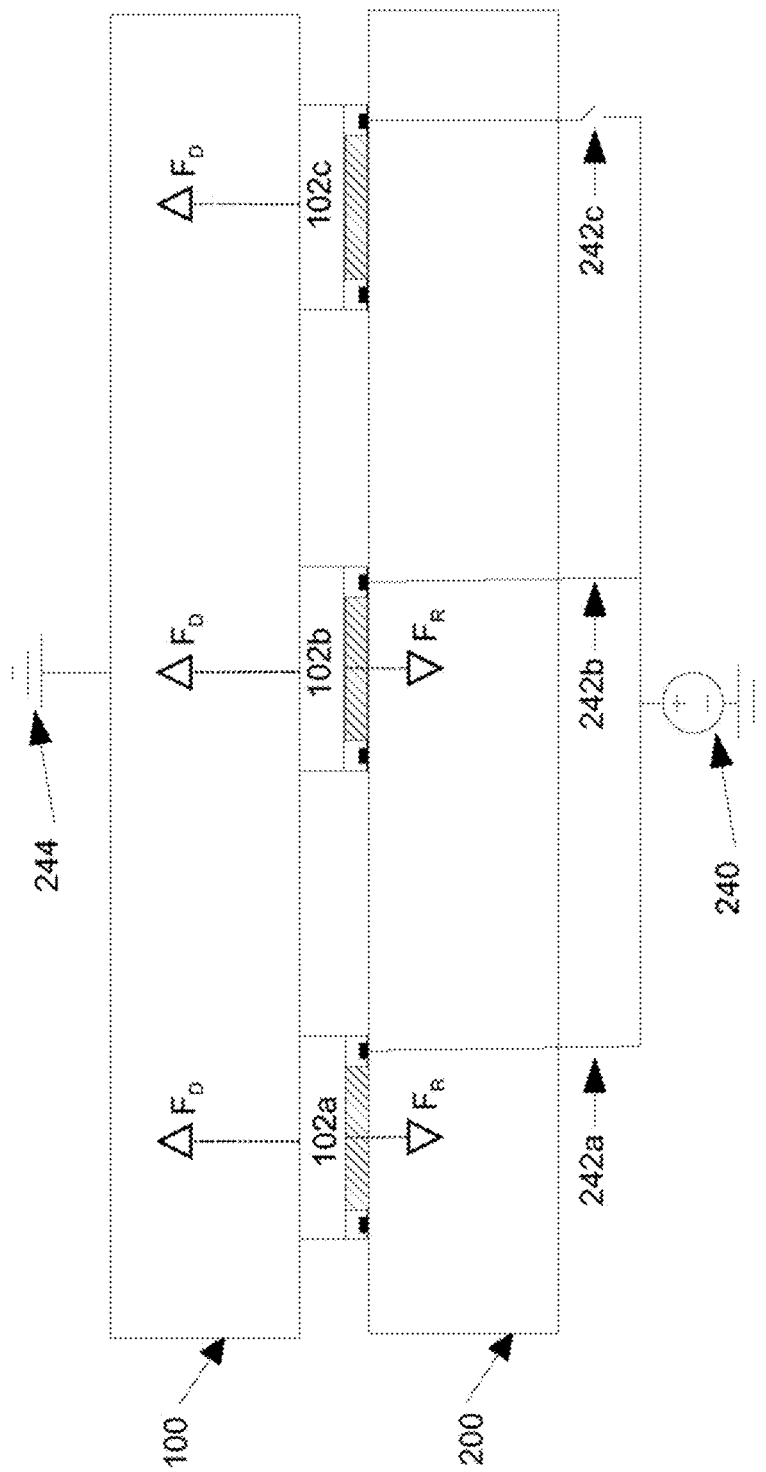
FIG. 13C shows the step of creating receiver force by applying potential to electrostatic elements. This can be done selectively or globally.

At 1306, a receiver force, FR, is generated, as shown in FIG. 13C. FR is generated by closing switches 242a, 242b that connect conductive portions 238 of electrostatic layers 234 to voltage source 240 creating charged conductive portions 238 at the potential of voltage source 240. Selected micro devices 102a, 102b, being at a different potential, e.g. ground potential (or other relative potential), will be electrostatically attracted to conductive portions 238. The electrostatic charge can be generated by different potential levels. For example, for a 300 nm dielectric, to get a proper grip on a micro device, a voltage difference between 20V to 50V may need to be applied to the electrostatic force element. However, this voltage can be modified depending on the device, gap size, and the dielectric constant.

Figure 13D:
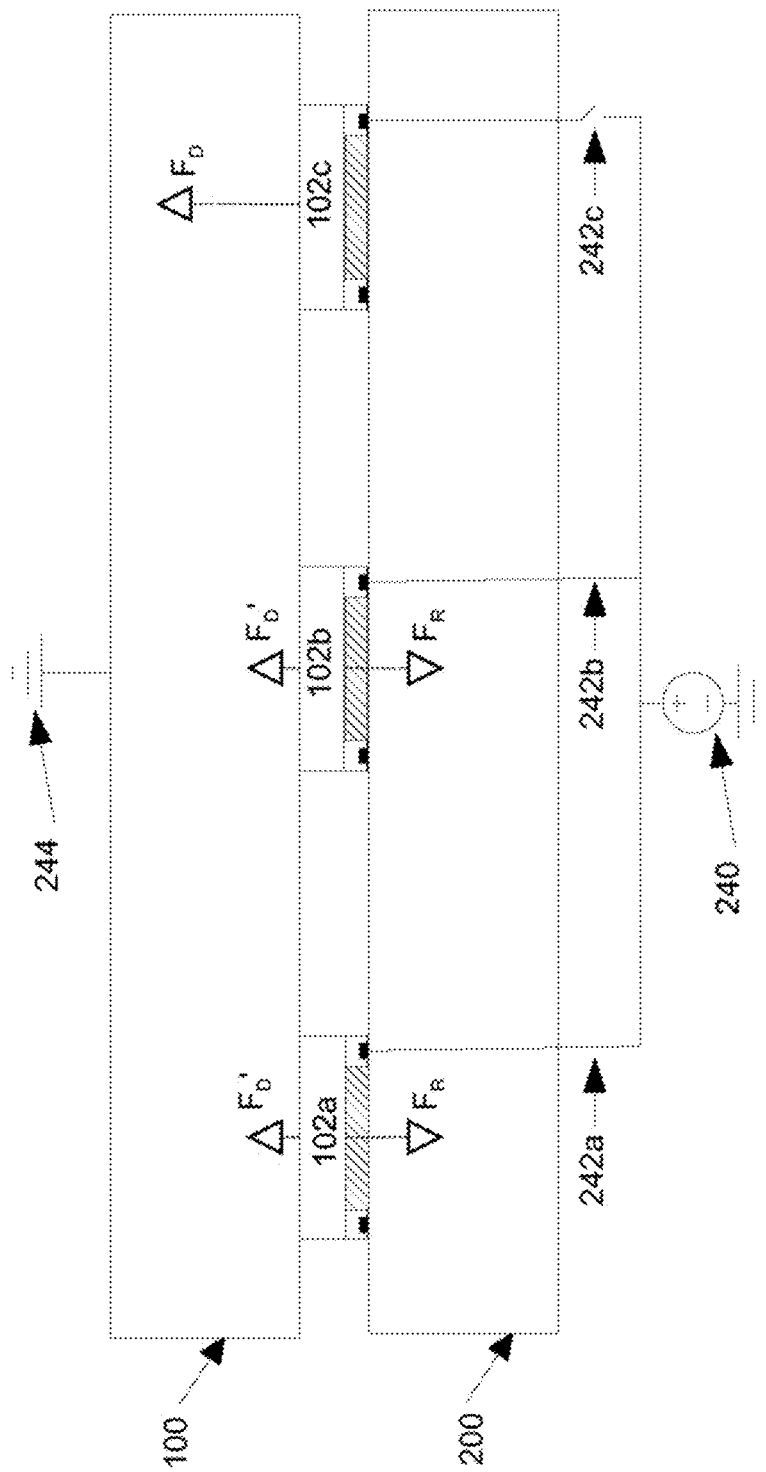
FIG. 13D shows the step of reducing the donor force if needed. This can be done globally or selectively.

At 1308, donor force FD is selectively weakened for selected micro devices 102a, 102b, so that FD' is less than FR, as shown in FIG. 13D. This may be done, for example, using laser lift off techniques, lapping or wet/dry etching.

Figure 13E:
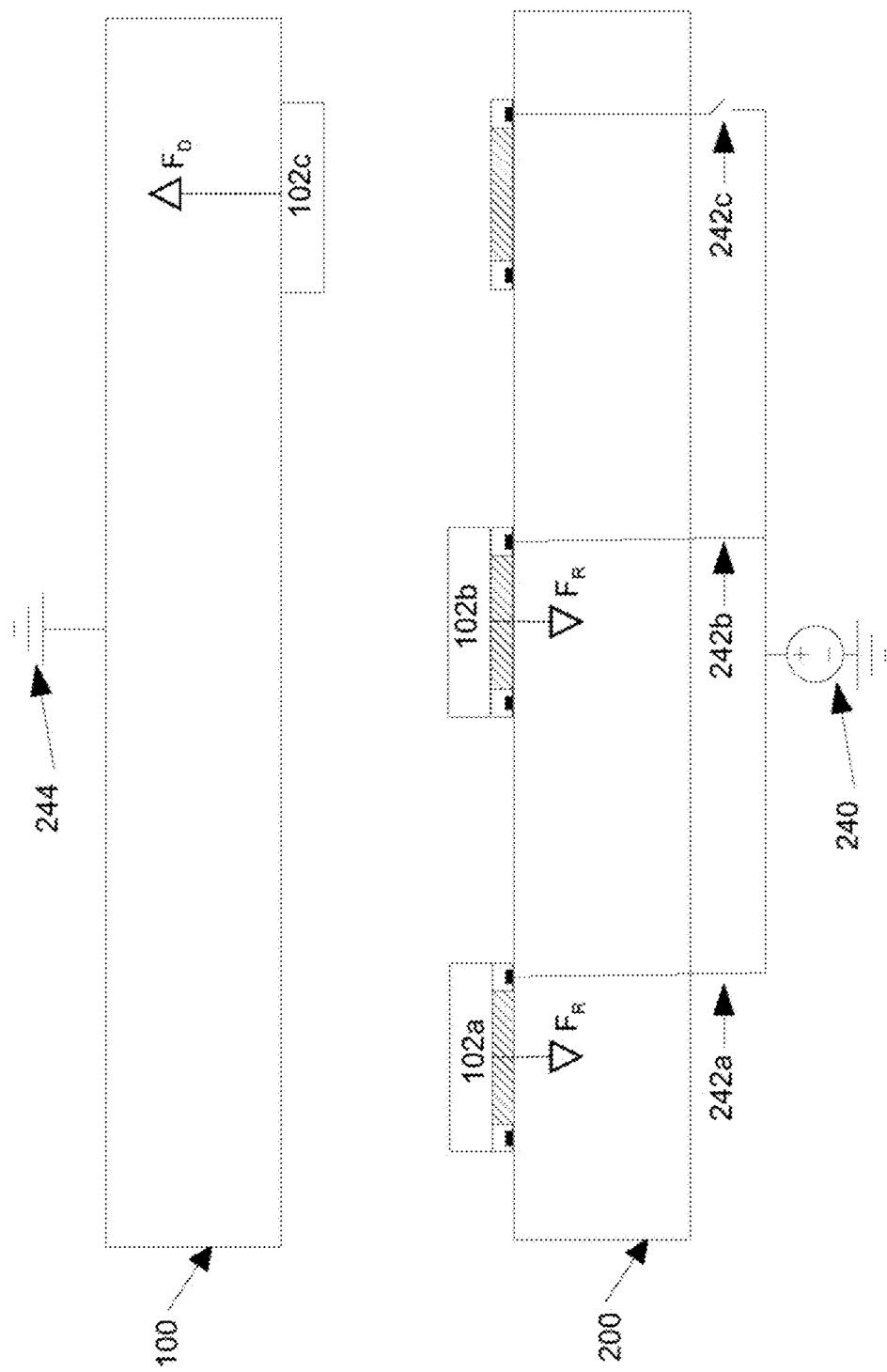
FIG. 13E shows the step of moving the substrates away.

At 1310, donor substrate 100 and receiver substrate 200 are moved apart, leaving selected micro devices 102a, 102b attached to corresponding contact pads 232a, 232b, as shown in FIG. 13E. Once donor substrate 100 is separated from receiver substrate 200, further processing steps can be taken and the ground 244 may be removed. For example, donor substrate 100 and receiver substrate 200 can be re-aligned and steps can be repeated in order to transfer a different set of micro devices 102 and to contact pads 232. Additional layers can also be deposited on top of or in between micro devices 102, for example, during the manufacture of a LED display, transparent electrode layers, fillers, planarization layers and other optical layers can be deposited. It should be noted that FR will cease to operate if the connection to voltage source 240 is removed. Accordingly, further processing steps to create a permanent bond between micro devices 102 and contact pads 232 are desirable. Curing contact pads 232, as described above, is a suitable further processing step that will create such a bond and enable further working or transporting receiver substrate 200.

In other embodiments, electrostatic layer 234 can take on other configurations. FIG. 14 shows some alternative placements for electrostatic layer 234. Possible alternative placements of electrostatic layer 234 relative to each contact pad 232 include: (A) four corners, (B) opposite sides, (C) center and (D) one side. Those of skill in the art will now be able to design a configuration suitable to particular applications.

Figure 15A:
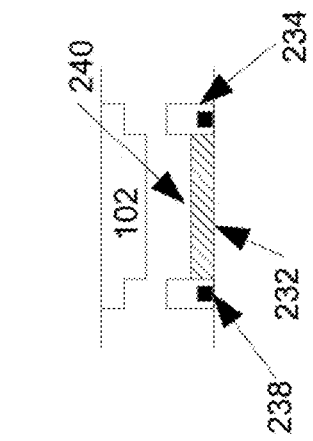
FIG. 15A shows another alternative geometrie for micro devices and contact pads.
Figure 15B:
FIG. 15B shows another alternative geometrie for micro devices and contact pads.

In other embodiments, the geometry of contact pads 232, electrostatic layer 234 and micro devices 102 can be changed to varying effect. FIG. 15 illustrates some possible alternative geometries. FIG. 15A shows an embodiment where electrostatic layer 234 extends above the top of contact pad 232 to form a hollow 240 and micro device 102 has a mesa 242 that will fit within hollow 240. FIG. 15B shows an embodiment where electrostatic layer 234 extends above the top of contact pad 232 to form a hollow 240 and micro device 102 has an extension 244 attached to it that will fit within hollow 240. Extension 240 may be made of the same material as contact pad 232 so that later curing will fuse extension 244 and contact pad 232. Sloping geometries, as shown in FIG. 15E, are also possible. Geometries with mesa 242 or extension 244 can help guide micro devices 102 into contact pads 232 and insure a proper fit and prevent tilting of micro devices 102 when detaching from donor substrate 100. Preferably, the geometry of micro devices 102 and contact pads 232 are chosen to match so as to maximize the electrostatic force.

Figure 15C:
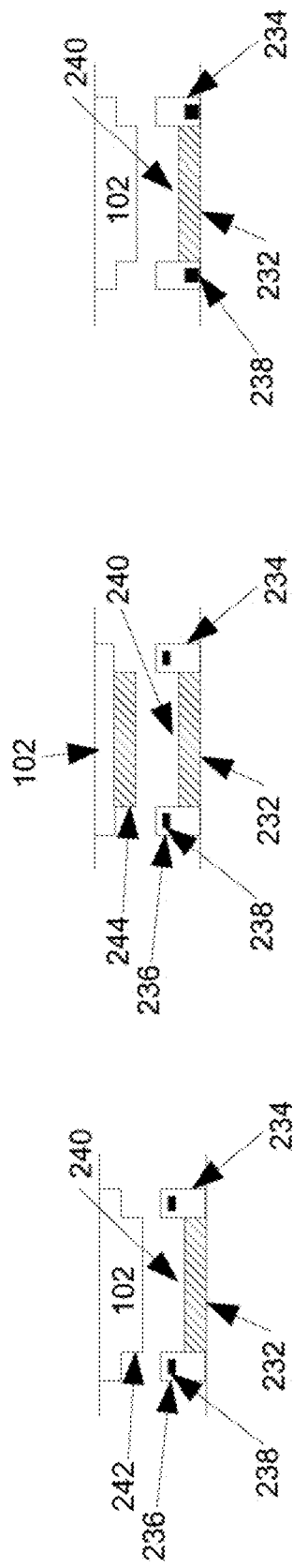
FIG. 15C shows another alternative geometrie for micro devices and contact pads.
Figure 15D:
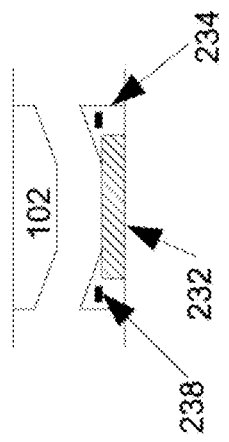
FIG. 15D shows another alternative geometrie for micro devices and contact pads.
Figure 15E:
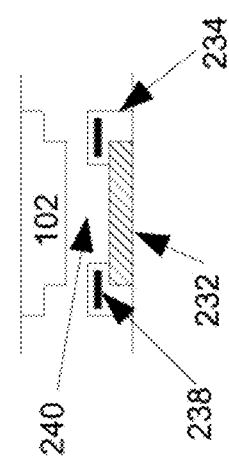
FIG. 15E shows another alternative geometrie for micro devices and contact pads.

FIG. 15C shows an embodiment where electrostatic layer 234 forms a hollow 240, but conductive portion 238 remains in the same plane as contact pad 232. FIG. 15D shows an embodiment where electrostatic layer 234 forms a hollow 240, but also overlaps with contact pad 232 and conductive portion 238 is in a different plane than contact pad 232, allowing the fine tuning of the electrostatic force.

Transfer of Micro Devices of Different Heights

In another embodiment of selective transfer, the force on the donor substrate is modulated to push the device toward the receiver substrate. In one example, after removing the donor force other forces such as electrostatic forces can be used to push the device toward the receiver substrate. In another case, a sacrificial layer can be used to create a push force in presence of heat or light sources. To selectively create the push force, a shadow mask can be used for applying a light source (e.g. laser) to the selected micro devices. In addition, the FR can be generated by one of aforementioned methods (e.g., mechanical, heating, adhesive, electrostatic). For example, the FR can be modulated by application of selective electrostatic forces between landing area on the receiver substrate and the micro device. This method is compatible with any of the methods 1000A, 1000B, and 1000C or any combination of them. Although, the following description is based on 1000A, similar approaches can be used for 1000B, 1000C and the combination of the methods. In addition, the order of donor force modulation step 1410 can be changed in reference to other steps without affecting the results. However, the most reliable results can be achieved by applying the FR first and then applying the push force to the micro device.

Figure 16:
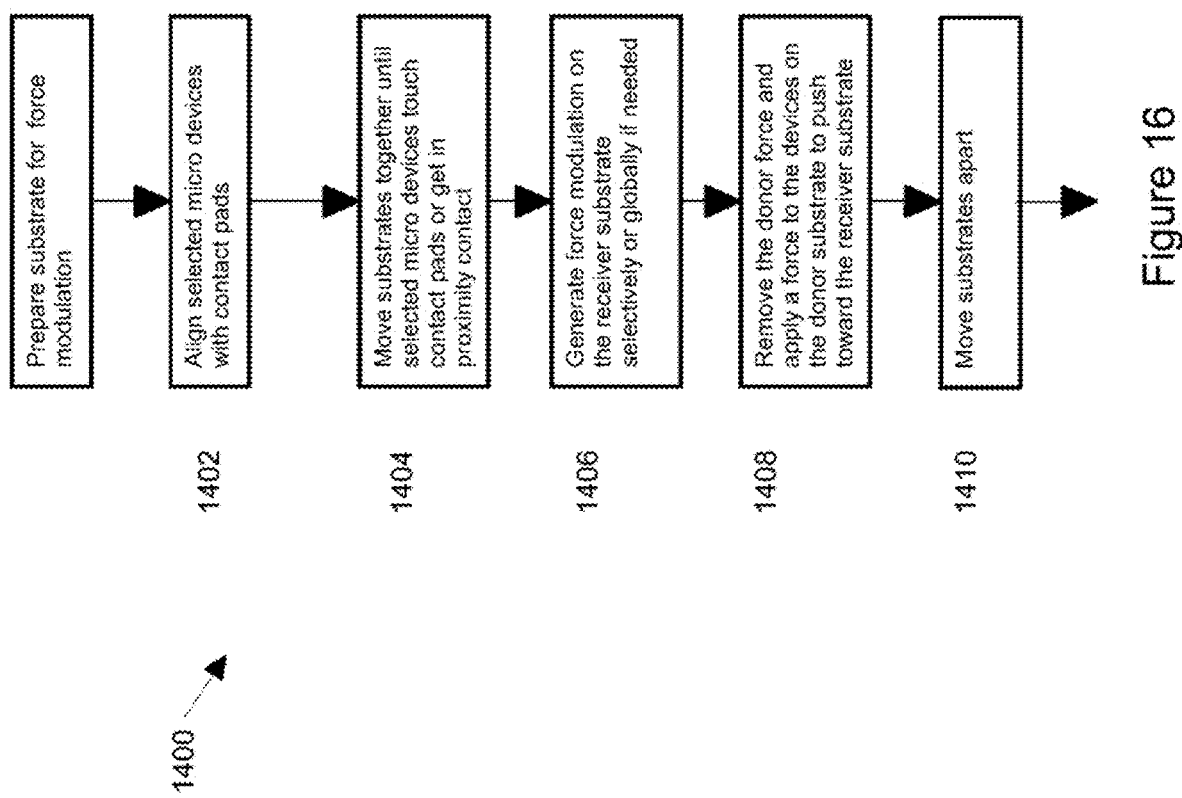
FIG. 16 shows a flowchart of method 1400 for selectively transferring micro devices from a donor substrate to a receiver substrate.
Figure 17A:
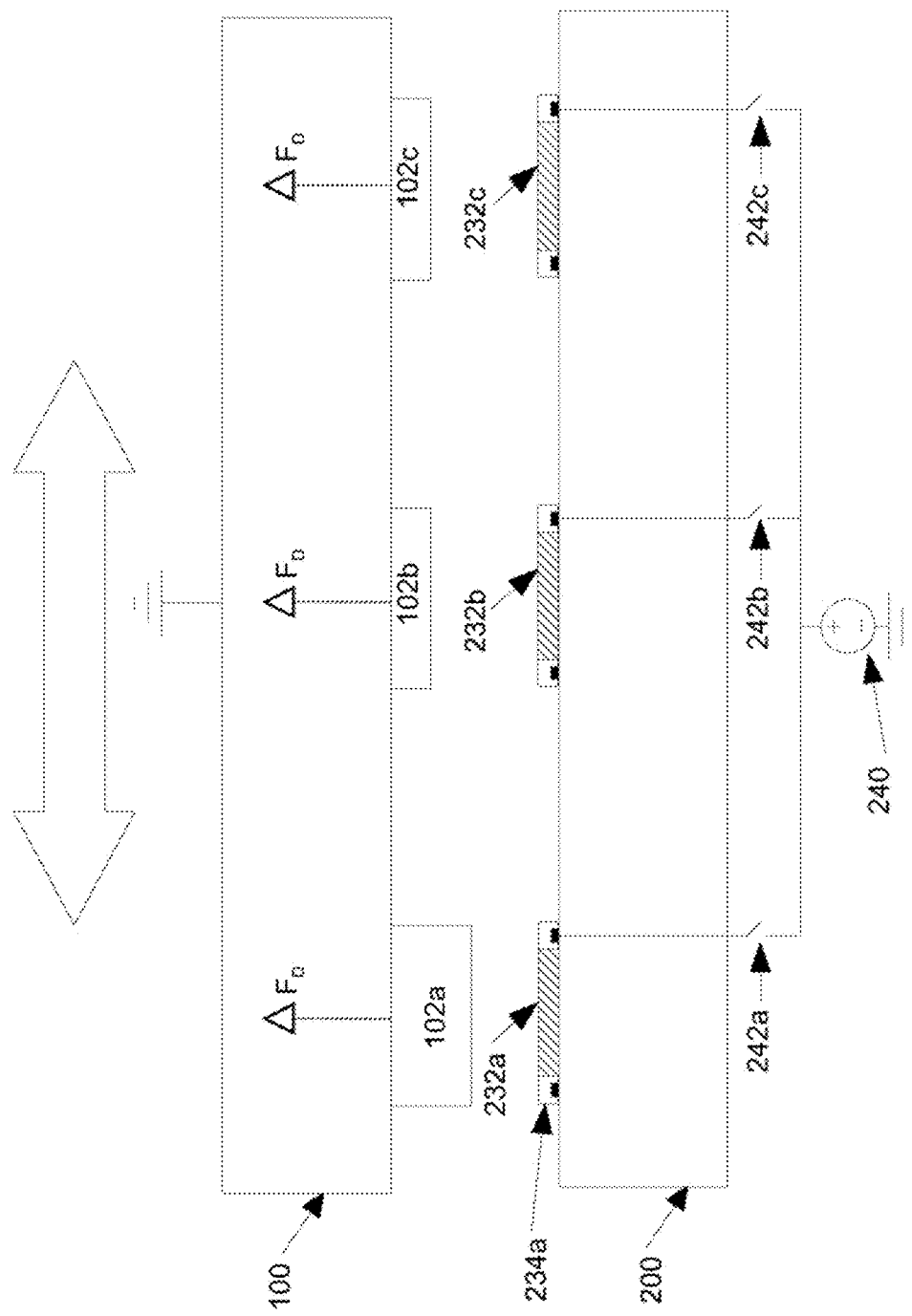
FIG. 17A shows the step of aligning the donor and receiver substrates.

FIG. 16 shows a flowchart of method 1400 based on electrostatic FR. However, other FR forces can be applied as well. Method 1400 is a modified version of method 1300 and is particularly suited to simultaneous transfer of micro devices 102 of different heights. At 1402, donor substrate 100 and receiver substrate are aligned so that selected micro devices 102a, 102b are in line with corresponding contact pads 232a, 232b, as shown in FIG. 17A. Note that micro device 102a is of a different height than micro device 102b.

Figure 17B:
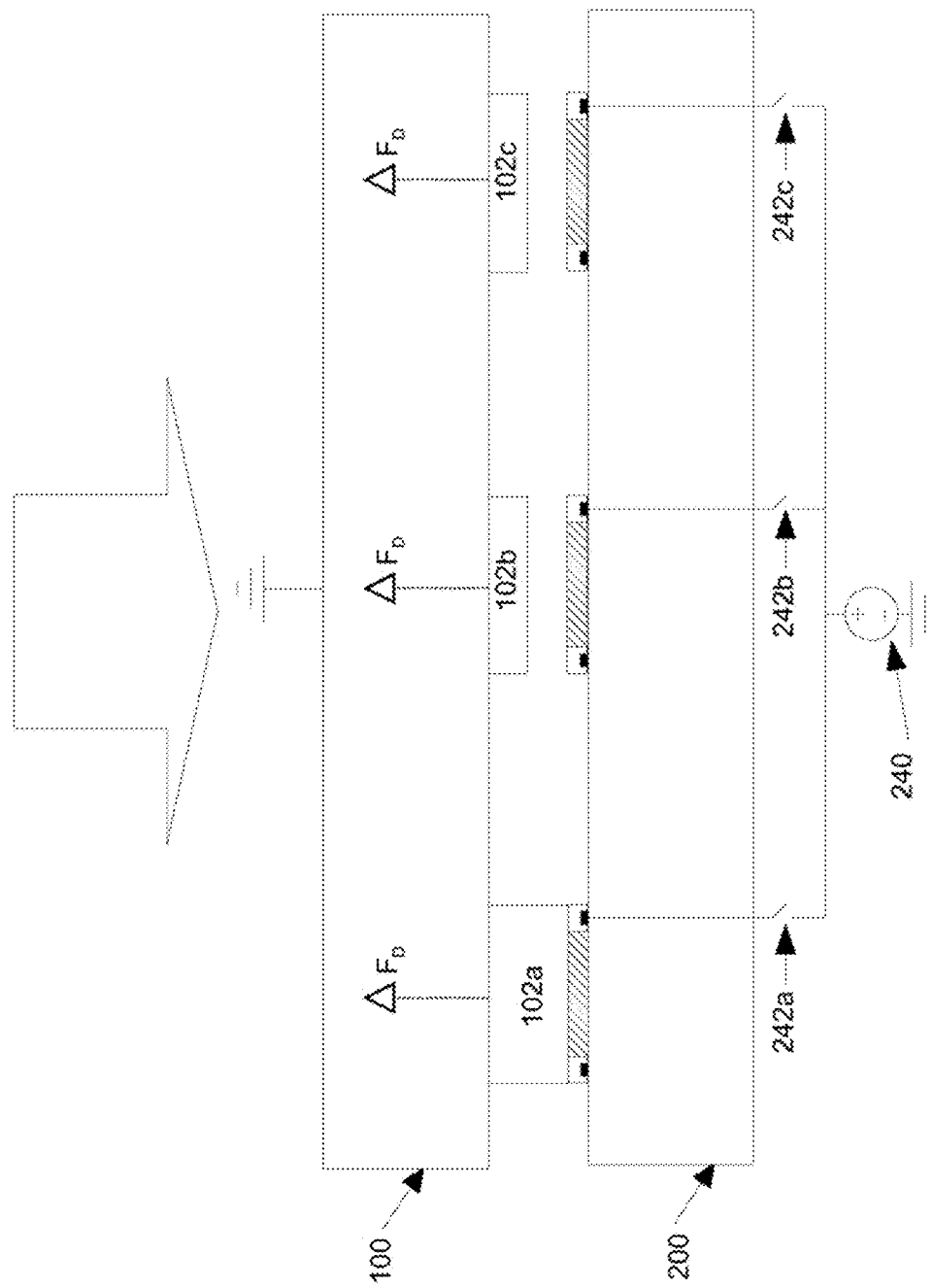
FIG. 17B shows the step of moving the substrates to a predefined distance margin from each other.

At 1404, donor substrate 100 and receiver substrate 200 are moved together until the micro devices 102 are close enough for electrostatic FR to act on micro devices 102. Donor substrate 100 and receiver substrate 200 may be held so that no micro devices 102 make contact with contact pads 232 or, as shown in FIG. 17B, substrates 100, 200 may stop approaching when some micro devices 102 make contact with contact pads 232.

Figure 17C:
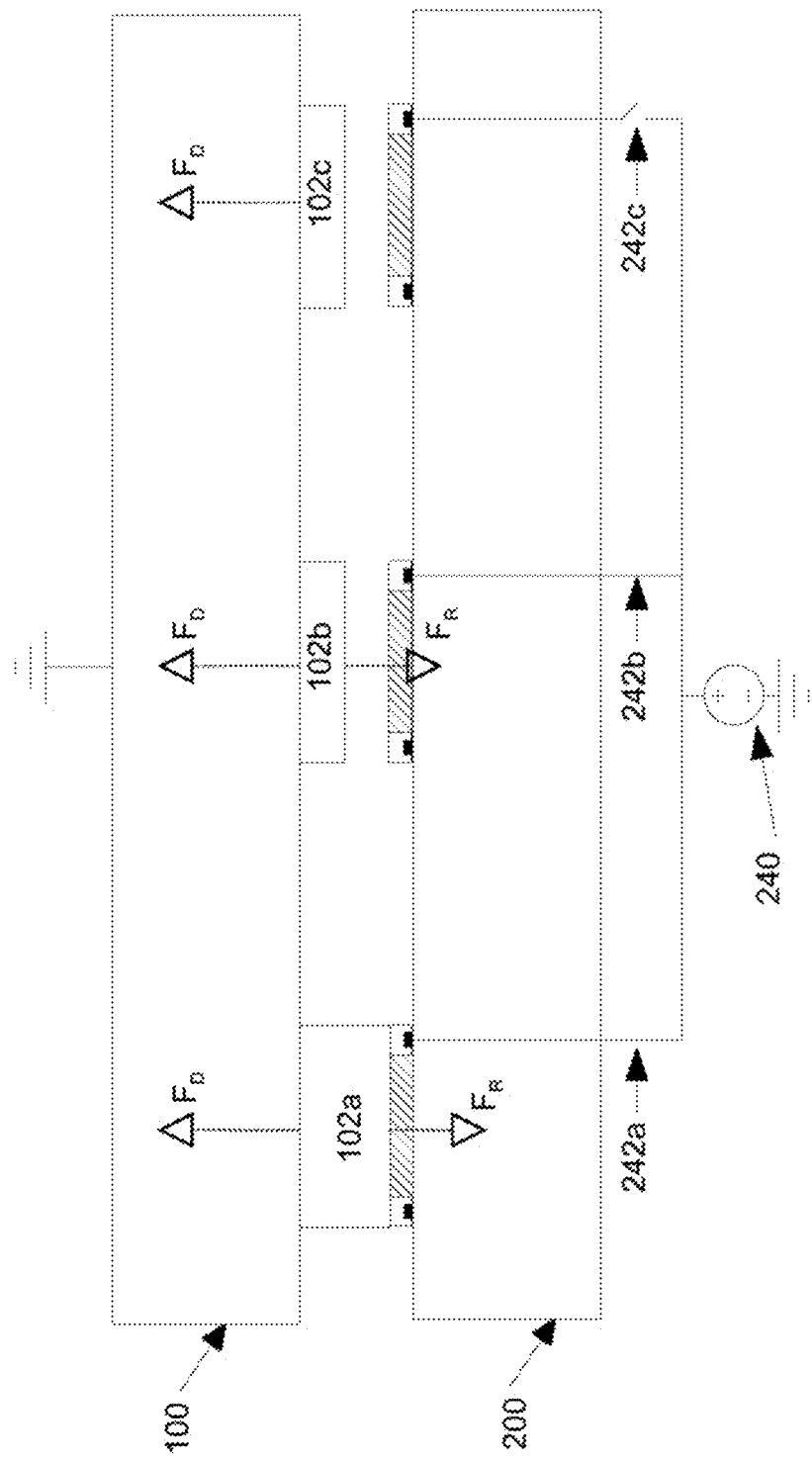
FIG. 17C shows one embodiment for the step of creating a receiver force if needed. This can be globally or selectively. The force can be created with different method.
Figure 17D:
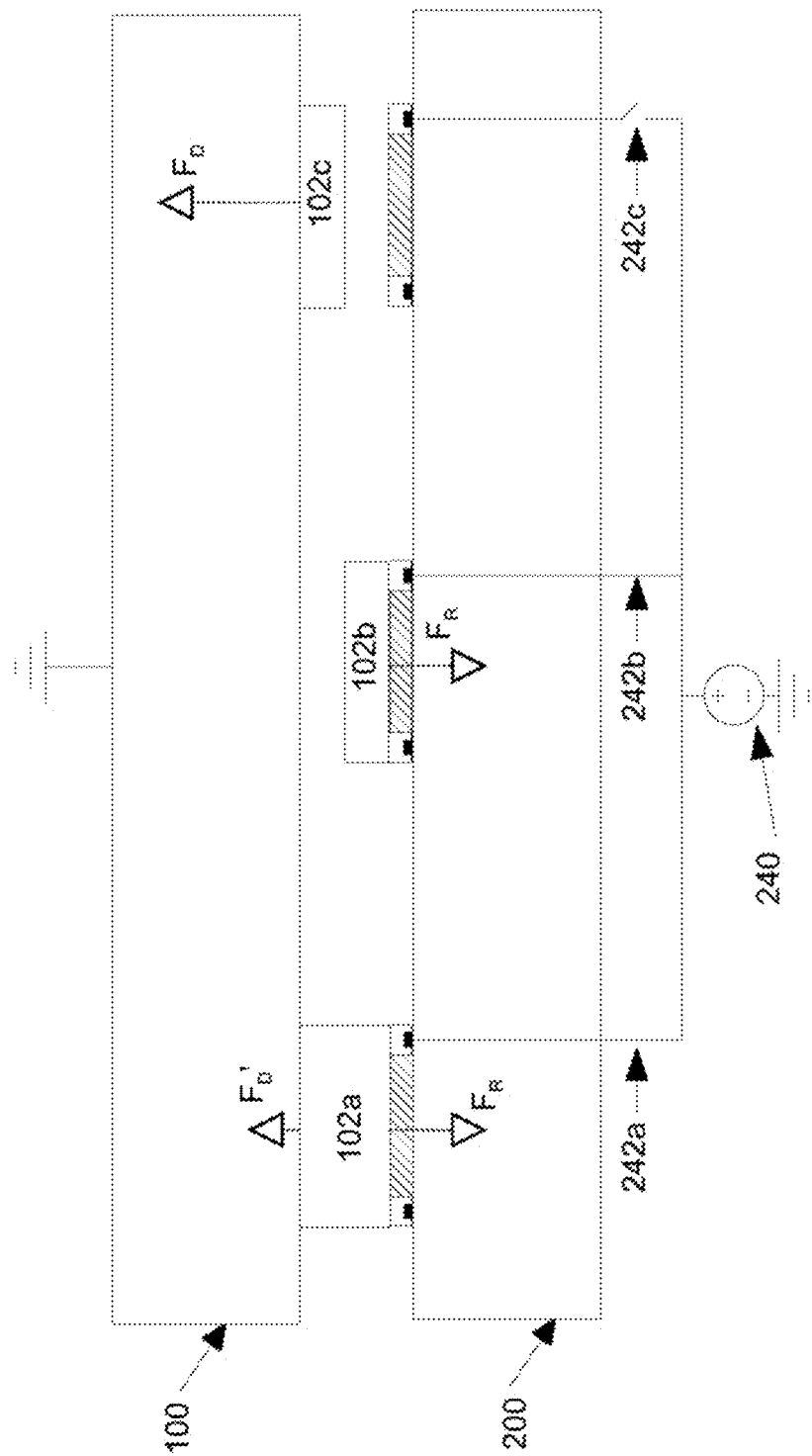
FIG. 17D shows applying a push force to the micro devices from the donor substrate. The push force from donor substrate should be selective.

At 1406, a receiver force, FR, is generated, as shown in FIG. 17C. FR is generated by closing switches 242a, 242b that connect conductive portions 238 of electrostatic layers 234 to voltage source 240 creating charged conductive portions 238 at the potential of voltage source 240. Selected micro devices 102a, 102b, being at a different potential, e.g. ground potential, will be electrostatically attracted to conductive portions 238.

At 1408, donor force FD is selectively weakened for selected micro devices 102a, 102b, so that FD' is less than FR. This may be done, for example, using laser lift off techniques, lapping or wet/dry etching. At this point, micro devices 102a, 102b will detach from donor substrate 100. Micro device 102b will jump the gap to their corresponding contact pads 232a, 232b on receiver substrate 200.

Figure 17E:
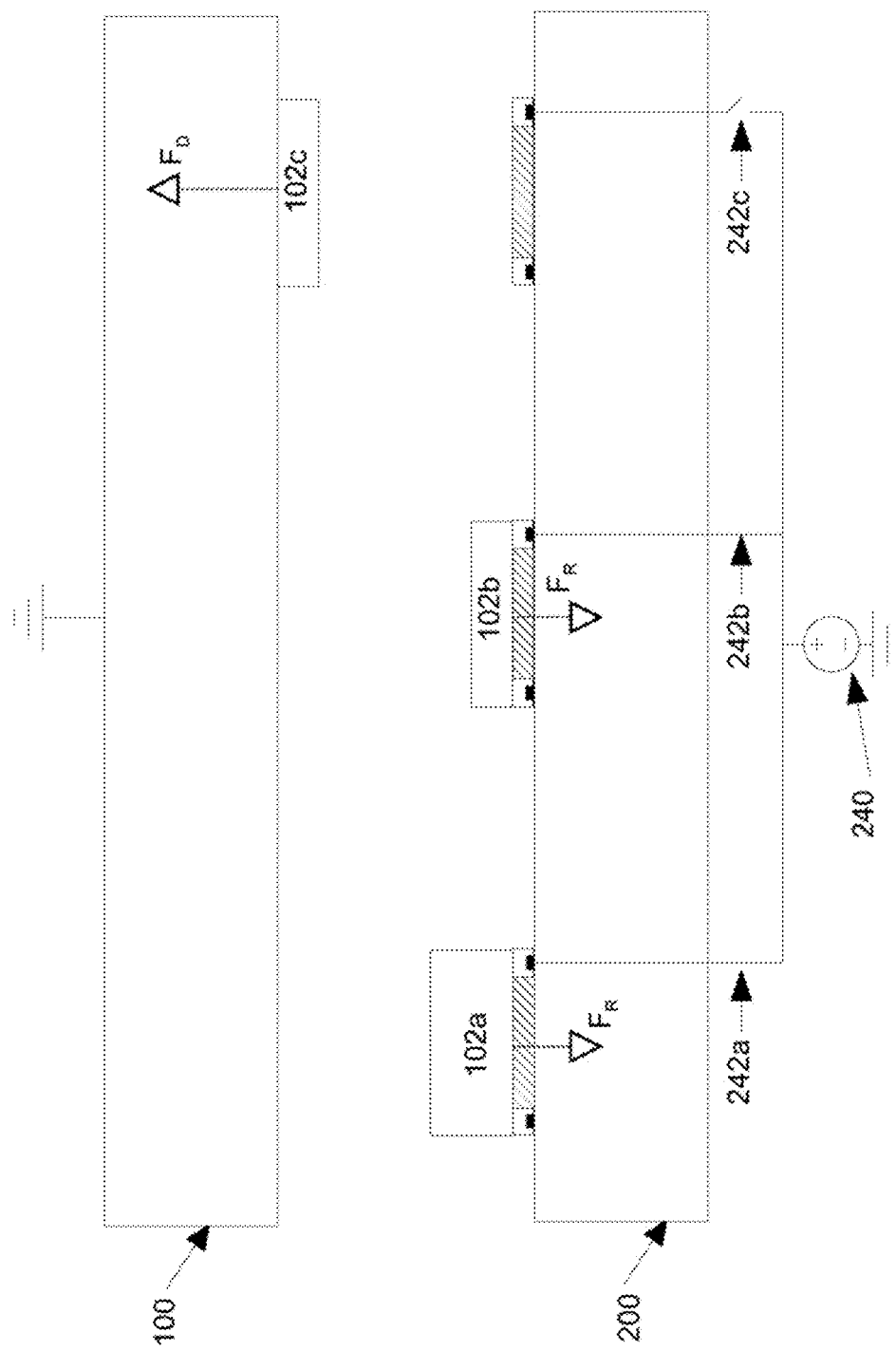
FIG. 17E shows the step of moving substrate away.

At 1410, donor substrate 100 and receiver substrate 200 are moved apart, leaving selected micro devices 102a, 102b attached to corresponding contact pads 232a, 232b, as shown in FIG. 17E. Once donor substrate 100 is separated from receiver substrate 200, further processing steps can be taken. For example, donor substrate 100 and receiver substrate 200 can be re-aligned and steps can be repeated in order to transfer a different set of micro devices 102 and to contact pads 232. Additional layers can also be deposited on top of or in between micro devices 102, for example, during the manufacture of a LED display, transparent electrode layers, fillers, planarization layers and other optical layers can be deposited. It should be noted that FR will cease to operate if the connection to voltage source 240 is removed. Accordingly, further processing steps to create a permanent bond between micro devices 102 and contact pads 232 are desirable. Curing contact pads 232, as described above, is a suitable further processing step that will create such a bond and enable further working or transporting receiver substrate 200.

One application of this method is development of displays based on micro-LED devices. An LED display consists of RGB (or other pixel patterning) pixels made of individual color LEDs (such as red, green or blue or any other color). The LEDs are manufactured separately and then transferred to a backplane. The backplane circuit actively or passively drives these LEDs. In the Active form each sub-pixel is driven by a transistor circuit by either controlling the current, the ON time, or both. In the Passive form, each sub-pixel can be addressed by selecting the respective row and column and is driven by an external driving force.

The LEDs conventionally are manufactured in the form of single color LEDs on a wafer and patterned to individual micro-devices by different process such as etching. As the pitch of the LEDs on their substrate is different from their pitch on a display, a method is required to selectively transfer them from their substrate to the backplane. The LEDs' pitch on their substrate is the minimum possible to increase the LED manufacturing yield on a wafer, while the LED pitch on the backplane is dictated by the display size and resolution. According to methods implemented here, one can modulate the force between the LED substrate and the micro-LEDs and uses any of the technique presented here to increase the force between selected LED and backplane substrate. In one case, the force for LED wafer is modulated first. In this case, the force between LED devices and substrate is reduced either by laser, backplane etching, or other methods. The process can selectively weaken the connection force between selected LEDs for transfer and the LED substrate or it can be applied to all the devices to reduce the connection force of all the LED devices to the LED substrate. In one embodiment, this is accomplished by transferring all LEDs from their native substrate to a temporary substrate. Here, the temporary substrate is attached to the LEDs from the top side, and then the first substrate is removed either by polishing and/or etching or laser lift off. The force between the temporary substrate and the LED devices is weaker than the force that the system substrate can selectively apply to the LEDs. To achieve that a buffer layer may be deposited on the temporary substrate first. This buffer layer can be a polyamide layer. If the buffer layer is not conductive, to enable testing the devices after transfer to the temporary and system substrate, an electrode before or after the buffer layer will be deposited and patterned. If the electrode is deposited before the buffer layer, the buffer layer maybe patterned to create an opening for contact.

In another method, the LED connection-force modulation happens after the LED substrate and the backplane substrate are in contact and the system substrate forces to LED are selectively modulated by the aforementioned methods presented here. The LED substrate force modulation can be done prior to the backplane substrate force modulation as well.

As the force holding the LEDs to the backplane substrate after transfer is temporary in most of the aforementioned methods, a post processing step may be needed to increase the connection reliability to the backplane substrate. In one embodiment, high temperature (and/or pressure can be used). Here, a flat surface is used to apply pressure to the LEDs while the temperature is increased. The pressure increases gradually to avoid cracking or dislocation of the LED devices. In addition, the selective force of the backplane substrate can stay active during this process to assist the bonding.

In one case, the two connections required for the LED are on the transfer side and the LED is in full contact with the backplane after the transfer process. In another case, a top electrode will be deposited and patterned if needed. In one case, a polarization layer can be used before depositing the electrode. For example a layer of polyamide can be coated on the backplane substrate. After the deposition, the layer can be patterned to create an opening for connecting the top electrode layer to system substrate contacts. The contacts can be separated for each LED or shared. In addition, optical enhancement layers can be deposited as well before or after top electrode deposition.

Testing Process

Identifying defective micro devices and also characterizing the micro devices after being transferred is an essential part of developing a high yield system since it can enable the use of repair and compensation techniques.

Figure 18A:
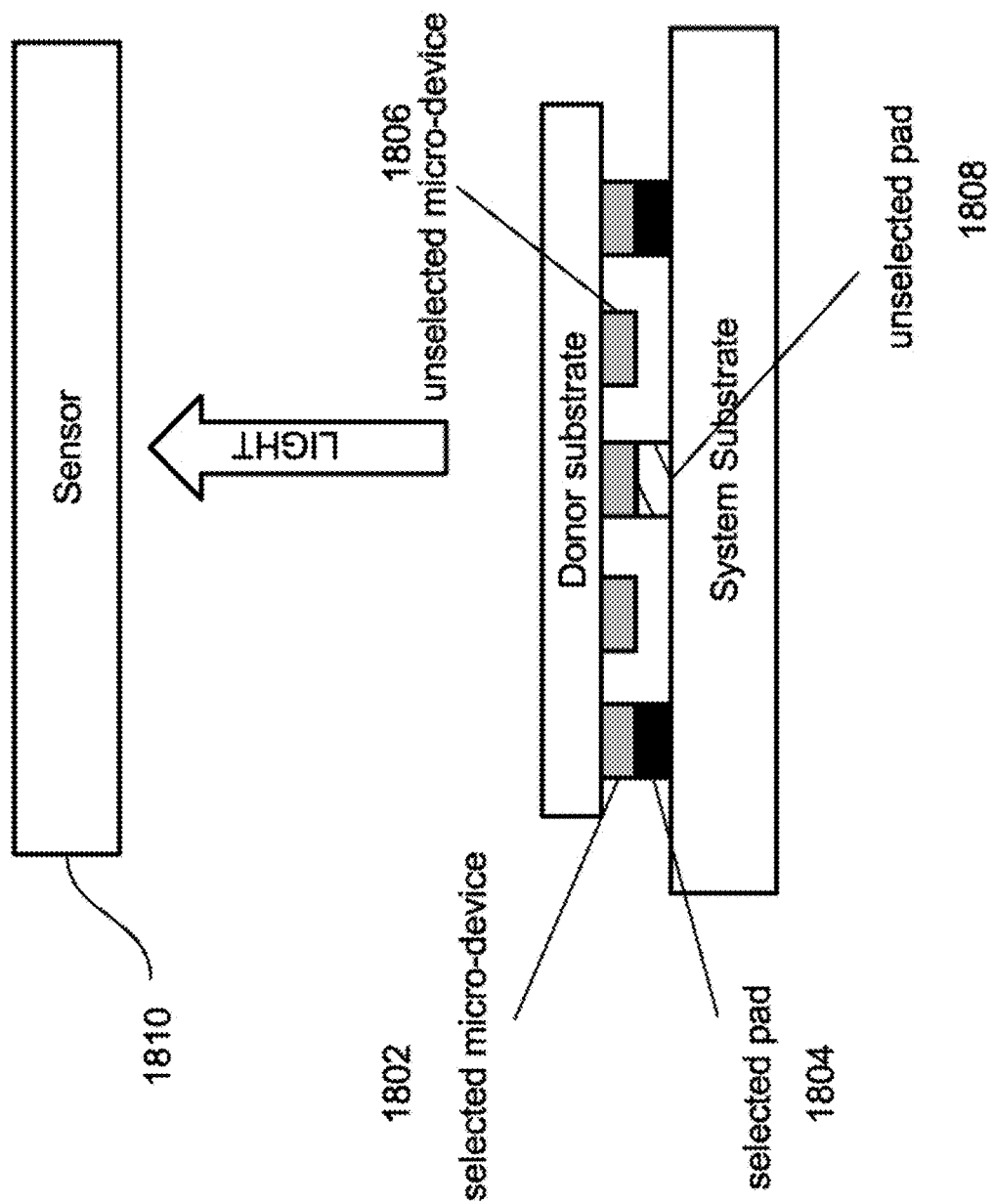
FIG. 18A shows a platform for testing by biasing at least one of the donor substrate or the receiver substrate to enable testing the micro devices for defects and performance. Here, the output of the micro device is through the receiver substrate.
Figure 19:
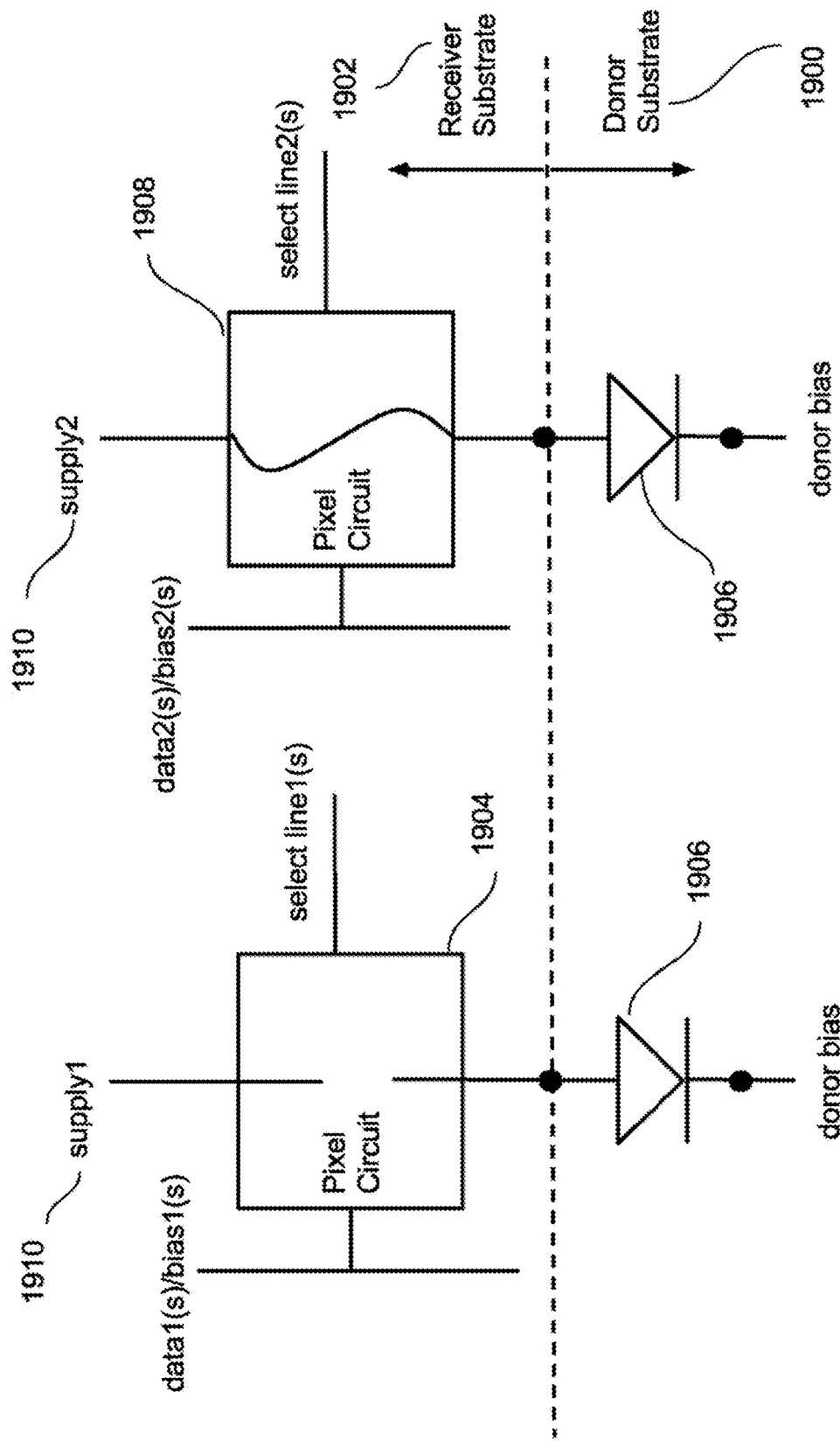
FIG. 19 shows a simplified biasing condition of receiver substrate for testing the micro devices for defect and performance analysis.

In one embodiment shown in FIG. 18, the receiver substrate is put in test mode during a transfer process. If needed, the donor substrate may be biased for test mode. If the micro device is an optoelectronic device, a sensor 1810 (or sensor array) is used to extract the optical characteristics of the transferred devices. Here, the receiver substrate is biased so that only the selected device 1802 is activated through selected contact pads 1804. Also, unselected devices 1806 stay deactivated and unselected pads 1808 stay inactive to prevent any interference. For connectivity testing, the micro device is biased to be active (for the LED case, it emits light). If a micro device is not active, the device can be flagged as defective. In another test, the micro device is biased to be inactive (for the LED case, it does not emit light). If a micro device is active, the device can be flagged as defective. FIG. 19 shows an example of a pixel biasing condition for activating or deactivating a micro device. Here, the micro device 1906 is coupled 1908 to a bias voltage 1910 (supply voltage) to become activated. For deactivating the micro device 1906, it is disconnected from the voltages. Here, the donor substrate 1900 can be biased for enabling the test. In another case, the micro devices are tested during post processing. While a surface is used to apply pressure to the devices to create permanent bonding, the circuit is biased to activate the micro devices. The surface can be conductive so that it can act as another electrode of the micro devices (if needed). The pressure can be adjusted if a device is not active to improve any malfunction in the connection to the receiver substrate. Similar testing can be performed to test for open defective devices. For performance testing, the micro device is biased with different levels and its performance (for the LED case, its output light and color point) is measured.

In one case, the defective devices are replaced or fixed before applying any post processing to permanently bond the device into receiver substrate. Here, the defective devices can be removed before replacing it with a working device. In another embodiment, the landing area on the receiver substrate corresponding to the micro devices comprises at least a contact pad and at least a force modulation element.

It should be understood that various embodiments in accordance with and as variations of the above are contemplated.

In another embodiment, the net transfer forces are modulated by weakening the donor force using laser lift off. In another embodiment, the net transfer forces are modulated by weakening the donor force using selectively heating the area of the donor substrate near each of the selected micro devices. In another embodiment, the net transfer forces are modulated by selectively applying adhesive layer to the micro devices. In another embodiment, a molding device is used to apply the adhesive layer selectively. In another embodiment, printing is used to apply the adhesive layer selectively. In another embodiment, a post process is performed on the receiver substrate so that the contact pads permanently bond with the selected micro devices. In another embodiment, the post process comprises heating the receiver substrate. In another embodiment, the heating is done by passing a current through the contact pads. In another embodiment, the method is repeated using at least one additional set of selected micro devices and corresponding contact pads. In another embodiment, the contact pads are located inside an indentation in the receiver substrate and each selected micro device fits into one such indentation. In another embodiment, the pitch of the array of micro devices is the same as the pitch of the array of contact pads. In another embodiment, the pitch of the array of micro devices is proportional to the pitch of the array of contact pads. In another embodiment, each of the selected micro devices comprises a protrusion and the contact pads comprise a depression sized to match the protrusion on each micro device. In another embodiment, the net transfer forces are modulated by generating electrostatic attraction between the selected micro devices and the receiver substrate. In another embodiment, the electrostatic forces are applied to the entire array of micro devices on the donor substrate by a force element on the receiver substrate or behind the receiver substrate. In another embodiment, the electrostatic forces are generated selectively by the force modulation element of the landing area. In another embodiment, the force modulation element of the landing area on the receiver substrate comprises a conductive element near each contact pad, each conductive element capable of being linked to a voltage source in order to sustain an electrostatic charge. In another embodiment, each conductive element comprises one or more sub-elements. In another embodiment, the sub-elements are distributed around the contact pad. In another embodiment, each conductive element surrounds a contact pad. In another embodiment, the force modulation element of the landing area on the receiver substrate comprises a conductive layer and a dielectric layer throughout a substantial portion of the landing area, the conductive layer capable of being linked to a voltage source in order to sustain an electrostatic charge. In another embodiment, the donor substrate and the receiver substrate are brought close together, but the selected micro devices and the contact pads do not touch until after the net transfer forces are modulated whereupon the selected micro devices move across the small gap to the contact pads. In another embodiment, the height of the selected micro devices differ. In another embodiment, the contact pads are concave. In another embodiment, the force modulation element of the receiver substrate generates a mechanical clamping force. In another embodiment, the mechanical force modulation element forms part of at least one contact pad. In another embodiment, the mechanical force modulation elements are separate from the contact pad. In another embodiment, the mechanical force modulation is created by thermal expansion or compression of at least one of the force modulation element or micro device. In another embodiment, each contact pad has a concave portion and each selected micro device is inserted into a concave portion of a contact pad.

In another embodiment, the receiver substrate is heated before the donor substrate and the receiver substrate are moved together so that the concave portion of the contact pads expands to be larger than a selected micro device and the receiver substrate is cooled before the donor substrate and the receiver substrate are moved apart so that the concave portion of the contact pads contracts around the selected micro devices and provides the receiver force via mechanical clamping of the selected micro devices.

In another embodiment, the force modulation element in the landing area of the receiver substrate is an adhesive layer positioned between the selected micro devices and the receiver substrate. In another embodiment, the adhesive layer is conductive. In another embodiment, a portion of each of the contact pads on the receiver substrate is coated with an adhesive layer. In another embodiment, a portion of each of the selected micro devices is coated with an adhesive layer. In another embodiment, a portion of the area near the contact pads is coated with an adhesive layer.

In another embodiment, the net transfer force is modulated both on the donor substrate with at least one of the aforementioned methods and on the receiver substrate with at least one of the described methods.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

What is claimed is:

1. A method to remove defective optoelectronic devices, the method comprising:
   putting a receiver substrate in a test mode to identify the defective optoelectronic devices in the receiver substrate;
   biasing a pixel in the receiving substrate for activating or deactivating the optoelectronic devices for identifying the defective optoelectronic devices;
   removing or fixing the defective optoelectronic devices;
   after the removing or fixing, post processing to permanently bond the optoelectronic devices into the receiver substrate; and
   extracting optical characteristics of the optoelectronic devices using a sensor or a sensor array.

2. The method of claim 1, wherein multiple bias points are applied to the optoelectronic devices to extract the optical characteristics of the micro devices.

3. The method of claim 1, wherein a selected set of optoelectronic devices are biased in the receiver substrate to be active.

4. The method of the claim 3, wherein inactive biased optoelectronic devices are flagged as defective.

5. The method of claim 3, wherein the selected set of optoelectronic devices are biased to be inactive and the active devices in the selected set are flagged as defective.

* * * * *